(12) United States Patent
Yoshida et al.

(10) Patent No.: US 6,483,136 B1
(45) Date of Patent: Nov. 19, 2002

(54) SEMICONDUCTOR INTEGRATED CIRCUIT AND METHOD OF FABRICATING THE SAME

(75) Inventors: Makoto Yoshida, Ome (JP); Takahiro Kumauchi, Hamura (JP); Yoshitaka Tadaki, Hanno (JP); Isamu Asano, Iruma (JP); Norio Hasegawa, Hinode (JP); Keizo Kawakita, Ome (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/446,302

(22) PCT Filed: Jun. 18, 1998

(86) PCT No.: PCT/JP98/02726

§ 371 (c)(1),
(2), (4) Date: Apr. 14, 2000

(87) PCT Pub. No.: WO98/59372

PCT Pub. Date: Dec. 30, 1998

(30) Foreign Application Priority Data

Jun. 20, 1997 (JP) .............................................. 9-164766

(51) Int. Cl.⁷ .............................................. H01L 29/72
(52) U.S. Cl. ........................ 257/295; 257/296; 257/305; 257/321
(58) Field of Search ................................. 257/295, 296, 257/305, 321

(56) References Cited

U.S. PATENT DOCUMENTS 5,472,893 A * 12/1995 Iida et al. ................... 257/296

FOREIGN PATENT DOCUMENTS

| JP | 5291532 | 11/1993 | |
|---|---|---|---|
| JP | 09-097882 | * 4/1997 | ................ 257/296 |

* cited by examiner

Primary Examiner—Edward Wojciechowicz
(74) Attorney, Agent, or Firm—Antonelli, Terry, Stout & Kraus, LLP

(57) ABSTRACT

An active region (L) with a metal insulator semiconductor field effect transistor (MISFET) (Qs) formed therein for selection of a DRAM memory cell, which makes up a memory cell of the DRAM, is arranged to have an island-like pattern that linearly extends in an X direction on one principal surface of a semiconductor substrate (1). The memory-cell selection MISFET (Qs) has an insulated gate electrode (7) (word line WL) that extends along a Y direction on the principal surface of the semiconductor substrate (1) with the same width kept along the length thereof, which gate electrode is arranged to oppose another gate electrode (7) (word line WL) adjacent thereto at a prespecified distance or pitch that is narrower than said width. In addition, a bit line (BL) is provided overlying the memory-cell select MISFET (Qs) in a manner such that the bit line extends in the X direction on the principal surface of the semiconductor substrate (1) with the same width and opposes its neighboring bit line (BL) at a distance or pitch that is wider than said width.

31 Claims, 42 Drawing Sheets

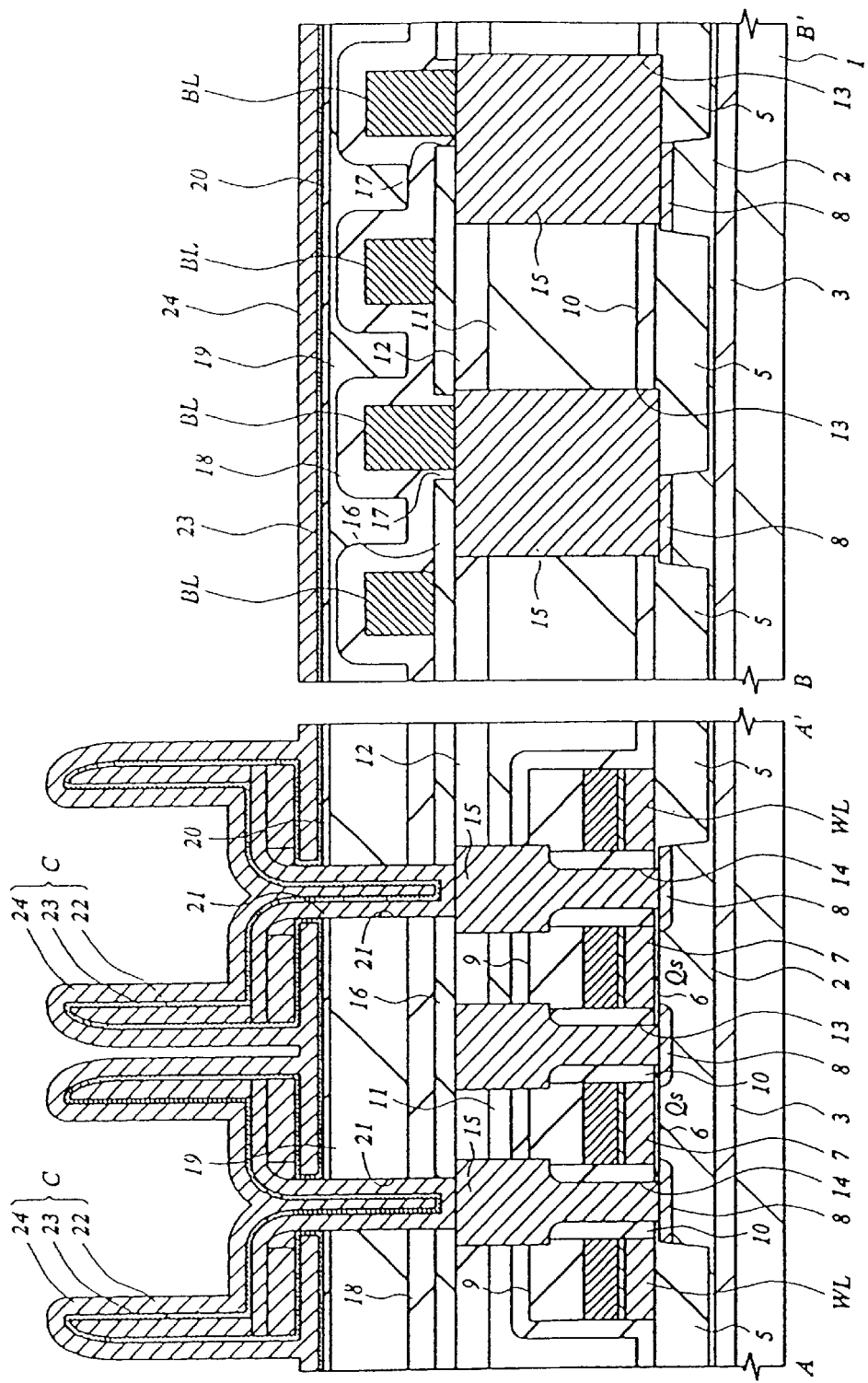

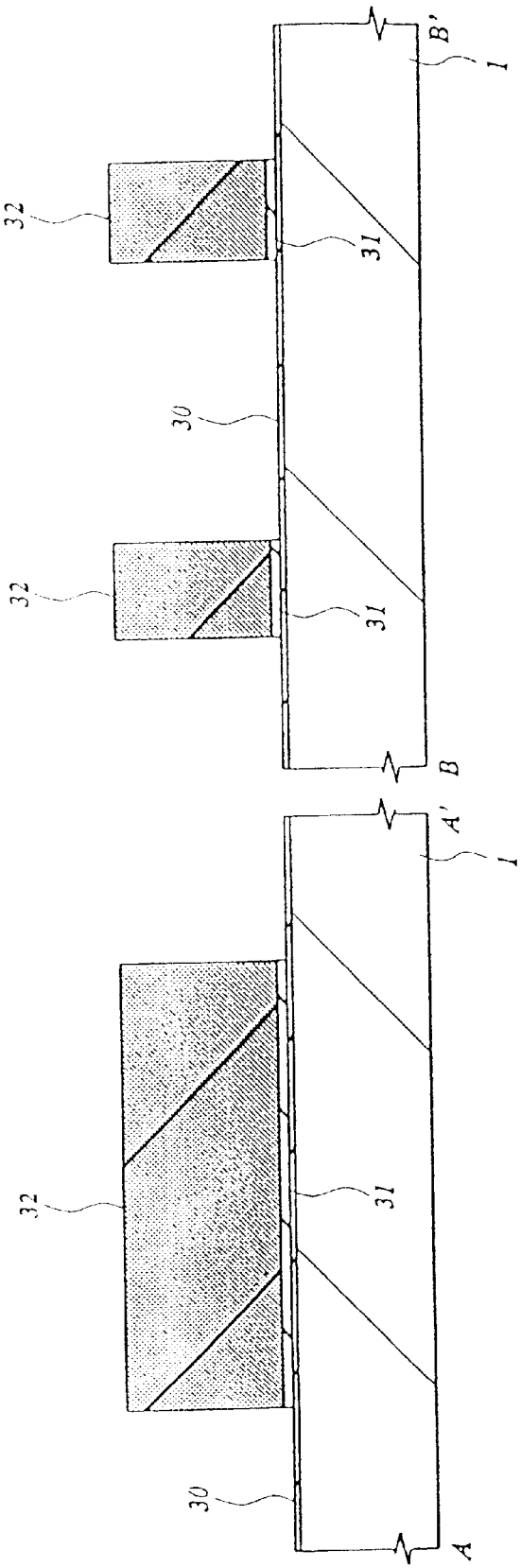

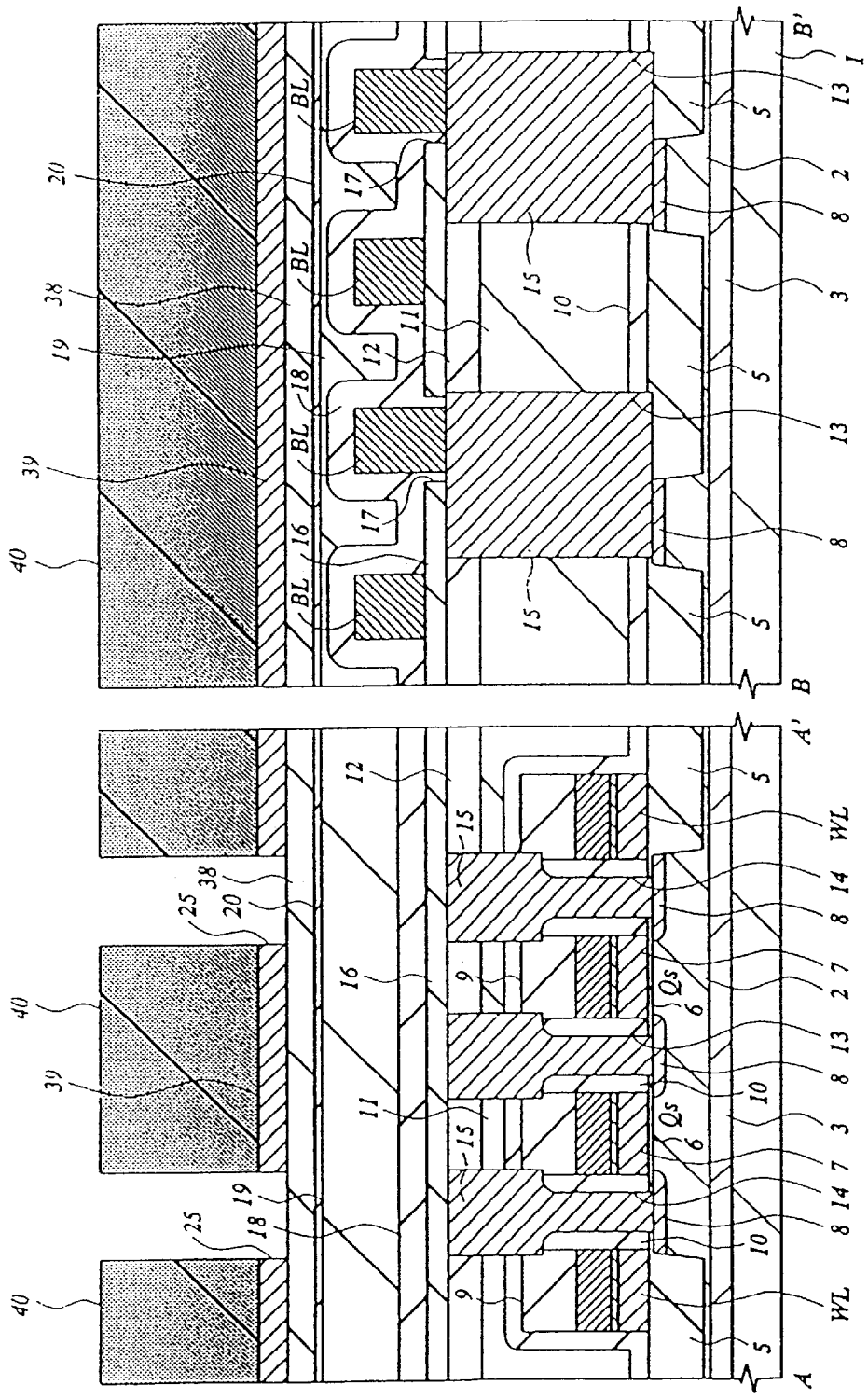

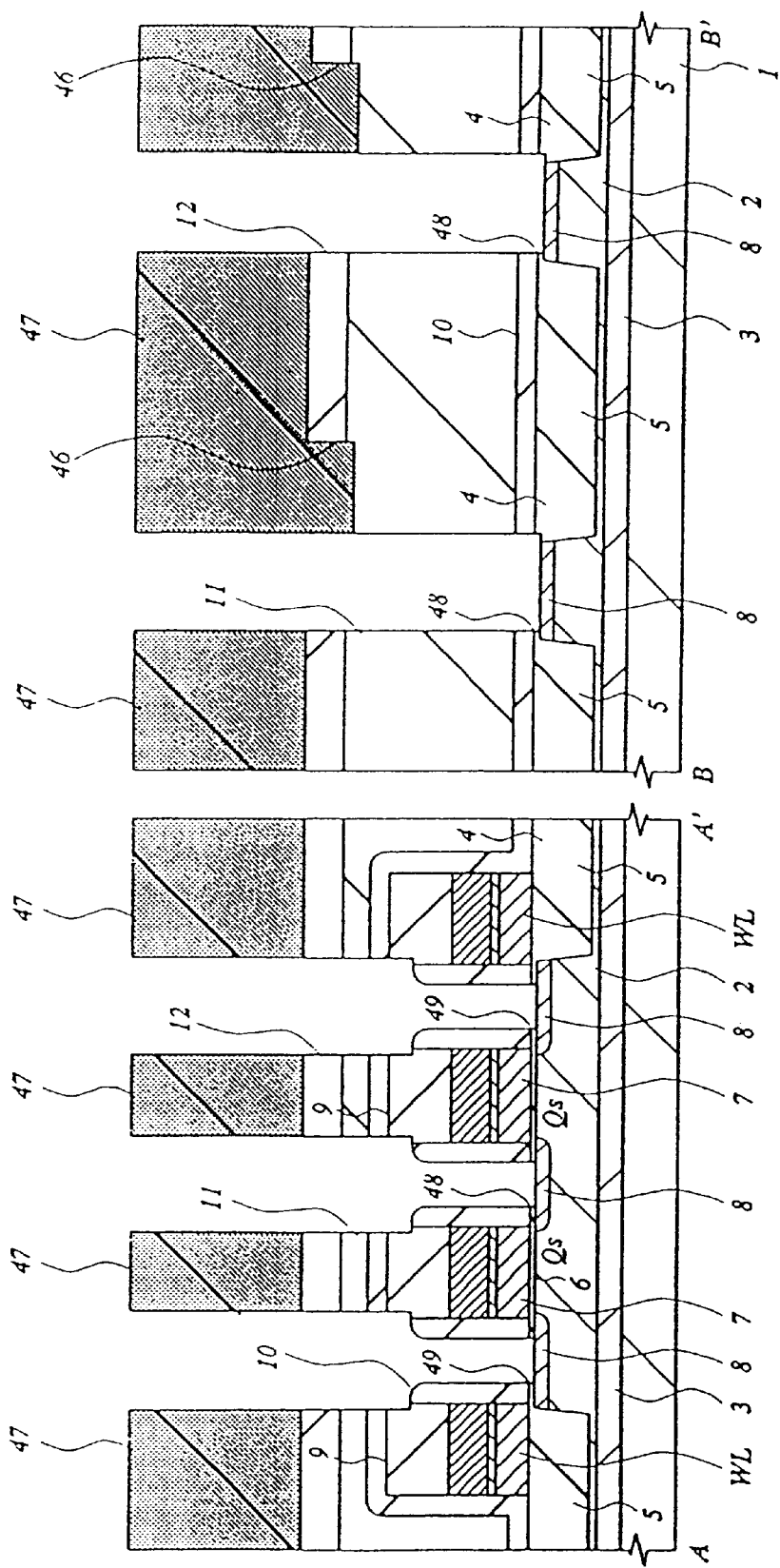

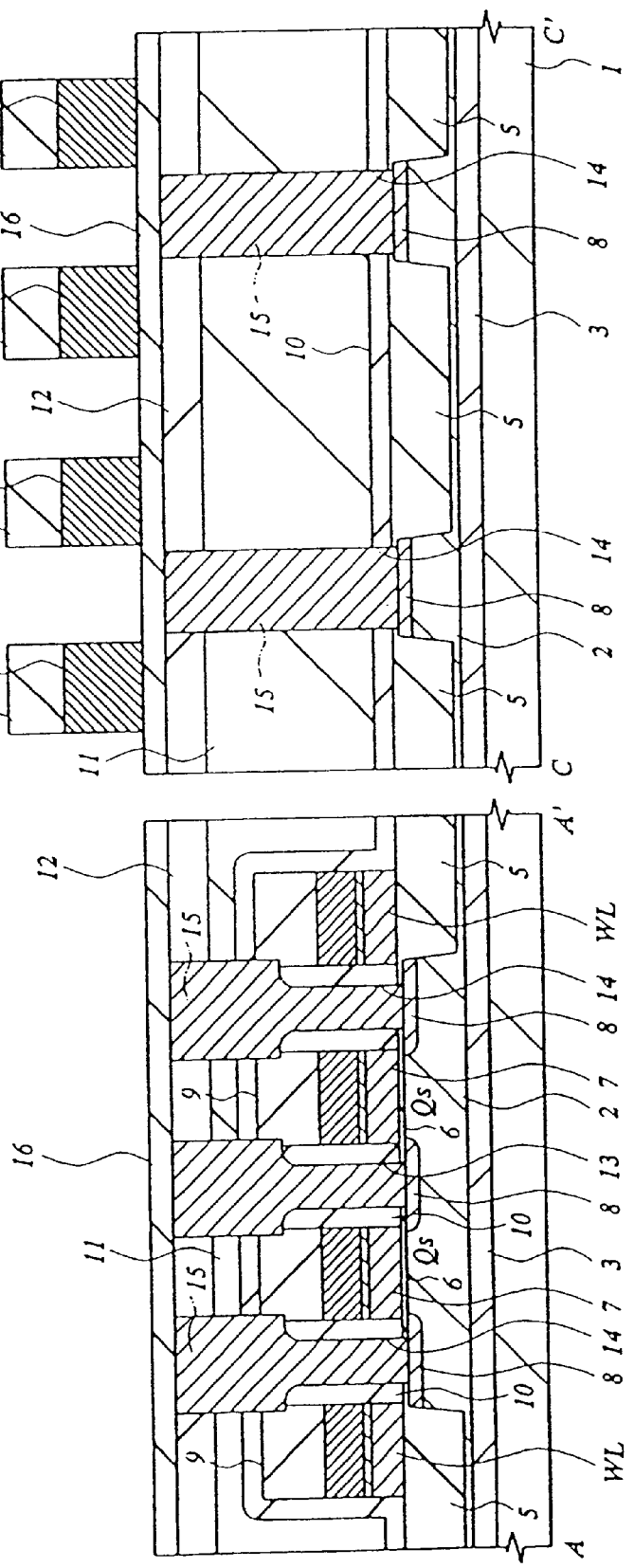

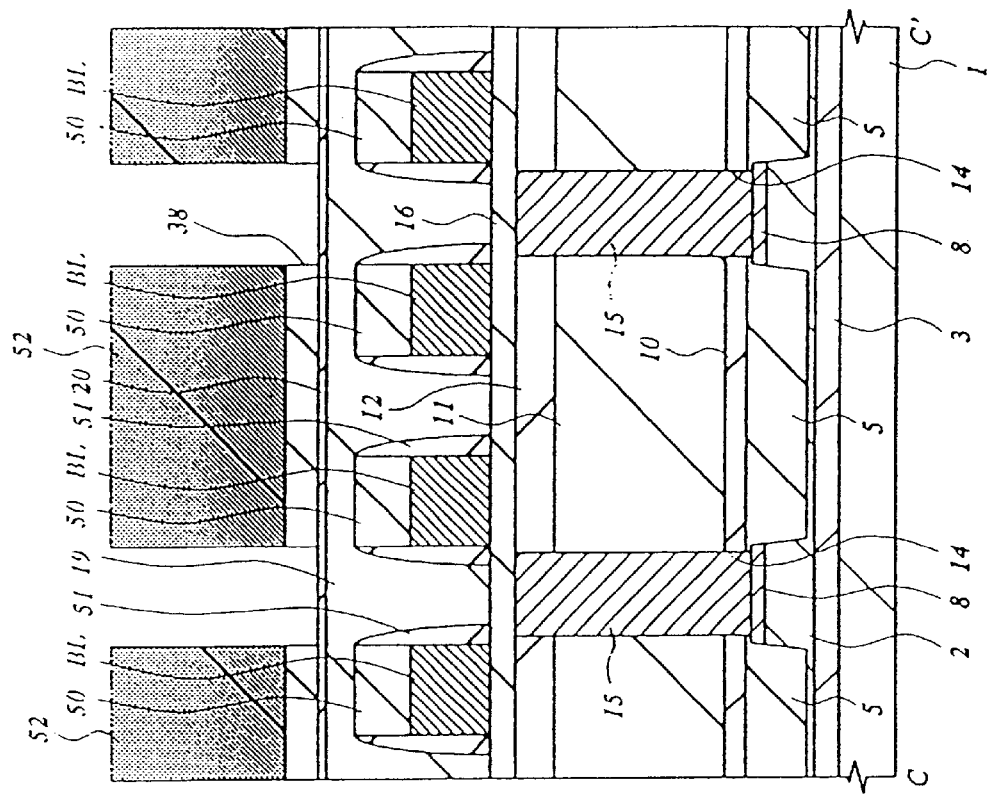
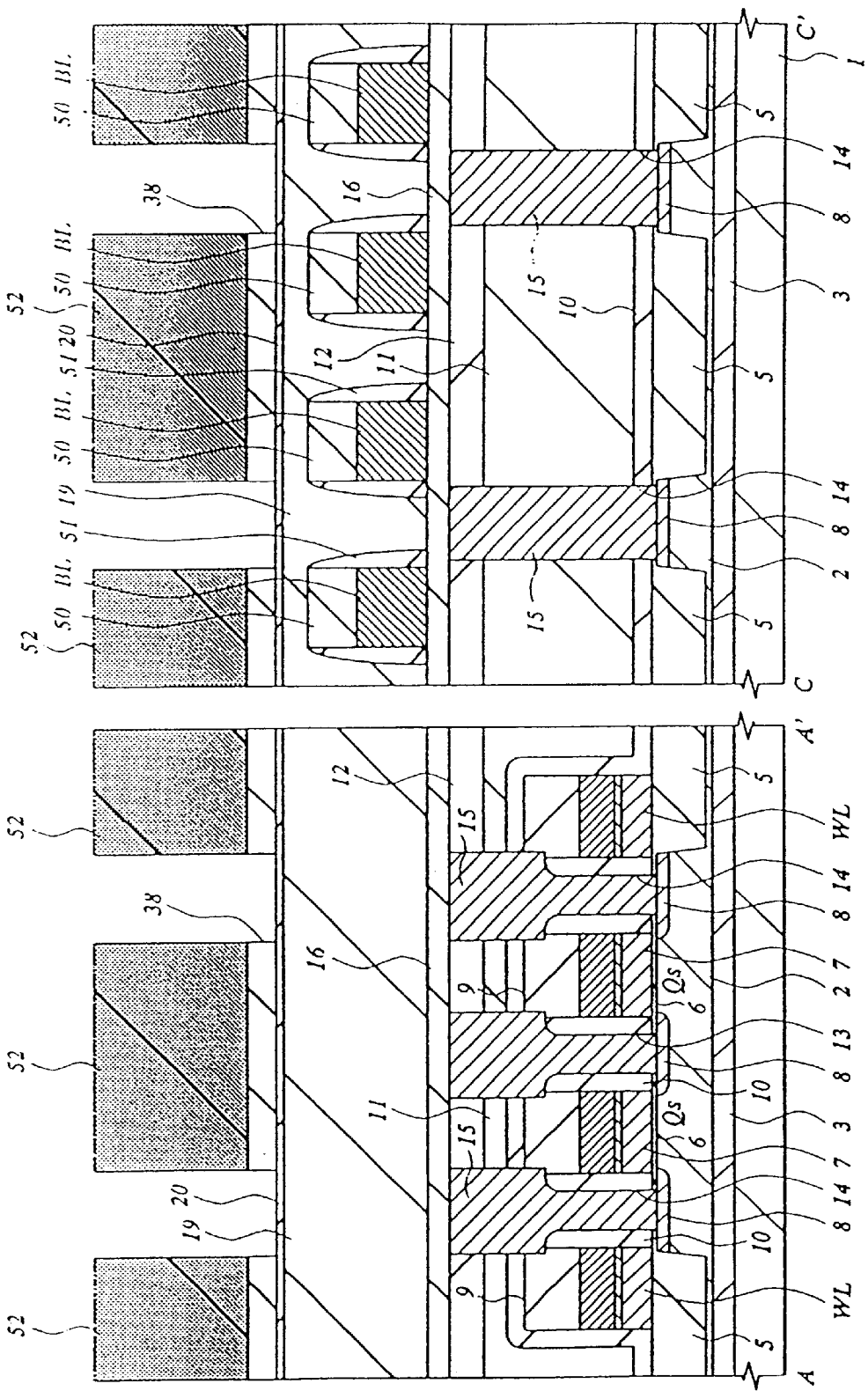

SEMICONDUCTOR INTEGRATED CIRCUIT AND METHOD OF FABRICATING THE SAME

TECHNICAL FIELD

The present invention relates generally to semiconductor integrated circuit devices and manufacturing architectures of the same. More particularly but not exclusively, the invention relates to those technologies adaptable for use with semiconductor integrated circuit devices having dynamic random access memory ("DRAM") modules.

BACKGROUND OF THE INVENTION

Currently available DRAMs are typically designed to include an array of rows and columns of memory cells as disposed in a matrix form on a principal surface of a semiconductive substrate at those cross points or "intersections" between a plurality of word lines and a plurality of bit lines, wherein each of the memory cells consists essentially of a capacitive element for accumulation of information and a metal insulator semiconductor field effect transistor (MISFET) for use in selecting a single memory cell, which is serially connected to the capacitive element. The memory cell selecting MISFET is formed in an active region of the semiconductor substrate which is surrounded at its periphery by an element separation or isolation region. The MISFET is generally designed to consist of a gate oxide film and a gate electrode integral with a corresponding one of the word lines plus a pair of semiconductor active regions for use as a source and drain of the transistor. A bit line is disposed to overlie the memory cell selecting MISFET in a manner such that it is electrically connected to one of the source and drain which is commonly shared by two memory cell selection MISFETs. The information accumulation capacitive element is laid out at a location overlying the memory cell select MISFET and is electrically coupled to the remaining one of the source and drain.

A DRAM device with the memory cell structure of this type has been disclosed in Published Unexamined Japanese Patent Laid-Open No. 5-291532 and other publications. The memory cells of the DRAM as disclosed therein are designed so that word lines are increased in width or made "fat" in active regions (the regions in each of which a word line serves as the gate electrode of a memory cell select MISFET) and reduced in width or "thinned" in the remaining regions in order to retain the required gate length when miniaturizing or "downsizing" the memory cell select MISFETs while at the same time minimizing the pitch of word lines.

In addition, the DRAM memory cells as taught by the Japanese Application above is arranged so that the bit lines are partly fattened to extend up to those portions overlying the active regions and that a planar pattern of such active regions is designed into a gull-wing shape with part of it being bent toward the bit line side in order to achieve successful electrical conduction of more than one contact hole for use in connecting between one of the source and drain of a memory cell select MISFET and its corresponding bit line operatively associated therewith.

Regrettably the DRAM memory cells taught by the above Japanese Application is faced with a problem as to an inability to provide any excellent size/dimension accuracy when partly increasing the widths of word lines and bit lines or when employing the gullwing-shaped planar pattern of the active regions due to the fact that present available photolithography techniques suffer from difficulties in accurately achieving ultra-fine resolution of curved-line patterns and/or folded-line patterns in cases where the minimal fabricatable size becomes at or near a limit of resolution in photolithography processes as a result of further progressing in microfabrication or miniaturization of such memory cells. Another problem faced with the prior art DRAM device is that as a through-going hole for use in connecting between the lower-side electrode of an information accumulation capacitive element and the remaining one of the source and drain of its associated memory cell select MISFET is inherently disposed between a bit line and a bit line, partly fattening the bit lines makes it difficult to attain the intended through-hole opening margin, which leads to incapability of assuring elimination of unwanted electrical short-circuiting between the lower-side electrode within a though-hole and its associative one of the bit lines.

It is therefore an object of the present invention to provide a specific technique for enabling achievement of further miniaturized memory cells of a DRAM.

The foregoing and other objects and inventive features of this invention will become more apparent in the following description and accompanying drawings.

DISCLOSURE OF THE INVENTION

Some representative ones of the inventions as disclosed herein will be explained in brief below.

(1) A semiconductor integrated circuit device incorporating the principles of the invention is arranged to a semiconductor integrated circuit device comprising a plurality of word lines extending in a first direction on a principal surface of a semiconductive substrate, a plurality of bits lines extending in a second direction at right angles to the first direction, and an array of memory cells of a DRAM as disposed at cross points of said word lines and said bit lines, each said memory cell including a serial combination of a memory cell selecting MISFET with a gate electrode as integrally formed with a corresponding one of said word lines and a capacitive element for information accumulation, wherein said plurality of word lines are arranged to linearly extend in the first direction on the principal surface of said semiconductive substrate with an identical width, and wherein a distance between adjacent ones of said word lines is less than said width.

(2) The semiconductor integrated circuit device of the invention is such that the distance between the adjacent ones of said gate electrodes is set at a minimal size as determinable by a resolution limit of photolithography.

(3) The semiconductor integrated circuit device of the invention is such that said word lines and the gate electrode of said memory cell selecting MISFET as integrally formed with a corresponding one of said word lines are comprised of a conductive film at least partially including a metallic film therein.

(4) The semiconductor integrated circuit device of the invention is such that said semiconductive substrate has an active region with said memory cell selecting MISFET formed therein and being arranged to have an island-like pattern extending in the second direction on the principal surface of said semiconductive substrate while having its periphery as surrounded by an element isolation region.

(5) The semiconductor integrated circuit device of the invention is such that the element isolation region surrounding said active region is formed of an element separation groove having a dielectric film embedded therein as defined in the principal surface of said semiconductive substrate.

(6) The semiconductor integrated circuit device of the invention is such that said bit lines are formed overlying said memory cell selecting MISFET with an insulative film laid there between, wherein a contact hole for electrical connection between one of a source and drain of said memory cell selecting MISFET and a corresponding one of said bit lines is formed in self-alignment with the gate electrode of said memory cell selecting MISFET.

(7) The semiconductor integrated circuit device of the invention is such that said information accumulation capacitive element is formed to overlie said memory cell selecting MISFET with an insulative film laid therebetween, wherein a contact hole for electrical connection between the other of the source and drain of said memory cell selecting MISFET and one electrode of said information accumulation capacitive element is formed in self-alignment with the gate electrode of said memory cell selecting MISFET.

(8) The present invention also provides a semiconductor integrated circuit device comprising a plurality of word lines extending in a first direction on a principal surface of a semiconductive substrate, a plurality of bit lines extending in a second direction at right angles to the first direction, and an array of DRAM memory cells as disposed at intersections of said word lines and said bit lines, each said memory cell including a serial combination of a memory cell selecting MISFET with a gate electrode as integrally formed with a corresponding one of said word lines and a capacitive element for information accumulation, wherein said bit lines straightly extend in the second direction on the principal surface of said semiconductive substrate with an identical width and wherein a distance between adjacent ones of said bit lines is greater than said width.

(9) The semiconductor integrated circuit device of the invention is such that the width of each said bit lines is equal to or less than a minimal size determinable by a resolution limit of photolithography.

(10) The semiconductor integrated circuit device of the invention is such that said bit lines are comprised of a conductive film at least partially containing a metallic film.

(11) The invention further provides a semiconductor integrated circuit device comprising a plurality of word lines extending in a first direction on a principal surface of a semiconductor substrate, a plurality of bit lines extending in a second direction at right angles to the first direction, and an array of DRAM memory cells as disposed at intersections of said word lines and said bit lines, each said memory cell including a serial combination of a memory cell selecting MISFET with a gate electrode as integrally formed with a corresponding one of said word lines and a capacitive element for information accumulation, wherein an active region with said memory cell selecting MISFET formed therein is arranged to have an island-like pattern extending in the second direction on the principal surface of said semiconductive substrate while having its periphery as surrounded by an element isolation region, wherein said plurality of word lines extend along the first direction on the principal surface of said semiconductive substrate with an identical width at a distance between adjacent ones thereof, wherein certain one of said bit lines as formed overlying said element isolation region with a first insulative film laid therebetween extends in the second direction on the principal surface of said semiconductive substrate with an identical width at a regular distance, and wherein a first contact hole for electrical connection between one of a source and drain of said memory cell selecting MISFET as formed in said active region and its associative one of said bit lines as formed overlying said element isolation region has a diameter in the first direction greater than in the second direction with part thereof arranged to extend to overlie said element isolation region.

(12) The semiconductor integrated circuit device of the invention is such that said first contact hole includes a polycrystalline silicon film as formed therein, wherein said polycrystalline silicon film is doped with a chosen impurity equal in conductivity type to the source and drain of said memory cell selecting MISFET.

(13) The semiconductor integrated circuit device of the invention is such that the corresponding one of said bit lines and said one of the source and drain of said memory cell selecting MISFET are electrically connected together via a first through-hole as formed in a second insulative film sandwiched between said bit lines and said first insulative film.

(14) The semiconductor integrated circuit device of the invention is such that the width of said bit lines is less than a diameter of said first through-hole.

(15) The semiconductor integrated circuit device of the invention is such that said first contact hole has a diameter in the first direction greater than in the second direction, where a portion of the contact hole consists essentially of a first region extending to overlie said element isolation region and a second region as formed beneath said first region to have a diameter in the first direction and diameter in the second direction being substantially equal thereto, wherein said first region is formed overlying said memory cell selecting MISFET.

(16) The semiconductor integrated circuit device of the invention is such that said information accumulation capacitive element is formed over said bit lines with a third insulative film laid therebetween and is electrically connected to a remaining one of the source and drain of said memory cell selecting MISFET via a second through-hole formed in said third insulative film and a second contact hole as formed in said first insulative film at a location underlying said second through-hole.

(17) The semiconductor integrated circuit device of the invention is such that said second contact hole includes a polycrystalline silicon film being embedded therein and doped with an impurity equal in conductivity type to the source and drain of said memory cell selecting MISFET.

(18) The semiconductor integrated circuit device of the invention is such that said second through-hole is disposed between neighboring ones of said bit lines and is formed in self-alignment therewith.

(19) A semiconductor integrated circuit device of the present invention comprises: an array of memory cells each including a serial combination of a MISFET for memory cell selection having a source and drain plus insulated gate electrode and a capacitive element for data storage having first and second electrodes with a dielectric film laid therebetween; word lines including first, second and third ones extending in a first direction on a principal surface of a semiconductive substrate and each having part used as the gate electrode of its associated memory cell selecting MISFET; and, bit lines including first and second ones as disposed adjacent to each other to extend in a second direction at right angles to the first direction on the principal surface of the semiconductive substrate, wherein the first to third word lines are substantially identical in width to one another, a distance between the first word line and the second word line neighboring thereto is substantially equal to a distance between the second word line and the third word line next thereto, the distance is less than the width, the first and second bit lines are substantially the same as each other in width, which is greater than the width of these bit lines.

(20) The semiconductor integrated circuit device of this invention further comprises a first conductive layer provided between the first and second word lines for connecting the first bit line to either one of the source and drain of the memory-cell selecting MISFET and a second conductive layer laid between the second and third word lines for connecting the remaining one of the source and drain of the memory-cell selecting MISFET to the first electrode of the data storage capacitive element, wherein the aforesaid one of the source and drain of the memory-cell selecting MISFET and the first conductive layer are in self-alignment with the first word line and the second word line whereas the remaining one of the source and drain of the memory-cell selecting MISFET and the second conductive layer are self-aligned with the second word line and the third word line.

(2) The invention further provides a method for manufacturing a semiconductor integrated circuit device comprising a plurality of word lines extending in a first direction on a principal surface of a semiconductive substrate, a plurality of bit lines extending in a second direction at right angles to the first direction, and an array of DRAM memory cells as disposed at intersections of said word lines and said bit lines, each said memory cell including a serial combination of a memory cell selecting MISFET with a gate electrode as integrally formed with a corresponding one of said word lines and a capacitive element for information accumulation, said method comprising the steps of:

(a) forming on the principal surface of said semiconductive substrate of a first conductivity type an element isolation region and an active region of island-like pattern having its periphery surrounded by said element isolation region and extending along the second direction on the principal surface of said semiconductive substrate;

(b) patterning a first conductive film formed over the principal surface of said semiconductive substrate to form word lines extending in the first direction the principal surface of said semiconductive substrate to have a distance between adjacent ones thereof being less than a width of each said word line; and (c) forming a source and a drain of said memory cell selecting MISFET by introducing an impurity of a second conductivity type into the principal surface of said semiconductive substrate.

(22) In the semiconductor integrated circuit device manufacturing method of the present invention, the gate electrodes are fabricated so that the distance of adjacent ones thereof is set at a minimal size determinable by a resolution limit in photolithography.

(23) The semiconductor integrated circuit device manufacturing method is arranged to include, after said step (c), further process steps of:

(d) forming a first insulative film overlying said memory cell selecting MISFET and then forming a second insulative film overlying said first insulative film and being different in etching rate from said first insulative film;

(e) etching those portions of said second insulative film overlying the source and drain of said memory cell selecting MISFET under a condition that the etching rate of said second insulative film with respect to said first insulative film becomes greater and then etching said first insulative film overlying the source and drain of said memory cell selecting MISFET to thereby form a first contact hole overlying one of said source and drain in self-alignment with said gate electrode to have a diameter in the first direction greater than a diameter in the second direction with part of said first contact hole extending toward said element isolation region while forming a second contact hole overlying a remaining one of the source and drain in self-alignment with said gate electrode and having a diameter in the first direction substantially the same as its diameter in the second direction;

(f) after having embedded a conductive film in said first contact hole and said second contact hole, forming a third insulative film overlying said second insulative film and then forming a first through-hole in said third insulative film at a portion overlying a specified region extending to said element isolation region of said first contact hole; and (g) patterning a second conductive film as formed overlying said third insulative film to thereby form bit lines extending along the second direction on the principal surface of said semiconductive substrate with an identical width at a distance between adjacent ones of said bit lines being greater than said width, and then electrically connecting together said first contact hole and a corresponding one of said bit lines via said first through-hole as formed in said third insulative film.

(24) The semiconductor integrated circuit device manufacturing method is such that the width of said bit lines is formed to be equal in dimension to or less than a minimal size determinable by a photolithography resolution limit.

(25) The semiconductor integrated circuit device manufacturing method is arranged to include, after said step (g), further steps of:

(h) forming a fourth insulative film overlying said bit lines and then forming a fifth insulative film overlying said fourth insulative film at an etching rate different from that of said fourth insulative film;

(i) after having etch said fifth insulative film at a portion overlying said second contact hole under a condition that the etching rate of said fifth insulative film relative to said fourth insulative film is greater, etching said fourth insulative film at a portion overlying said second contact hole to thereby form a second through-hole overlying said second contact hole in self-alignment with a corresponding one of said bit lines; and (j) patterning a third conductive film as formed overlying said fifth insulative film to form a lower-side electrode of an information accumulation capacitive element as electrically connected to said second contact hole via said second through-hole.

BRIEF DESCRIPTION OF THE DRAWINGS

FIG. 4 is a diagram showing a sectional view of a semiconductor substrate along both line A—A' line and B—B' of FIG. 3.

FIGS. 5 to 7 are each a diagram illustrating, in cross-section, main part of the semiconductor substrate at a process step in the manufacture of memory cells of the DRAM of the Embodiment 1 of the invention.

FIGS. 21 to 24 are each a diagram showing in cross-section main part of the semiconductor substrate at a step during manufacture of the DRAM memory cell of Embodiment 1 of the invention.

FIGS. 34 to 36 are each a diagram showing in cross-section main part of the semiconductor substrate at a step during manufacture of the DRAM memory cell of Embodiment 2 of the invention.

FIGS. 38 to 42 are each a diagram showing in cross-section main part of the semiconductor substrate at a process step during manufacture of the DRAM memory cell of Embodiment 3 of the invention.

BEST MODE FOR CARRYING OUT THE INVENTION

Figure 1:
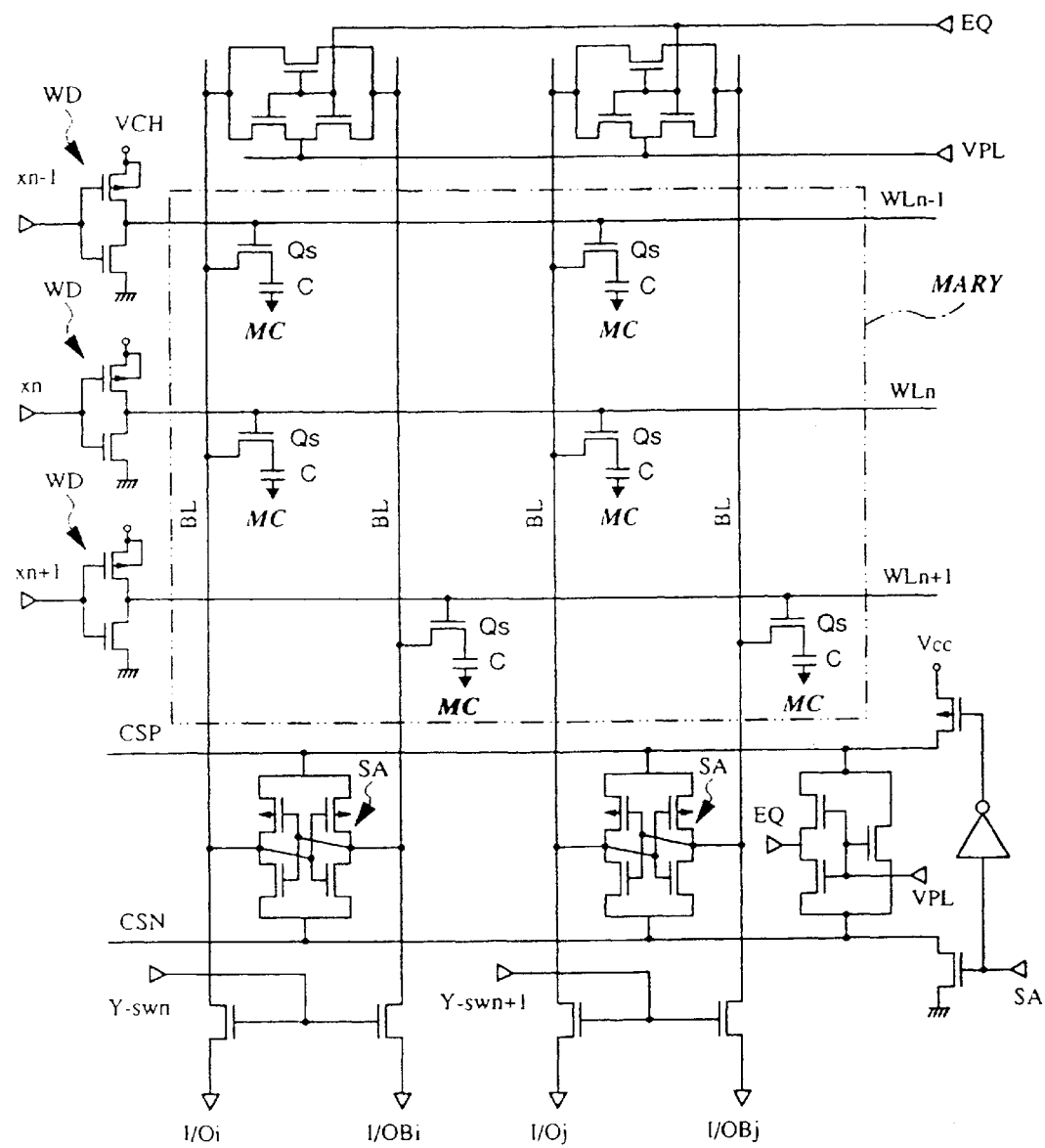
FIG. 1 is a diagram depicting equivalent circuitry of a DRAM device in accordance with Embodiment 1 of the present invention.

Several preferred embodiments of the present invention will be described in detail with reference to the accompanying drawings below. Note that in the following description, like reference characters are used to designate like parts or components with similar functionalities and any repetitive explanation will be eliminated for purposes of brevity.

Embodiment 1

FIG. 1 is a diagram illustrating electrical equivalent circuitry of a dynamic random access memory (DRAM) device in accordance with one embodiment of the present invention. As shown herein, the DRAM clip includes a memory array (MARY) that is configured from a plurality of memory cells (MC) organized into a matrix form at those intersections between a plurality of word lies WL (WLn-1, WLn, WLn+1•••) and a plurality of bit lies BL. A single memory cell for storing therein a 1-bit information or data is comprised of a serial combination of a capacitive element C for information accumulation and a metal insulator semiconductor field effect transistor (MISFET) Qs for memory cell selection. The memory-cell selecting MISFET Qs has its source and drain, one of which is electrically connected to the information accumulation capacitive element C and the other of which is electrically coupled to a corresponding one of the bit lines BL. The word lines WL are connected at certain ends thereof to a word driver circuit WD whereas the bit lines BL are coupled at their selected ends to sense amplifier circuits SA operatively associated therewith.

Figure 2:
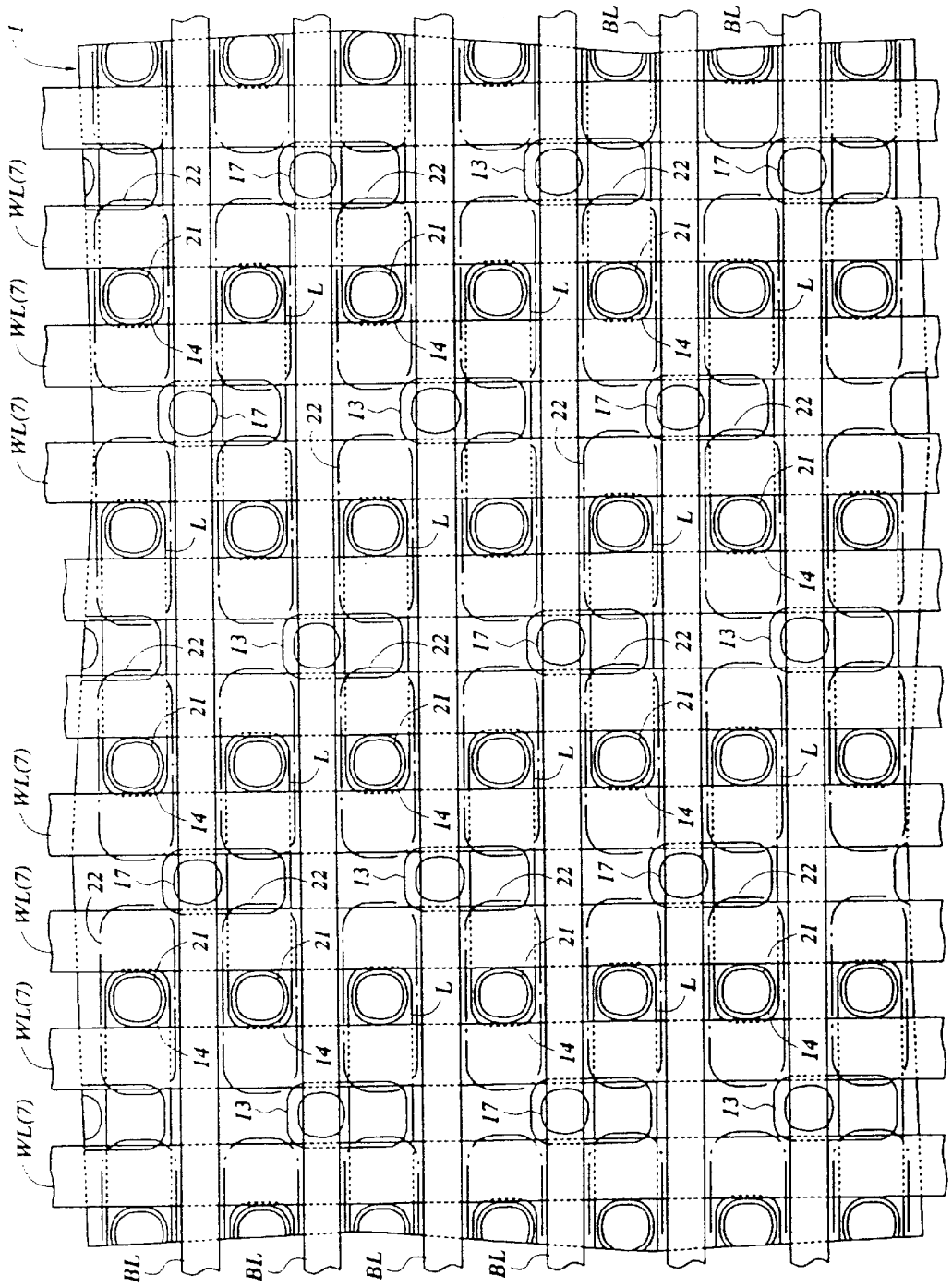
FIG. 2 is a diagram schematically showing a plan view of major part of memory array of the DRAM in accordance with the Embodiment 1 of this invention.
Figure 3:
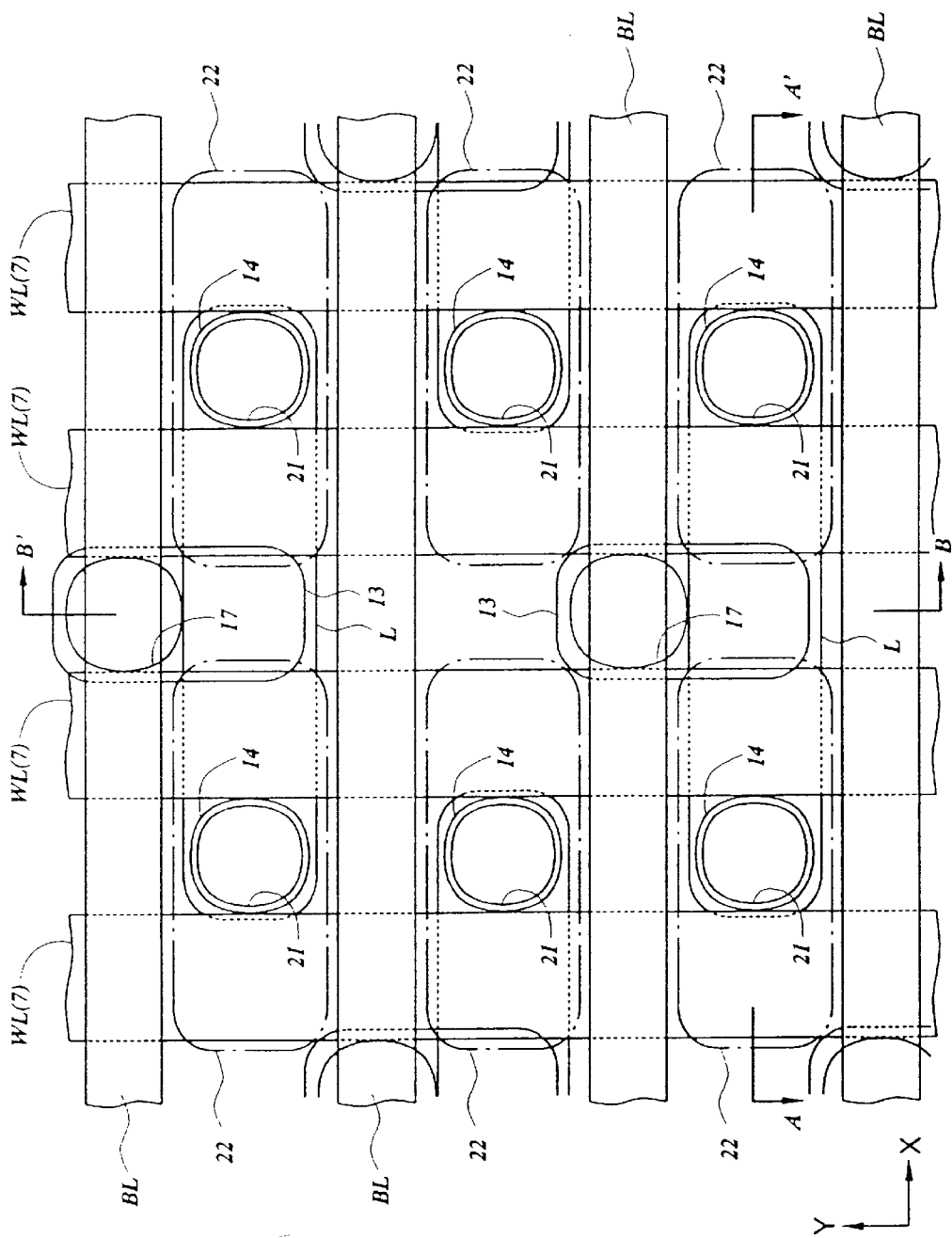
FIG. 3 is a diagram showing an enlarged plan view of a portion of the FIG. 2.

FIG. 2 is a diagram schematically depicting an enlarged plan view of part of the memory array integrated on the semiconductor substrate; FIG. 3 is an enlarged plan view of part of FIG. 2; and FIG. 4 shows at its left-hand portion a cross-sectional view as taken along line A—A' of FIG. 3 and also shows at its right-hand portion a sectional view along line B—B' of the same. Note that FIG. 2 and FIG. 3 indicate only those conductive layers (expect plate electrodes) which make up the memory cells while illustration of any dielectric films between conductive layers and on-chip leads overlying the memory cells is eliminated therein.

The memory cells of the DRAM are each formed in a p-type well 2 that is formed on the principal surface of a semiconductive substrate 1 of p-type conductivity. The planar size of each memory cell is, for example, 0.46 $\mu$m×0.46 $\mu$m. Although not limitatively, the p-type well 2 with the memory cell formed therein (memory array) is electrically separated from the p-type semiconductor substrate 1 by an n-type semiconductor region 3 that is formed beneath the well in order to eliminate the influence of noises from circuitry formed in the other regions of the semiconductor substrate 1 (such as for example an input/output circuit as part of peripheral circuitry).

The memory-cell select MISFET Qs of a memory cell may be an n-channel type one which is formed in an active region L of the p-type well 2. As shown in FIGS. 2 and 3, this active region L is designed to have an elongate island-like shape that linearly extends along the lateral direction (X direction) in the drawings, wherein its size in the X direction is 1.16 μm whereas the size in up-down direction (Y direction) is 0.24 μm. In case the active region L is designed into such simple straight line pattern, any hard-to-resolve ultrafine pattern will no longer take place even when downsizing or miniaturization is done to the extent that is equivalent to a limit of resolvability in photolithography techniques, which makes it possible to achieve good dimension accuracy required. It is noted here that the dimensions of the active region L and of respective constituent components of a memory cell as will be discussed later are mere examples and should not be used for purposes of limitative interpretation of the present invention.

As shown in FIG. 4, an element isolation region surrounding the active region L consists essentially of an element separation groove 5, which may be a shallow groove defined in the p-type well 2 with a silicon oxide film 4 embedded therein. The silicon oxide film 4 buried in the element separation groove 5 is planarized so that its top surface is substantially identical in height to the surface of the active region L—namely the film 4 is flush with active region L. As the element isolation region comprised of such element separation groove 5 has no sharp edges known as "bird's beaks" in the semiconductor art at terminate end portions of the active region, the effective area of the active region L may be increased as compared to the same-size element isolation region (field oxide film) as formed by the conventional local oxidation of silicon (LOCOS) process (selective oxidation method).

In each active region L, two neighboring memory-cell select MISFETs Qs are formed and aligned in the X direction with either one of the source and drain commonly shaped thereby. One memory-cell select MISFET Qs consists mainly of a gate oxide film 6 and an insulated gate electrode 7 as well as a pair of n-type semiconductor regions 8, 8 forming the source and drain thereof.

As shown in FIGS. 2–3, the gate electrode 7 of the memory-cell select MISFET Qs is formed integrally with a corresponding one of the word lines WL to extend straightly (linearly) in the Y direction up to the terminate end of the memory array with the same width and same distance or interval retained along the length thereof. The width of the gate electrode 7 (word line WL), or gate length, is arranged to have a size (0.24 μm, for example) capable of suppressing the so-called short-channel effect of the memory-cell select MISFET Qs to thereby allow the threshold voltage to be more than or equal to a prespecified value. In addition, the distance or interval of two neighboring gate electrodes 7 (word lines WL) is set designed to be a minimal size determinable by the photolithography resolution limit (0.22 μm, for example), which is shorter than the gate length of the gate electrode 7 (word line WL). In case the gate electrode 7 (word line WL) is designed into such simple straight line pattern, it is possible to achieve excellent size accuracy even when the distance thereof is highly miniaturized or shrunk down at the photolithography resolution limit level.

The gate electrode 7 (word line WL) is constituted for example from a multilayer structure (polymetal structure) of a low-resistivity polycrystalline silicon film with a chosen n-type impurity such as for example phosphorus (P) doped thereinto a tungsten (W) film insulatively stacked thereover with a TiN film sandwiched between them. In case the gate electrode 5 (word line WL) is partly comprised of such low-resistivity metal (W), the resultant sheet resistivity may be reduced to approximately 2 Ω/□, which in turn enables suppression of any possible word line delay. Additionally, as such word line delay may be suppressed without backplating the gate electrode 5 (word line WL) by use of any low-resistivity metal lead, it becomes possible to reduce by one the requisite number of those lead layers as formed overlying the memory cells involved.

The gate electrodes 7 (word lines WL) are covered at their upper portions by a silicon nitride film 9, wherein another silicon nitride film 10 is formed on the side walls of this silicon nitride film 9 and of gate electrode 7 (word line WL) and also on the surface of the element separation groove 5. A double-layered structure of silicon oxide films 11, 12 is formed to overlie the silicon nitride film 9 that covers the gate electrode 7 (word line WL), the upper film 12 of which is planarized in such a manner that its surface is substantially identical in height with respect to an overall surface area of the semiconductor substrate 1.

At a location overlying a pair of n-type semiconductor regions 8 making up the source and drain of a memory-cell select MISFET Qs, contact holes 13 and 14 are formed which extend through the silicon oxide films 12, 11 and gate oxide film 6 to reach the n-type semiconductor regions 8. These contact holes 13, 14 are filled with plugs (conductive layers) 15 embedded therein, which are made of low-resistivity polysilicon film components with a chosen impurity of n-type conductivity (phosphorus (P), for example) doped therein.

The contact holes 13, 14 and the plugs (conductive layers) 15 are formed so that each is self-aligned with the silicon nitride film 10 against the gate electrode 7 (word line WL). More specifically, the diameter of each contact hole 13, 14 at the bottom portion thereof in the X direction is equal in dimension to a distance between the silicon nitride film 10 on the sidewall of one of two neighboring gate electrodes 7 (word lines WL) and the silicon nitride film 10 on the sidewall of a remaining one thereof. It is required that the silicon nitride film 10's thickness in the X direction be at least a specific film thickness capable of preventing leakage between the plugs (conductive layers) 15 within the contact holes 13, 14 and gate electrodes 7 (word lines WL), which thickness typically measures 0.05 μm. Accordingly, where the interval or pitch of the gate electrodes 7 (word lines WL) is set at a size determinable depending upon the photolithography resolution limit (here, 0.22 μm), the X-directional diameter at the bottom of each contact hole 13, 14 is given as 0.12 (=0.22−(0.05×2)) μm, which is less than the resolution limit even at its maximal value. Additionally the along-the-X-direction diameter at the upper part of each contact hole 13, 14 is set at 0.24 μm, or more or less. In this way, where the contact holes 13, 14 are each formed in self-alignment with the gate electrode 7 (word lines WL), it becomes possible to ensure successful prevention of any electrical shortcircuiting between such contact holes 13, 14 and gate electrodes 7 (word lines WL) even when the distance of gate electrodes 7 (word lines WL) is reduced through advanced microfabrication processes down at the photolithography resolution limit level. In another word, since the contact holes 13, 14 and the plugs 15 (conductive layers) are each formed in self-alignment with the gate electrode 7 (word lines WL), the distance between the word lines can be set to be a minimal size as determined by the resolution limit of the photolithography.

The contact hole 14, which is one of the above-noted contact holes 13, 14, has its diameter in the Y direction that is the same as the size (0.24 μm) of the active region L in the Y direction. In contrast, the along-the-Y-direction diameter of the remaining contact hole (a contact hole overlying the n-type semiconductor region 8 as commonly shared by two memory-cell select MISFETs Qs) 13 is set at a preselected value (0.48 μm, for example) that is greater than the diameter of the active region L in the Y direction (0.24 μm). In other words the contact hole 13 is designed to have a substantially rectangular planar pattern wherein the diameter in the Y direction if greater than the diameter in the X direction (at the upper end portion thereof), part of which is arranged to go out of the active region L and extend up to the upper portion of the element separation groove 5.

A silicon oxide film 16 is formed overlying the silicon oxide film 12 with the contact holes 13, 14 formed therein; further, the bit lines BL are formed overlying it. As shown in FIGS. 2–3 the bit lines BL are disposed overlying the element separation grooves 5 in a manner such that they extend straightly (linearly) in the X direction up to the terminate end of the memory array with the same width and same intervals kept along the entire lengths thereof. The pitch of two neighboring bit lines BL is the same as the memory cell size (0.46 μm) in the X direction.

The bit lines BL are such that the distance or interval therebetween is longer than the width thereof in order to maximally reduce any inherent parasitic or stray capacitance that will possibly be formed between adjacent ones of the bit lines BL to thereby improve information reading/writing speeds. In other words, letting the bit lines BL decrease in width for widening the distance between neighboring bit lines BL makes it possible to reduce any possible parasitic capacitance. The distance of bit lines BL is typically set at 0.32 μm. In this case the width of each bit line BL is at 0.14 μm (=0.46−0.32), which is less than the minimum size determinable by the photolithography resolution limit value. Where the bit lines BL are designed into such simple linear pattern, it is possible to attain good size accuracy even when the width thereof is reduced by microfabrication down at the photolithography resolution limit level. In addition, letting the distance of bit lines BL be greater than the width thereof makes it possible, even when the memory cell size is shrunk, to reserve the required opening margin of through-going holes (those through-holes each connecting between an information accumulation capacitive element C and its associated contact hole 14) 21 each disposed at an intersection between a bit line BL and its associative gate electrode 7 as will be described later.

The bit lines BL are each constituted from a multilayer structure of a TiN film and an overlying W film laminated over each other. In case part of bit line BL is made of a certain low-resistivity metal (W), its resultant sheet resistivity may be reduced down at about 2Ω/□ thereby enabling information reading and writing to be performed at high speeds. In addition, as those on-chip leads of peripheral circuitry of the DRAM are manufacturable simultaneously at a process step of fabricating the bit lines BL, it is possible to simplify the manufacturing processes of such DRAM. Further, in case the bit lines BL are comprised of specific materials (W, TiN) of greater electro-migration durability, it is possible to reduce the rate of open-circuit defects even when miniaturizing the width of the bit lines BL down to a minimal level at or near the photolithography resolution limit level.

The bit lines BL are arranged so that each is electrically connected to the plug (conductive layer) 15 within said contact hole 13 via a through-hole 17 as formed in the silicon oxide film 16 and is further electrically coupled through this plug (conductive layer) 15 to the n-type semiconductor region 8 (one of the source and drain) as commonly shared by two memory-cell select MISFETs Qs. The through-hole 17 for use in connecting between such bit line BL and its associated plug (conductive layer) 15 within the contact hole 13 is formed immediately beneath the bit line BL as disposed overlying the element separation groove 5 and is designed to have a diameter that is greater than the width of bit line BL. In this way, letting the Y-directional diameter of the contact hole 13 be greater than its X-directional diameter while at the same time causing part of it to extend up to a location overlying the element separation groove 5 may ensure successful electrical connection between the bit line BL and the n-type semiconductor region 8 without having to designe either to partially fatten the width of bit line BL and let it extend up to the location overlying the active region L or to fold part of the active region L in the direction of bit line BL.

Silicon oxide films 18, 19 are provided to overlie the bit lines BL; further, a silicon nitride film 20 is formed overlying such films. The silicon oxide film 19 is planarized to ensure that its surface is kept substantially identical in height over the entire area of the semiconductor substrate 1. Formed over the silicon nitride film 20 is the information accumulation capacitive element C. The information accumulation capacitive element C is formed of a lamination, called a stacked structure in the art to which the invention pertains, of a lower-side electrode (accumulation electrode) 22 and an intermediate capacitor dielectric film 23 plus an upper-side electrode (plate electrode) 24 in this order of sequence as looking at from the lowest layer. The lower electrode 22 and upper electrode 24 are each made of a low-resistivity polysilicon film with a chosen impurity—phosphorus (P) for example—doped thereinto whereas the capacitor dielectric film 23 is of an insulative film with high resistivity such as tantalum oxide ($Ta_2O_5$) by way of example.

As shown in FIGS. 2–3, the lower electrode 22 of the information accumulation capacitive element C is designed to have an elongate pattern that linearly extends in the X direction shown in the drawings, wherein it measures 0.77 μm in size in the X direction and 0.31 μm in Y direction. Additionally a distance between neighboring lower electrodes 22 is 0.15 μm in both the X direction and Y direction. In case the lower electrode 22 is arranged to have such simple straight line pattern, any resolution-difficult ultrafine patterns will no longer take place even when the distance is reduced down to the photolithography resolution limit level, which in turn makes it possible to attain good size accuracy required.

The lower electrode 22 of the information accumulation capacitive element C is electrically connected to the plug (conductive layer) 15 residing within said contact hole 14 via a through-hole 21 as formed to penetrate the silicon nitride film 20 and silicon oxide films 19, 18 plus the underlying silicon oxide film 16 and is further electrically coupled via this plug (conductive layer) 15 to the remaining one of the source and drain of the memory-cell select MISFET Qs. As the through-hole 21 for use in connecting together the lower electrode 22 and the plug (conductive layer) 15 within the contact hole 14 is laid out between a bit line BL and another bit line BL next thereto, the opening area of such through-hole 21 is determinable by the distance of bit lines BL. Where the bit lines BL are designed so that each linearly extends in the X direction with the same width and same interval retained along the overall length thereof in the way stated supra, it becomes possible to ensure elimination or preclusion of any unwanted electrical shorting between the lower electrode 22 within the through-hole 21 and its associated bit line(s) BL due to the fact that the required opening margin of such through-hole 21 is obtainable even when the memory cell size is shrunk.

Although not specifically depicted in the drawings, an interlayer dielectric film is formed overlying the information accumulation capacitive element C while letting one or a couple of metal leads be formed to overlie such interlayer dielectric film.

An explanation will next be given of one exemplary manufacturing method of the memory cells arranged as discussed above with reference to FIG. 5 through FIG. 30 in the order of process steps. Note that ion implantation conditions and those values as to thermal processing temperatures in the following explanation are mere examples and thus should not be used for purposes of limitative interpretation of the invention as disclosed and claimed herein.

Firstly, as shown in FIG. 5, a semiconductive substrate 1 of p conductivity type is prepared which is subjected to thermal processing to form a silicon oxide film 30 on the surface thereof; thereafter, a silicon nitride film 31 is deposited by chemical vapor deposition (CVD) techniques on the silicon oxide film 30. Then, form on the silicon nitride film 31 a photoresist film 32 covering an active region and having more than one opening defined therein as an element isolation region, which photoresist film 32 is used as a mask to pattern the silicon nitride film 31.

Figures 6A, 6B:
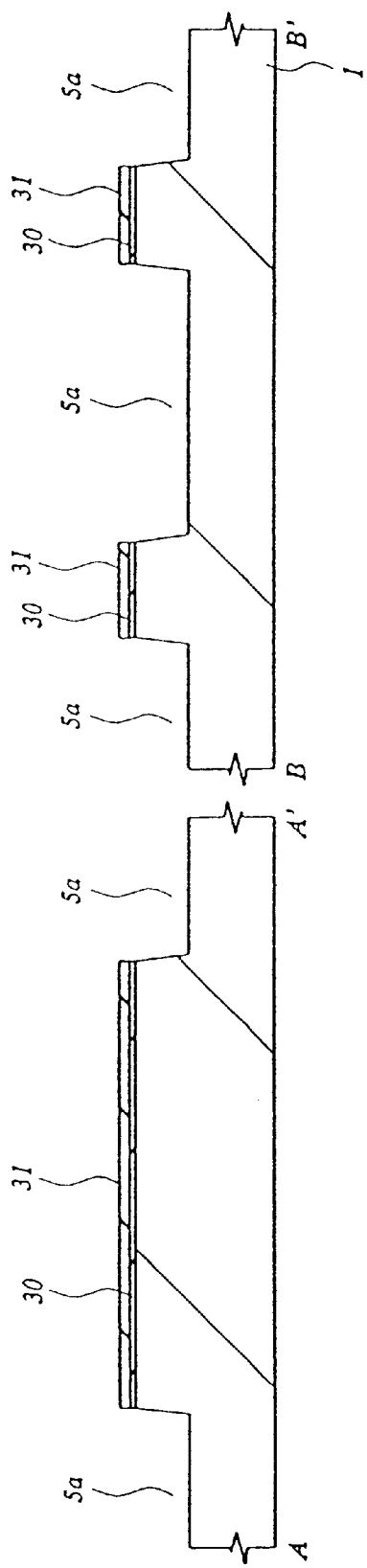

Next, after having removed away the photoresist film 32, etch the silicon oxide film 30 and semiconductor substrate 1 with the silicon nitride film 31 being as a mask therefor, thereby forming a groove 5a in the semiconductor substrate 1 to a depth of approximately 300 to 400 nanometers (nm) as shown in FIG. 6.

Figure 7A:
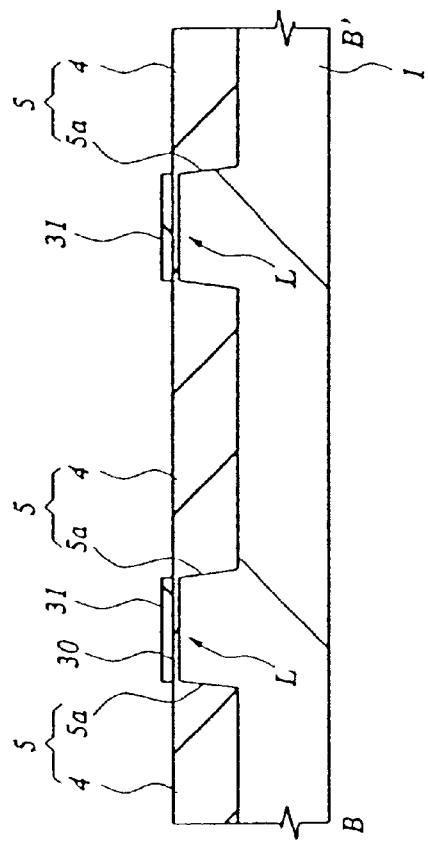
Figure 7B:
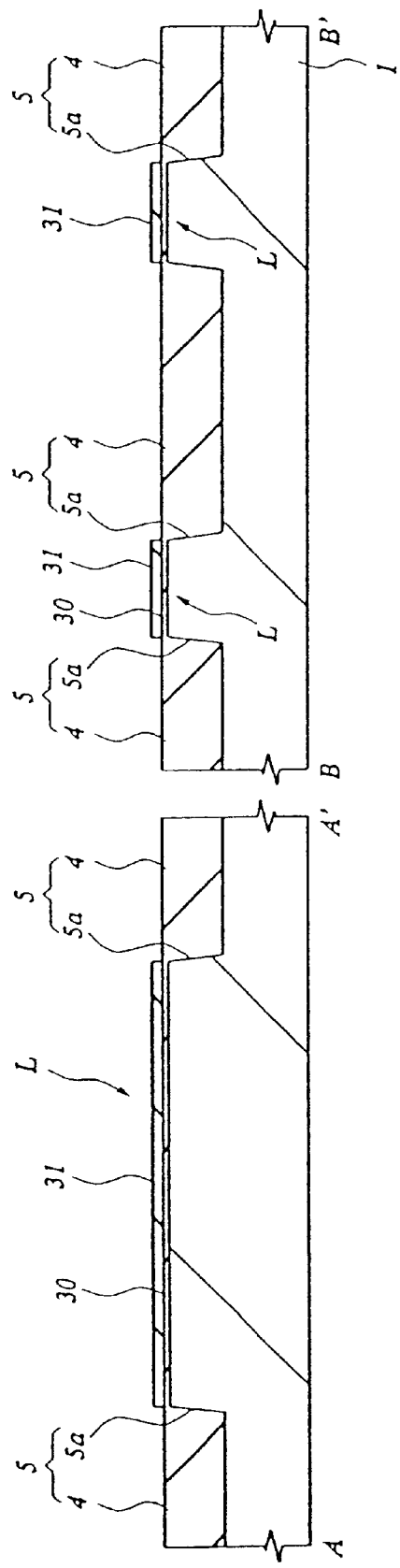
Figure 8:
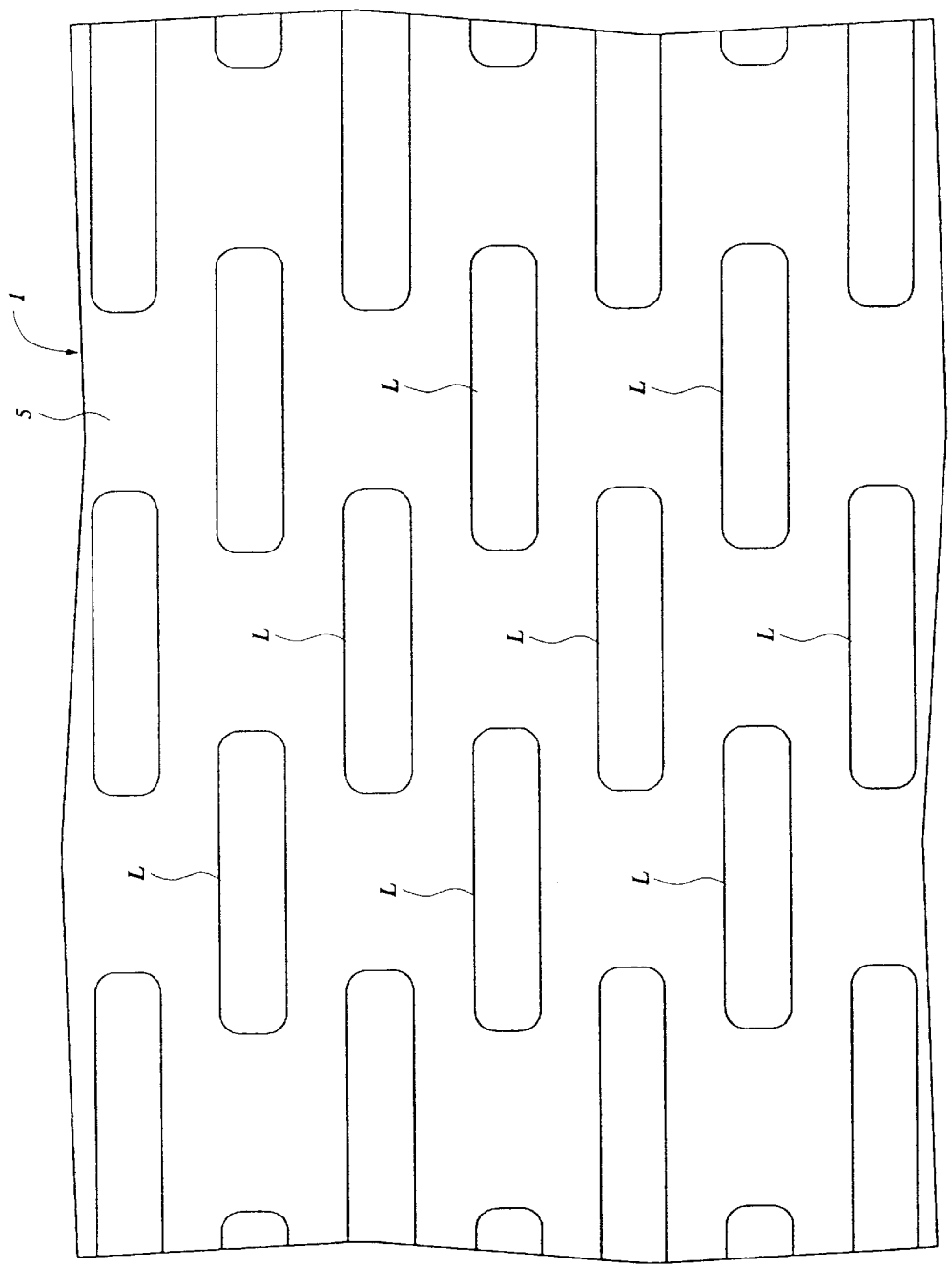
FIG. 8 is a diagram depicting a plan view of the main part of the semiconductor substrate at the step during manufacture of the DRAM memory cells of Embodiment 1 of the invention.

Next, as shown in FIGS. 7 and 8, a silicon oxide film 4 is deposited by CVD techniques on the semiconductor substrate 1 and is then subject to thermal processing for densification (sintering) at a temperature of about 1,000° C.; thereafter, use known chemical-mechanical polishing (CMP) techniques to abrade or polish this silicon oxide film 4 while allowing the groove 5a to reside inside of it, thereby forming an element separation groove 5 and active region L.

Figure 9A:
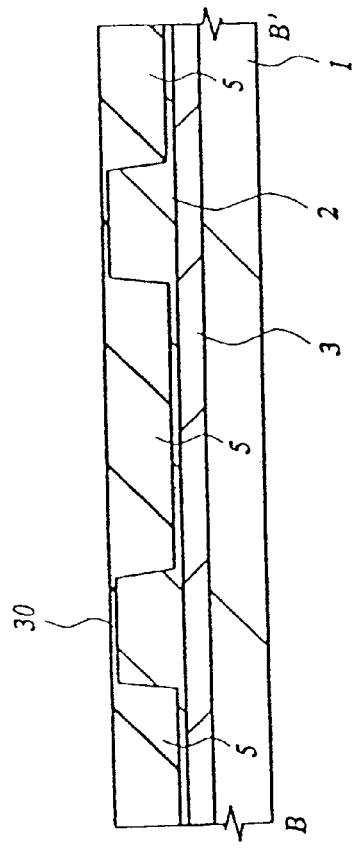
FIGS. 9 and 10 are each a diagram depicting in cross-section main part of the semiconductor substrate at a step during manufacture of the DRAM memory cells of Embodiment 1 of the invention.
Figure 9B:
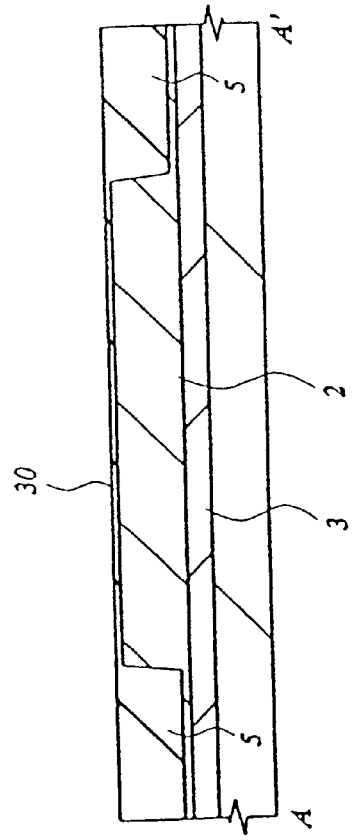

After having effectuated wet etching using hot phosphoric acid for removal of any residual components of the silicon nitride film 31 on the semiconductor substrate 1 in the active region L, form in the semiconductor substrate 1 an n-type semiconductor region 3 as shown in FIG. 9; subsequently, fabricate a p-type well 2 at a shallow portion of this n-type semiconductor region 3. The n-type semiconductor region 3 is manufacturable in a way which follows: The semiconductor substrate 1 is doped with a chosen impurity, such as phosphorus (P), by ion implantation techniques at a dose of approximately $1 \times 10^{12}$ atoms per square centimeter ($cm^2$) with an acceleration energy of 500 to 1,000 kiloelectronvolts (KeV); thereafter, the resultant structure is then subject to thermal processing for activation at a temperature of about 1,000° C. The n-type semiconductor region 3 is continuously formed at a level beneath a plurality of memory cells. In addition, the p-type well 2 is fabricated in a way such that a specific impurity—here, boron (B)—is doped by ion implantation techniques into the n-type semiconductor region 3 at a dose of about $1 \times 10^{13}$ atoms/$cm^2$ with an acceleration energy of 200 to 300 KeV; then, the doped boron (B) impurity is activated through thermal processing at a temperature of about 950° C. When this is done, simultaneously perform ion implantation of an impurity (typically, boron fluoride or $BF_2$) for adjustment of the threshold voltage of a memory-cell select MISFET Qs at a dose of about $2 \times 10^{12}$/$cm^2$ with an acceleration energy of 40 KeV or therearound.

Figures 10A, 10B:
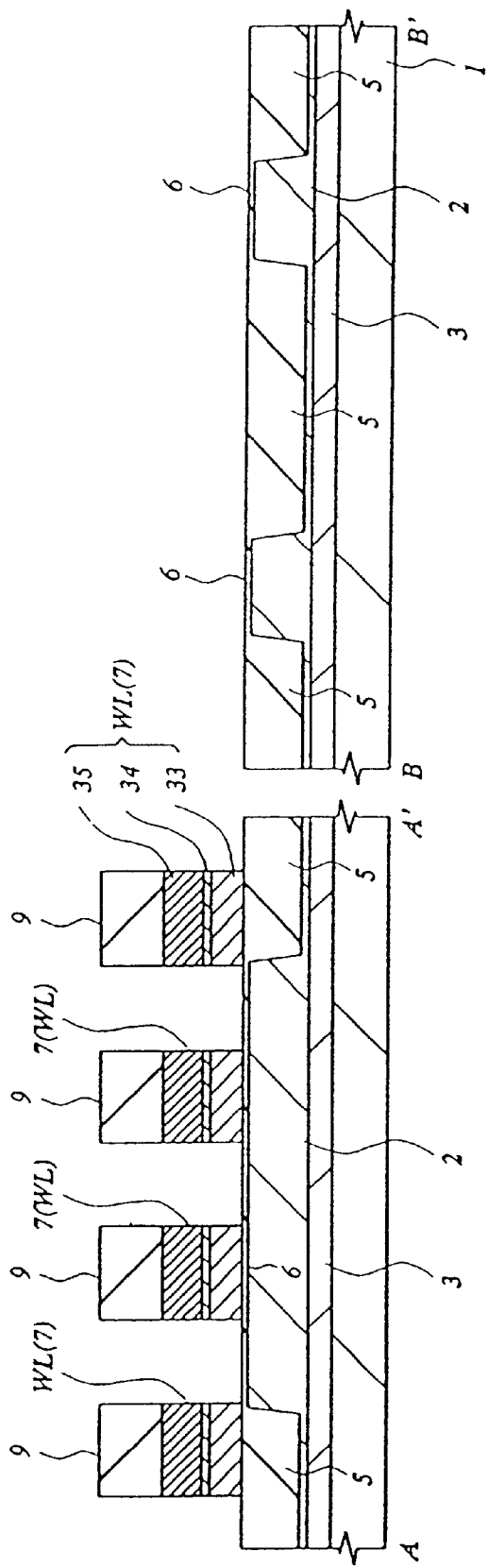
Figure 11:
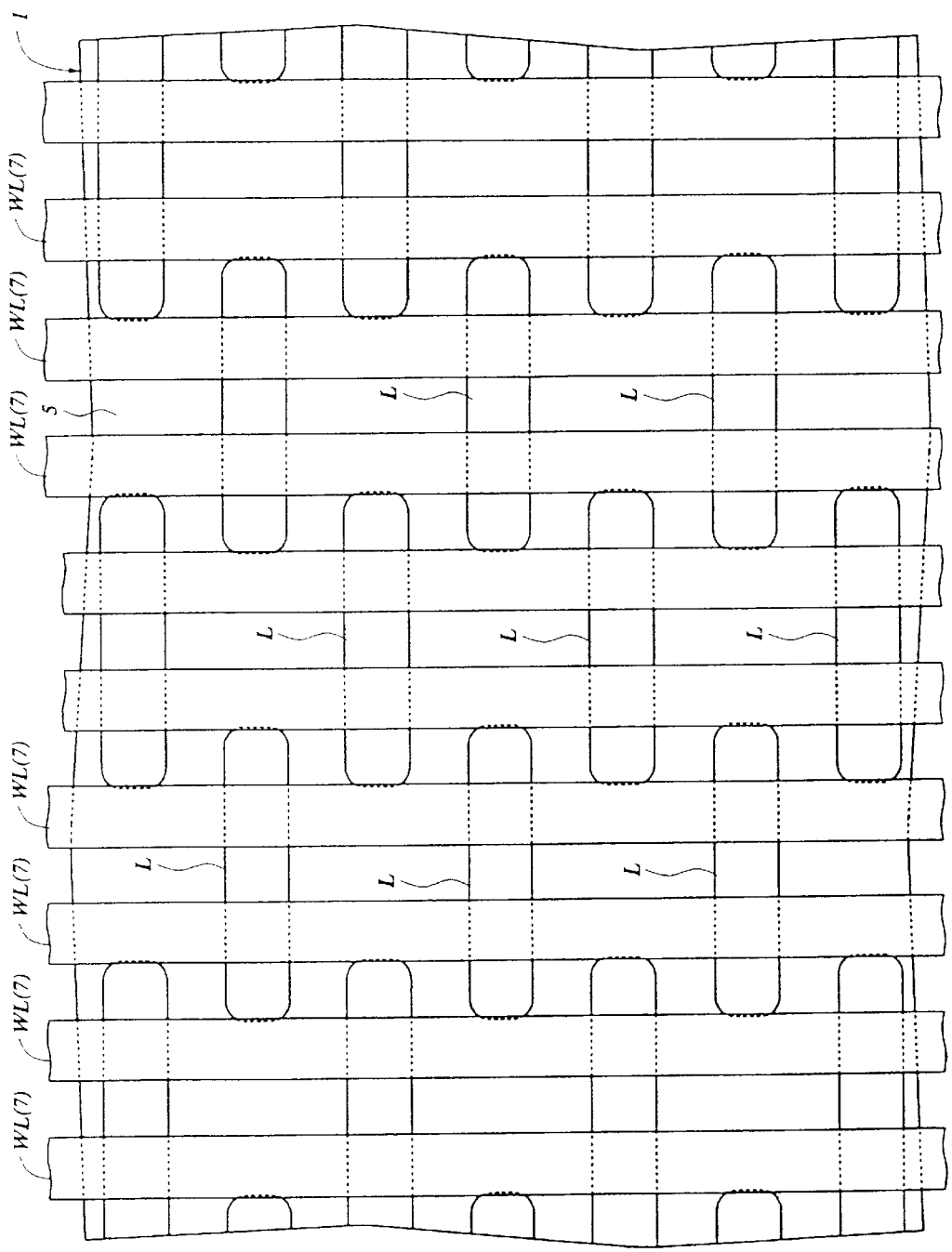
FIG. 11 is a diagram showing in plan view main part of the semiconductor substrate at the step during manufacture of the DRAM memory cells of Embodiment 1 of the invention.

As shown in FIGS. 10–11, after having removed by wet cleaning techniques any residual components of the silicon oxide film 30 on the surface of the active region L, fabricate on the surface of the p-type well 2 of the active region L a gate oxide film 6 of the memory-cell select MISFET Qs; then further form thereon a gate electrode 7 (word line WL). The gate oxide film 6 is formed through wet oxidation of the surface of the p-type well 2 at a temperature ranging from 800 to 900° C. The gate electrode 7 (word line WL) may be formed by a method that includes the steps of depositing by CVD techniques a phosphorus (P)-doped polysilicon film 33 on the semiconductor substrate 1, depositing thereon a TiN film 34 and W film 35 by sputtering techniques, further depositing thereon a silicon nitride film 9 by CVD techniques, and thereafter patterning these films through etching treatment with a photoresist film used as a mask therefor. As previously stated, the gate electrode 7 (word line WL) is formed so that it extends like a straight line segment in the Y direction up to the terminate end of a memory array while maintaining an identical width (0.24 μm) and equal interval (0.22 μm) along the length thereof.

Figure 12B:
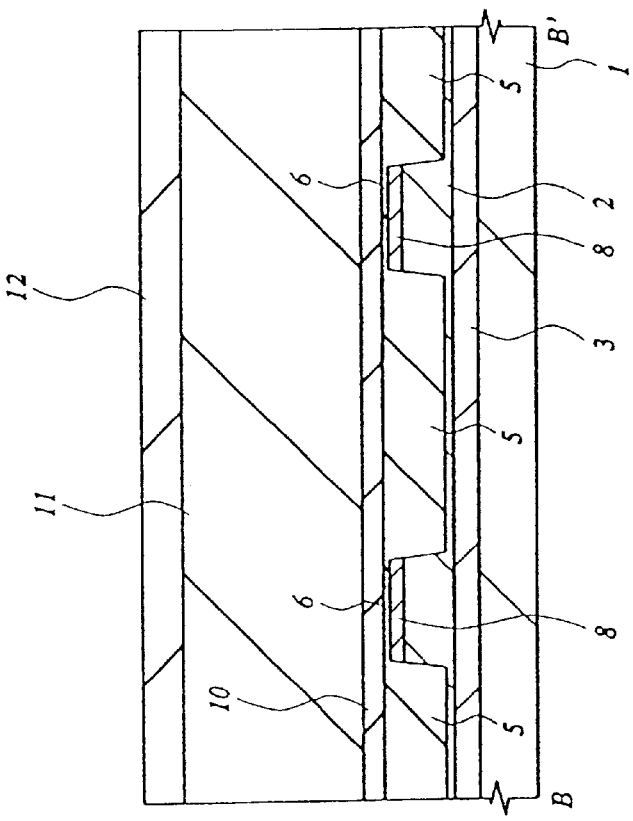
FIGS. 12 to 14 are each a diagram showing in cross-section main part of the semiconductor substrate at a process step during manufacture of the DRAM memory cells of Embodiment 1 of the invention.
Figure 12A:
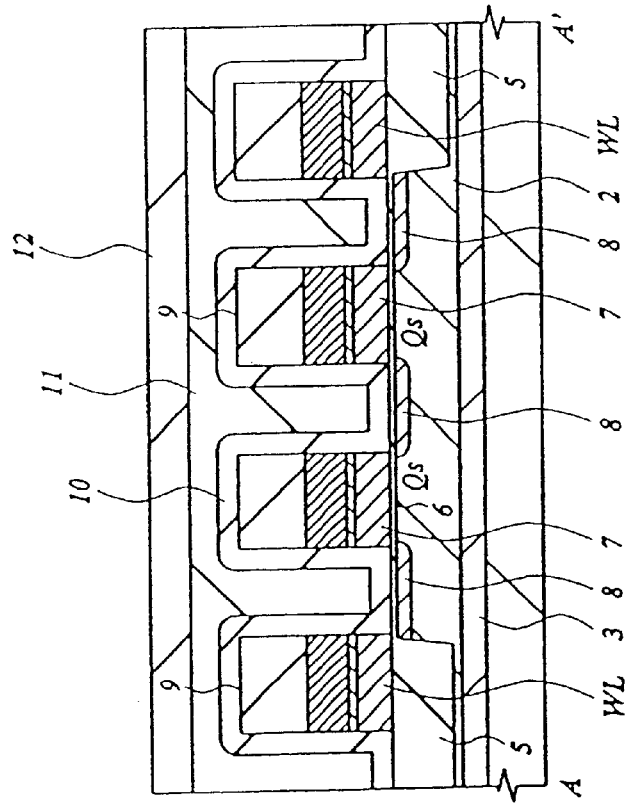

Next, as shown in FIG. 12, after completion of fabrication of n-type semiconductor regions 8 (source, drain) in the p-type well 2 of the active region L to thereby form the memory-cell selecting MISFET Qs, use CVD techniques to deposit on this memory-cell select MISFET Qs a silicon nitride film 10 and two silicon oxide films 11, 12. The n-type semiconductor regions 8 may be formed by a method including the steps of doping by ion implantation a phosphorus (P) impurity into the p-type well at a dose of approximately $1 \times 10^{14}$ atoms/$cm^2$ with an acceleration energy of about 30 KeV, and thereafter applying thermal processing thereto at a temperature of about 900° C. for activation of the phosphorus (P) impurity doped. The overlying silicon oxide film 12 is planarized to ensure that its surface is virtually identical in height with respect to the entire area of the semiconductor substrate 1.

Figures 13A, 13B:
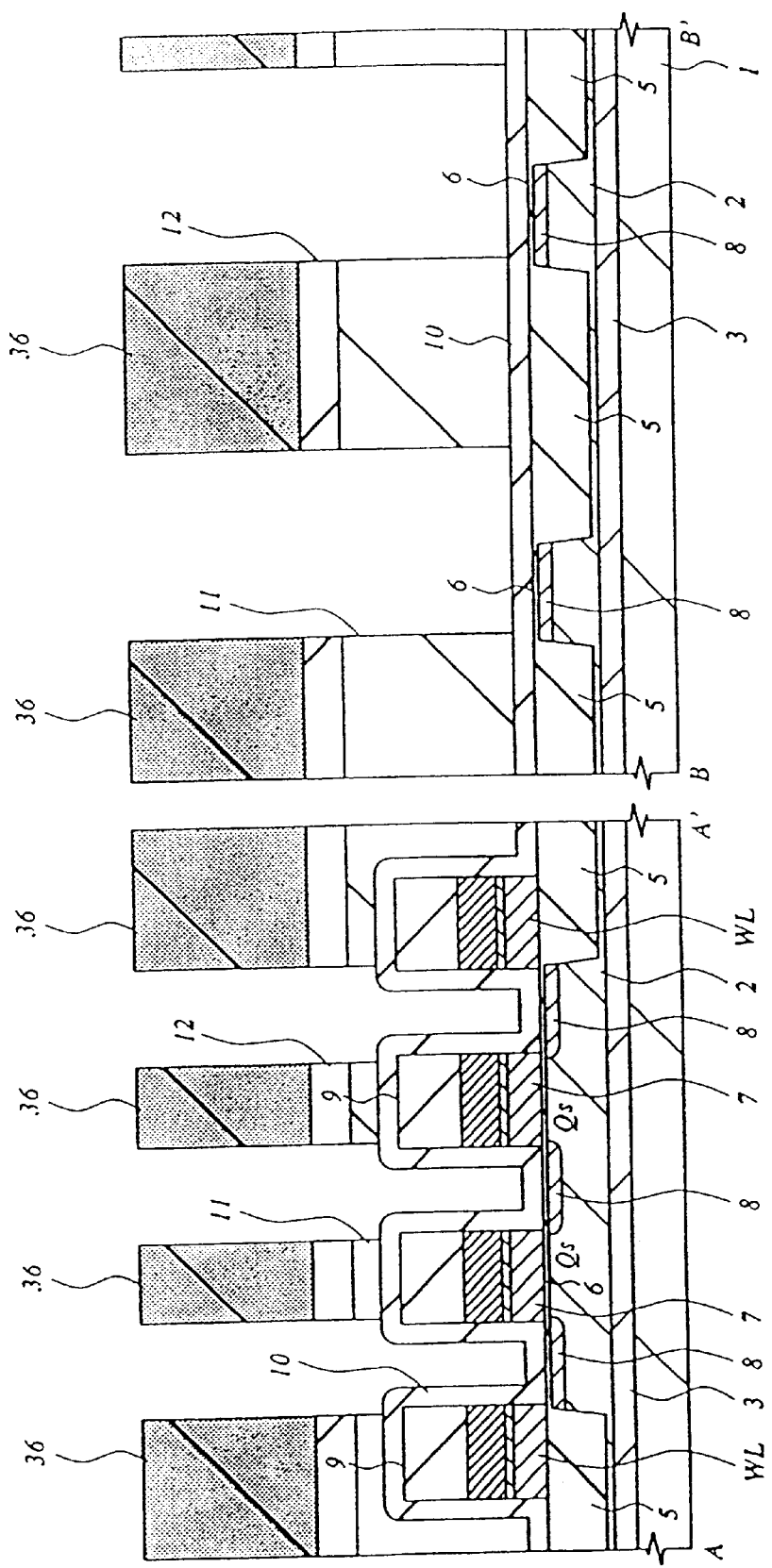

Next, as shown in FIG. 13, etching is done with a patterned photoresist film 36 used as a mask to remove selected portions of silicon oxide films 12, 11 which overlie the n-type semiconductor regions 8 (source and drain) of each memory-cell select MISFET Qs. This etching process is performed under the condition that the etching rate of silicon oxide films 12, 11 with respect to the silicon nitride 10 becomes greater while preventing unwanted removal of the silicon nitride film 10 overlying the n-type semiconductor regions 8 and element separation groove 5.

Figures 14A, 14B:
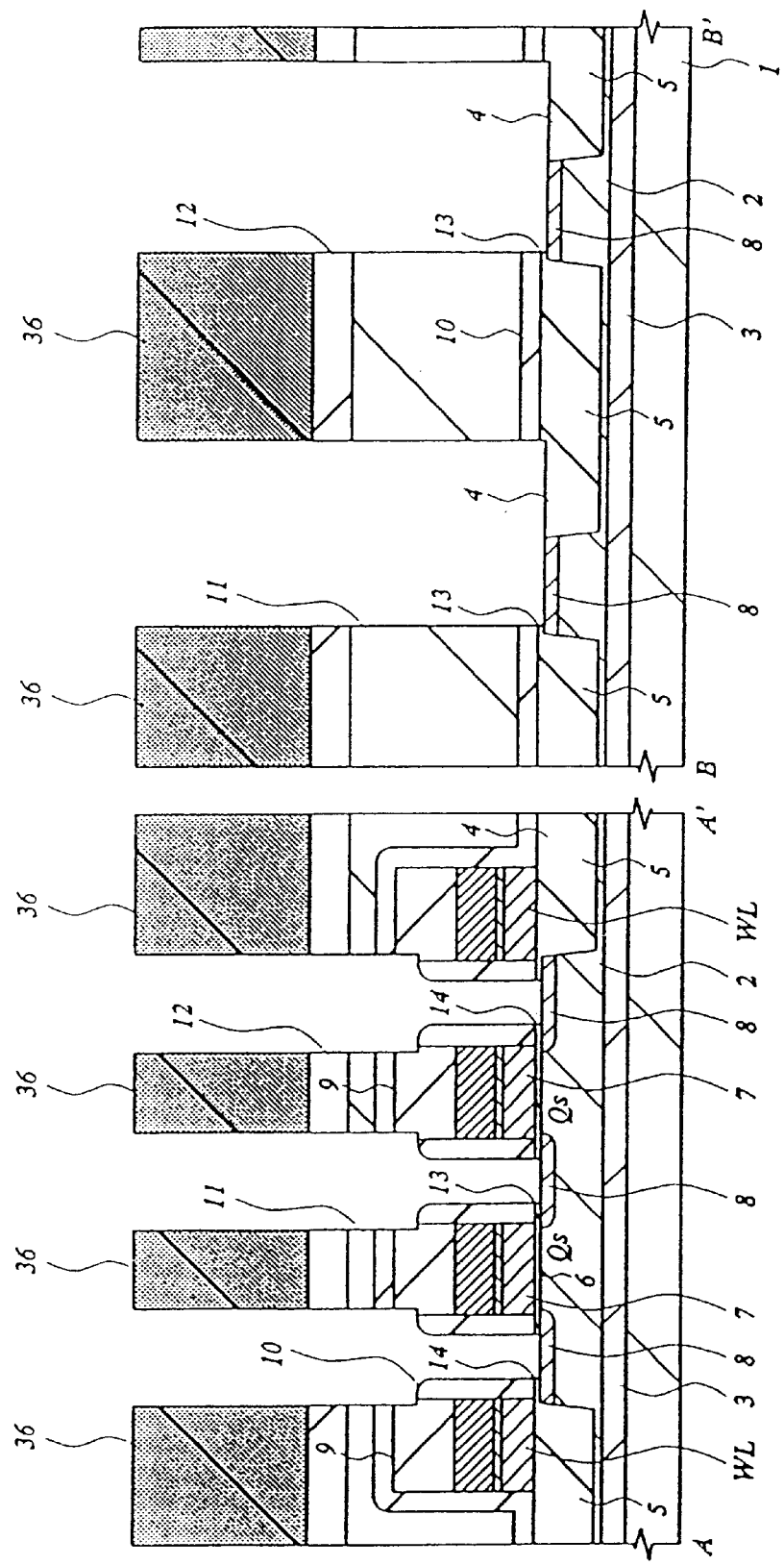
Figure 15:
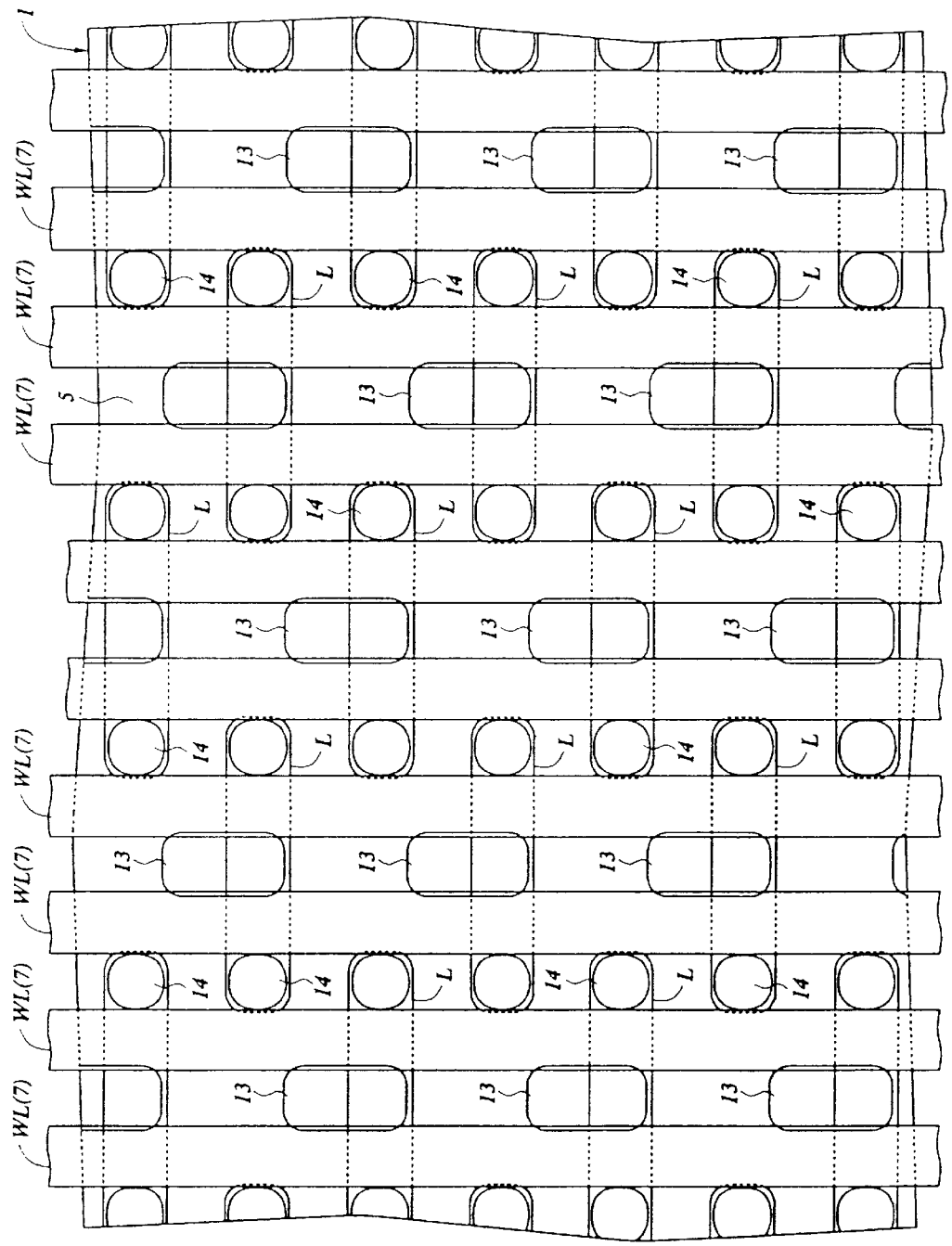
FIG. 15 is a diagram showing, in plan view, main part of the semiconductor substrate at the step during manufacture of the DRAM memory cells of Embodiment 1 of the invention.

Next, as shown in FIGS. 14–15, etching is done with the photoresist film 36 as a mask to remove away selected portions of the silicon nitride film 10 and gate oxide film 6 overlying the n-type semiconductor regions 8 of memory-cell select MISFET Qs to thereby fabricate a contact hole 13 at a location overlying one of the source and drain and also a contact hole 14 overlying the other of them. As previously discussed, the contact hole 13 is formed into a pattern of substantially rectangular shape with a diameter in the Y direction greater than that in the X direction whereas the contact hole 14 is formed to have a pattern with its diameter in the Y direction almost equal to that in the X direction. This etching is done under the condition that the etching rate of silicon nitride film 10 relative to certain silicon oxide film (gate oxide film 6 and silicon oxide film 4 within the element separation groove 5) becomes greater while eliminating deep cutaway of the n-type semiconductor regions 8 and element separation groove 5. This etching is also designed so that the silicon nitride film 10 is anisotropically etched causing a portion of silicon nitride film 10 to reside on the sidewall of a gate electrode 7 (word line WL). Through such etching treatment the contact holes 13, 14 are formed in self-alignment with the silicon nitride film 10 on the sidewall of gate electrode 7 (word line WL). This formation of such contact holes 13, 14 as self-aligned with silicon nitride film 10 may alternatively be carried out by a method including the steps of anisotropically etching in advance the silicon nitride film 10 and then forming a sidewall spacer on the sidewall of gate electrode 7 (word line WL).

Figure 16A:
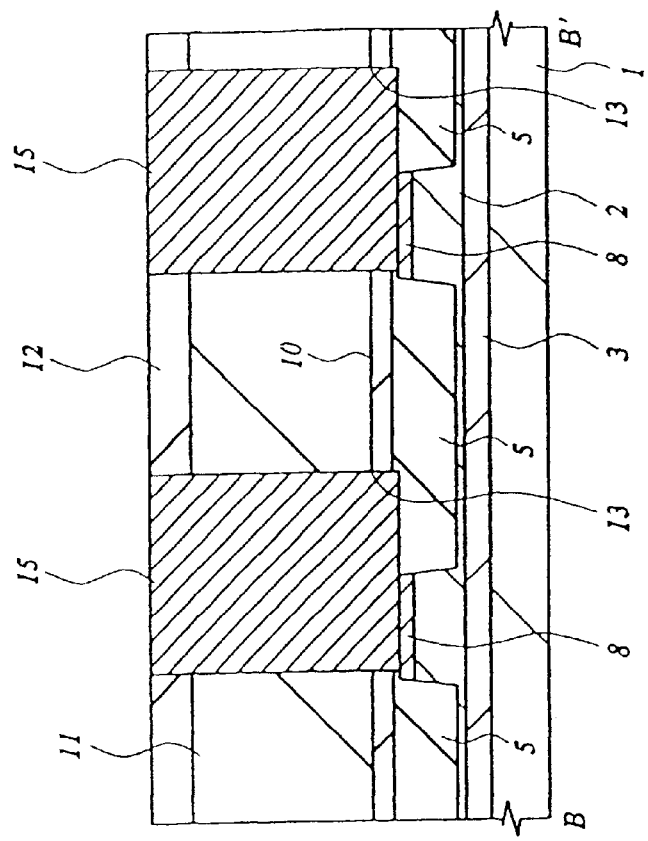
FIGS. 16 and 17 are each a diagram showing in cross-section main part of the semiconductor substrate at a step during manufacture of the DRAM memory cells of Embodiment 1 of the invention.
Figure 16B:
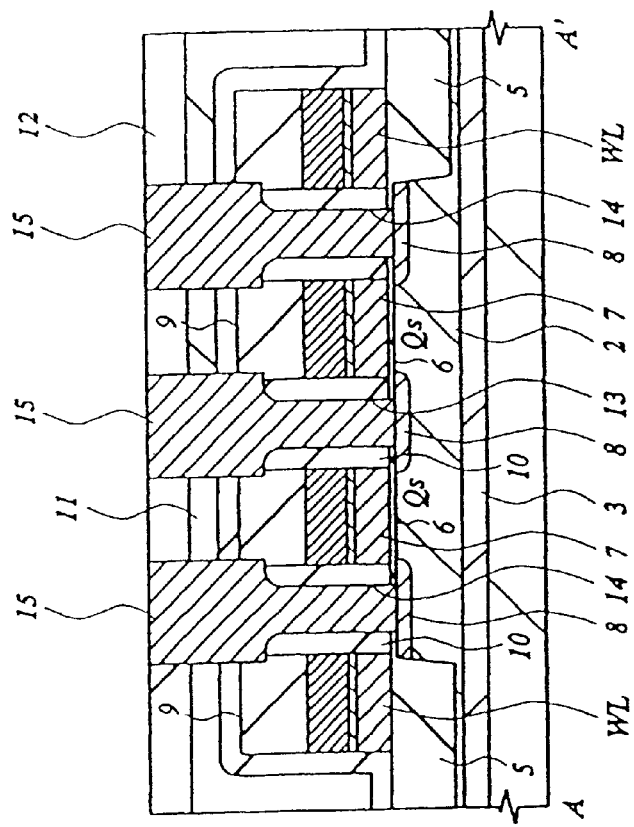

Next, after having removed the photoresist film 36, form plugs (conductive layers) 15 within the contact holes 13, 14 as shown in FIG. 16. These plugs (conductive layers) 15 are manufacturable by depositing on the silicon oxide film 12 a polycrystalline silicon film with an n-type impurity (for example, phosphorus (P)) doped therein by using CVD methods and thereafter applying chemical-mechanical polishing processing to this polysilicon film thereby letting portions thereof reside inside of the contact holes 13, 14. During later thermal processing at high temperatures, the n-type impurity doped in the polysilicon films constituting the plugs (conductive layers) 15 behaves to outdiffuse from the bottom portions of the contact holes 13, 14 into the n-type semiconductor regions 8 (source, drain) thereby lowering the electrical resistivity of such n-type semiconductor regions 8.

Figure 17A:
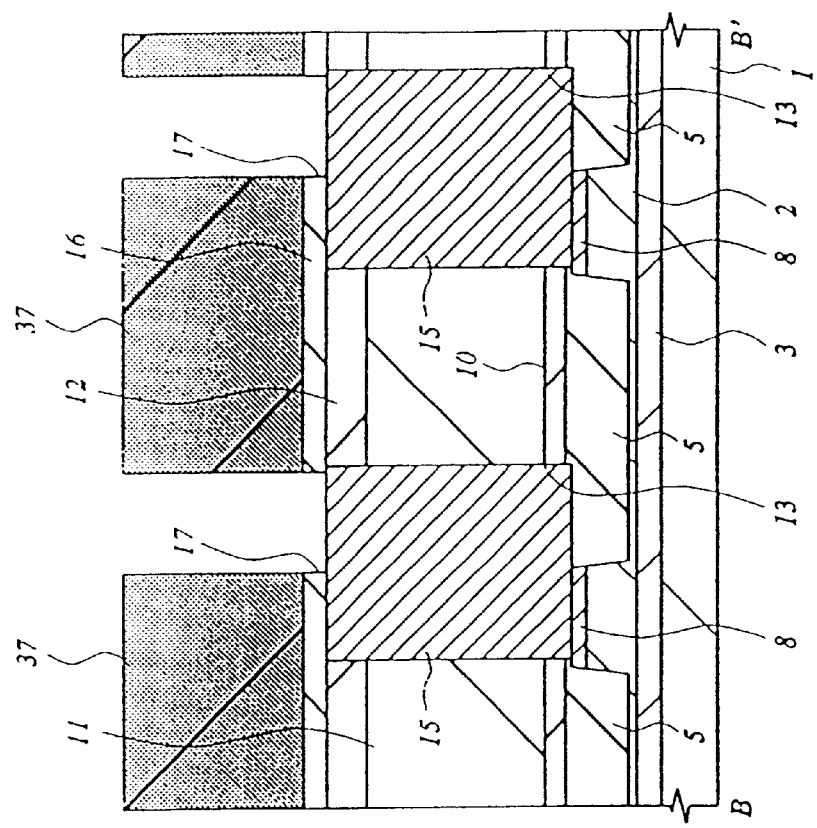
Figure 17B:
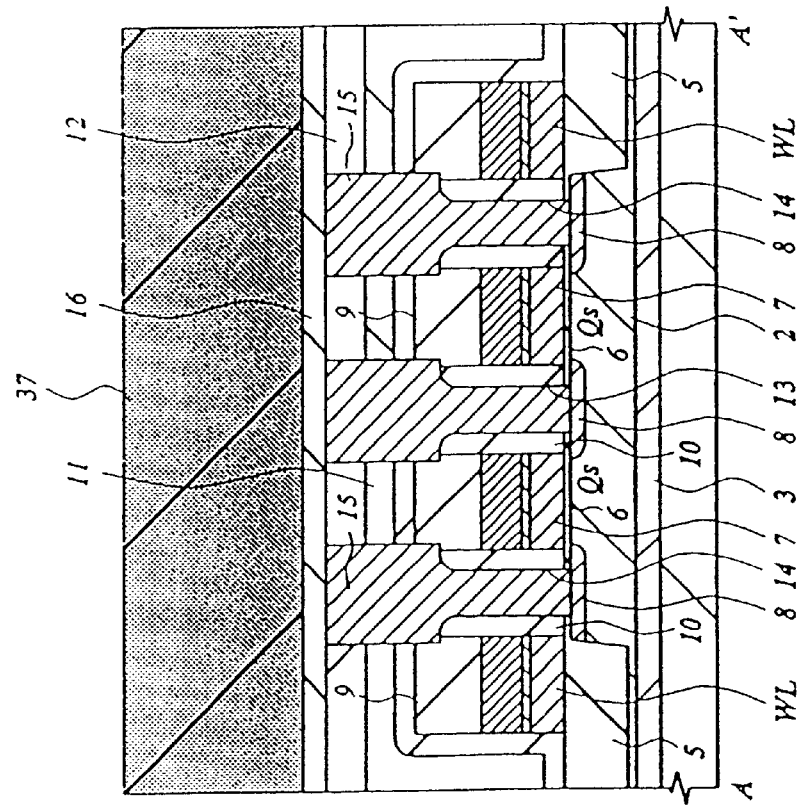
Figure 18:
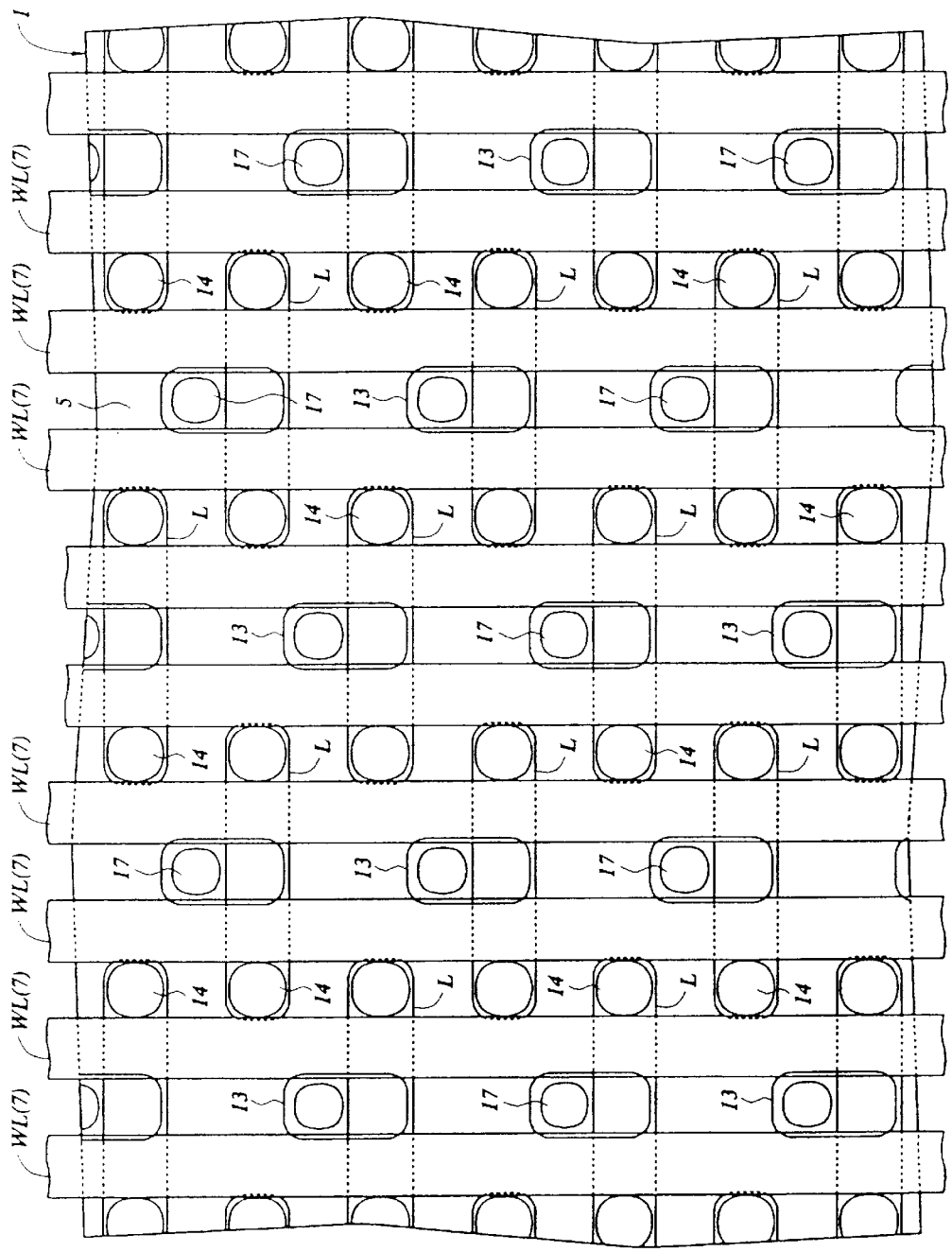
FIG. 18 is a diagram depicting, in plan view, main part of the semiconductor substrate at the step during manufacture of the DRAM memory cells of Embodiment 1 of the invention.

Next, as shown in FIGS. 17–18, use CVD methods to deposit on the silicon oxide film 12 a silicon oxide film 16; thereafter, etch the silicon oxide film 16 with a patterned photoresist film 37 used as a mask to thereby form a through-going hole 17 overlying the contact hole 13. As previously stated, the through-hole 17 is formed at a location that overlies the element separation groove 5 and is out of the active region L. Optionally a plug comprised of a conductive film made of a polysilicon film or W film may be buried in this through-hole 17.

Figure 19:
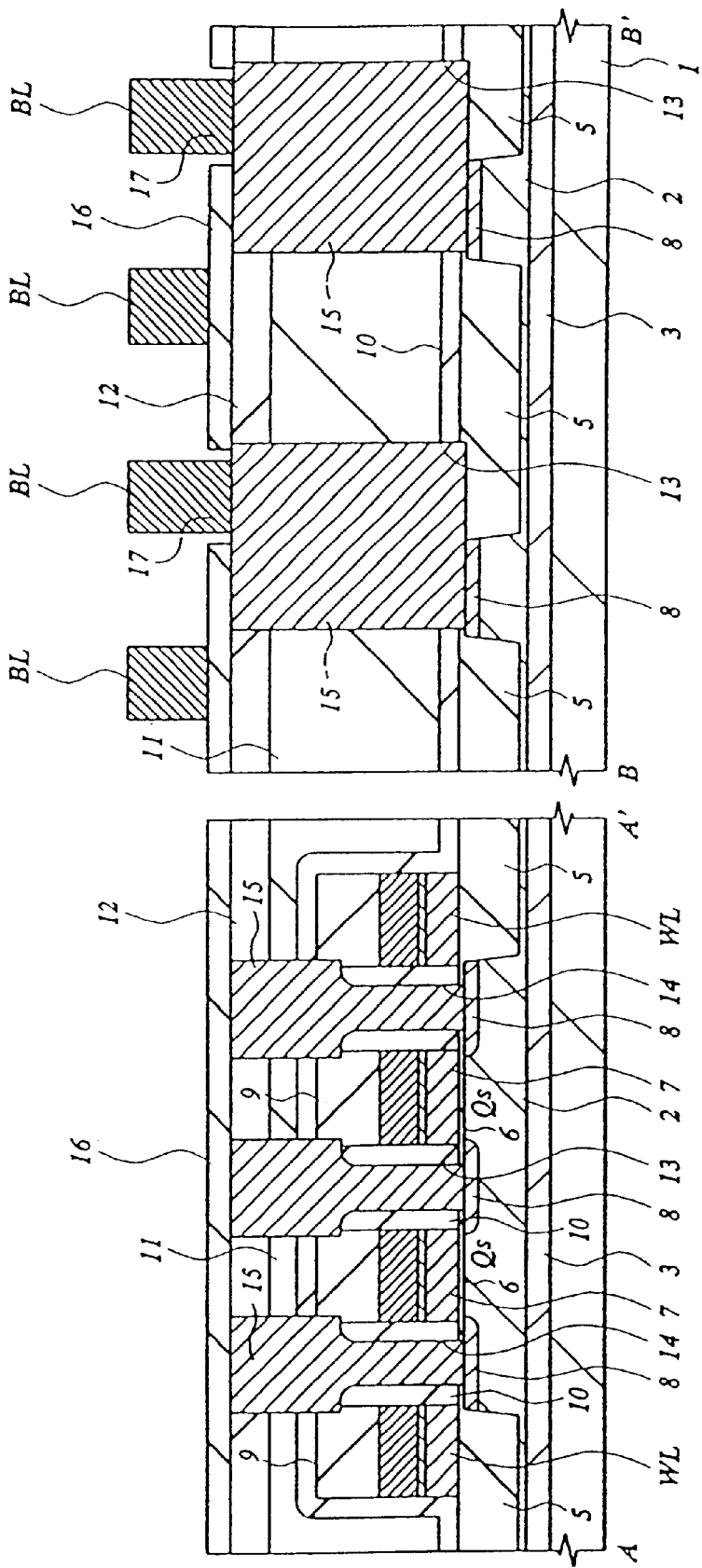
FIG. 19 is a diagram showing in cross-section main part of the semiconductor substrate at a step during manufacture of the DRAM memory cells of Embodiment 1 of the invention.
Figure 20:
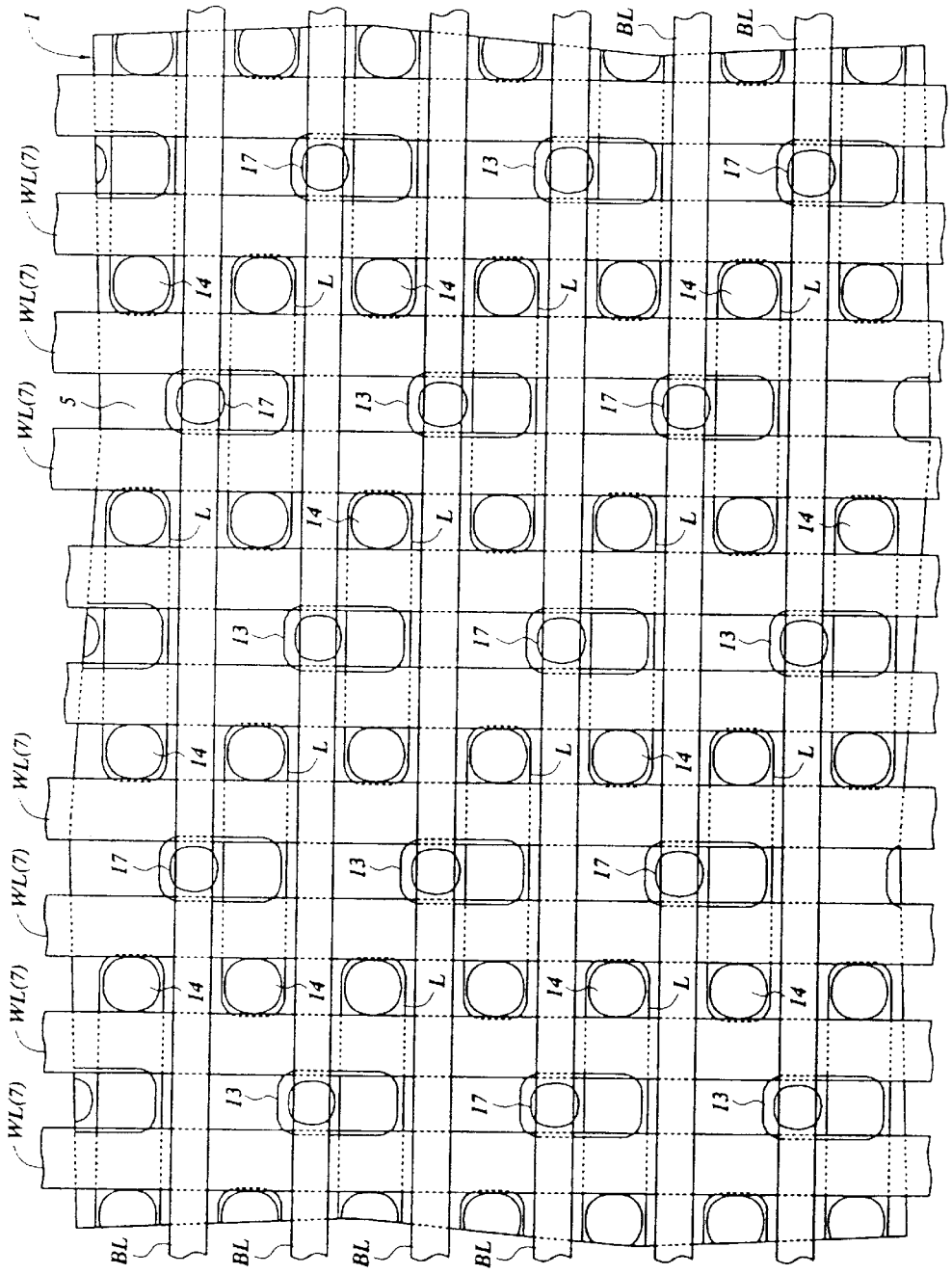
FIG. 20 is a digram showing in plan view main part of the semiconductor substrate at the step during manufacture of the DRAM memory cell of Embodiment 1 of the invention.

Next, after having removed the photoresist film 37, fabricate regularly spaced parallel bit lines BL on the silicon oxide film 12 as shown in FIGS. 19–20; then, let each bit line BL be electrically connected via the through-hole 17 to the contact hole 13. The bit lines BL are fabricatable by depositing a TiN film and W film by sputtering techniques on the silicon oxide film 12 and then patterning these films through etching with a photoresist film used as a mask therefor. As stated supra, the bit lines BL are so formed as to straightly extend along the X direction at an equal width (0.14 $\mu$m) and an equal interval (0.32 $\mu$m).

Figure 21A:
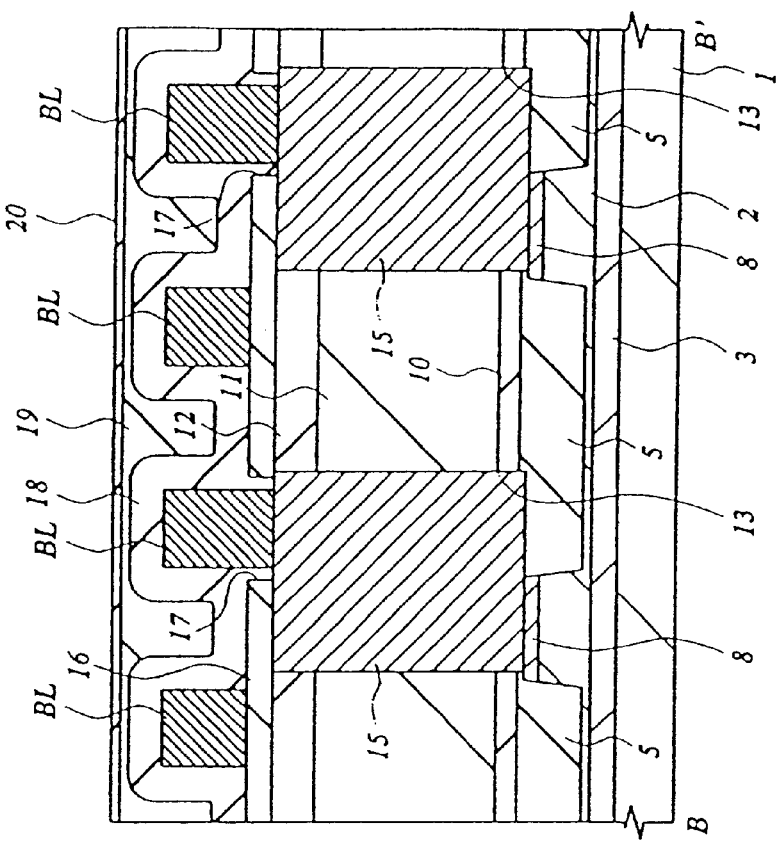
Figure 21B:
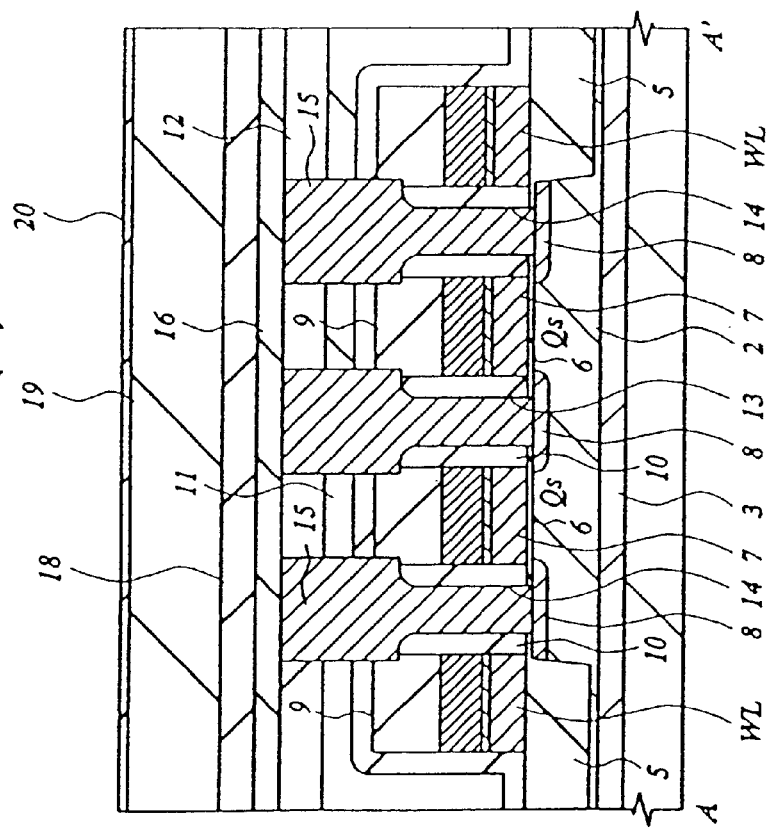

Next, as shown in FIG. 21, use CVD techniques to deposit silicon oxide films 18, 19 and silicon nitride film 20 covering the bit lines BL. Apply chemical/mechanical polishing to the silicon oxide film 19 for planarization so that the resulting surface thereof is kept substantially identical in height over the entire area of the semiconductor substrate 1.

Next, as shown in FIG. 22, after having deposited on the silicon nitride film 20 a silicon oxide film 38 and a phosphorus (P) impurity-doped polysilicon film 39 by using CVD methods, etching is done with a photoresist film 40 used as a mask to define openings 25 in the polysilicon film 39 at specified locations overlying the contact holes 14. A respective one of these openings 25 is formed to have a minimal size as determinable by a limit of resolution in photolithography.

Figures 23A, 23B:
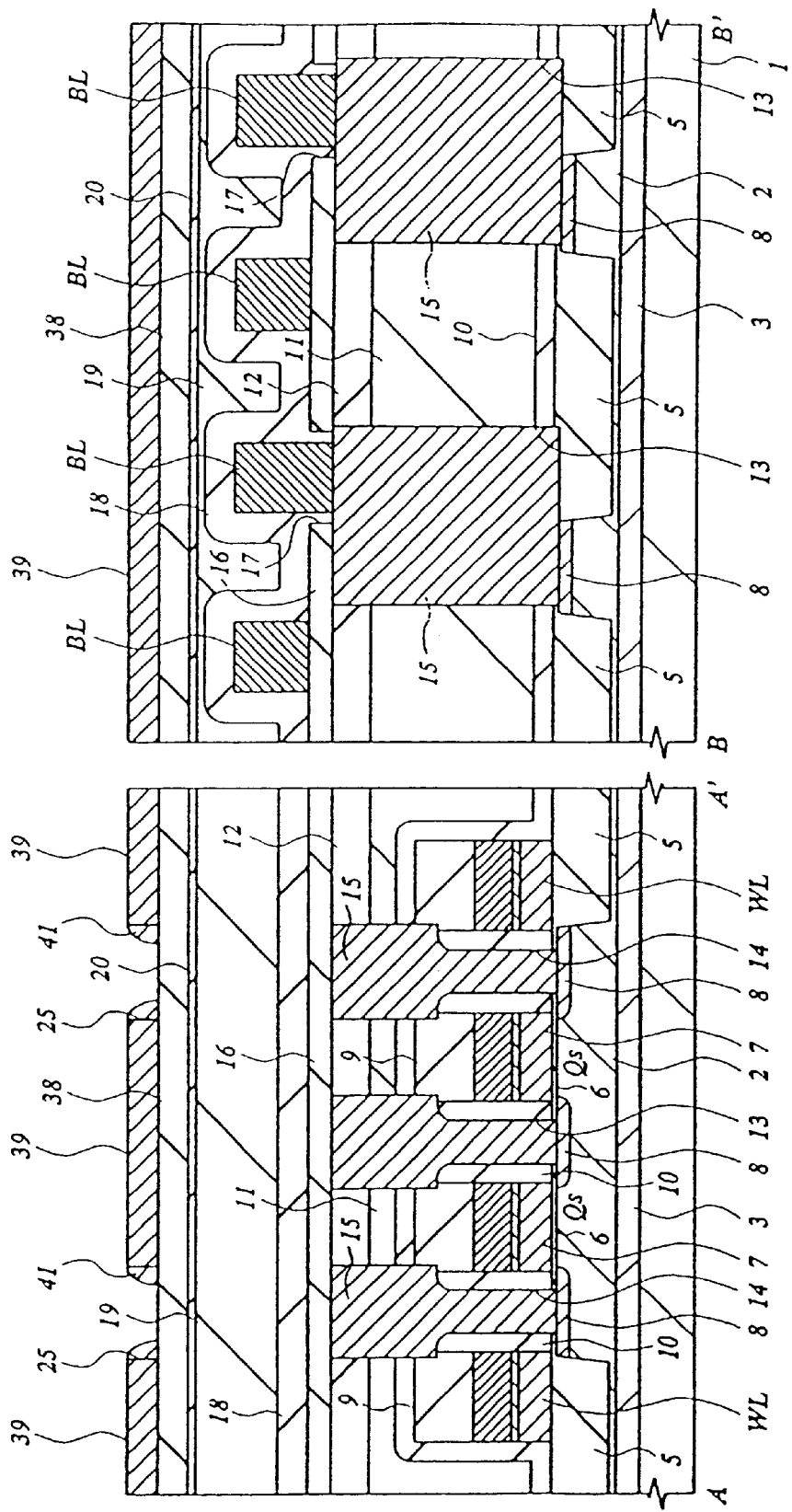

Next, as shown in FIG. 23, form on the side wall of each opening 25 a sidewall spacer 41 made of polysilicon. Formation of the sidewall spacer 41 is aimed at reservation of sufficient opening margins of through-hole 21 as will be formed underlying the opening 25 at a later process step for prevention of unwanted electrical shorting between the bit lines BL and a lower-side electrode 22 within the through-hole 21. The sidewall spacer 41 is formed by depositing on the polysilicon film 39 a phosphorus (P)-doped polysilicon film by CVD techniques and then apply anisotropic etching to this polysilicon film to have a desired pattern.

Figure 24B:
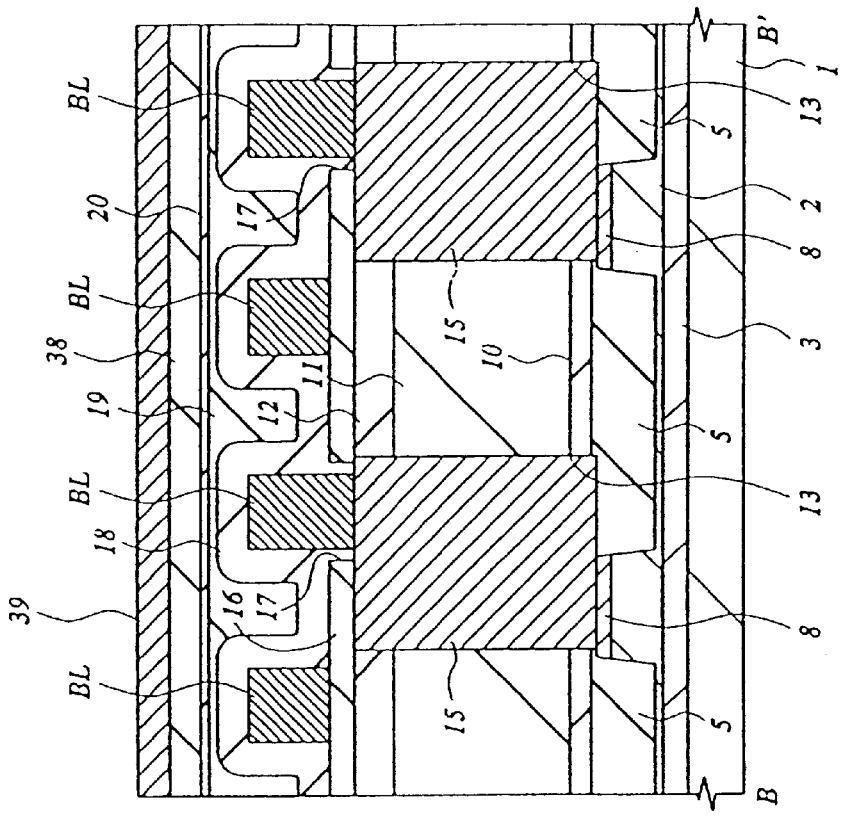
Figure 24A:
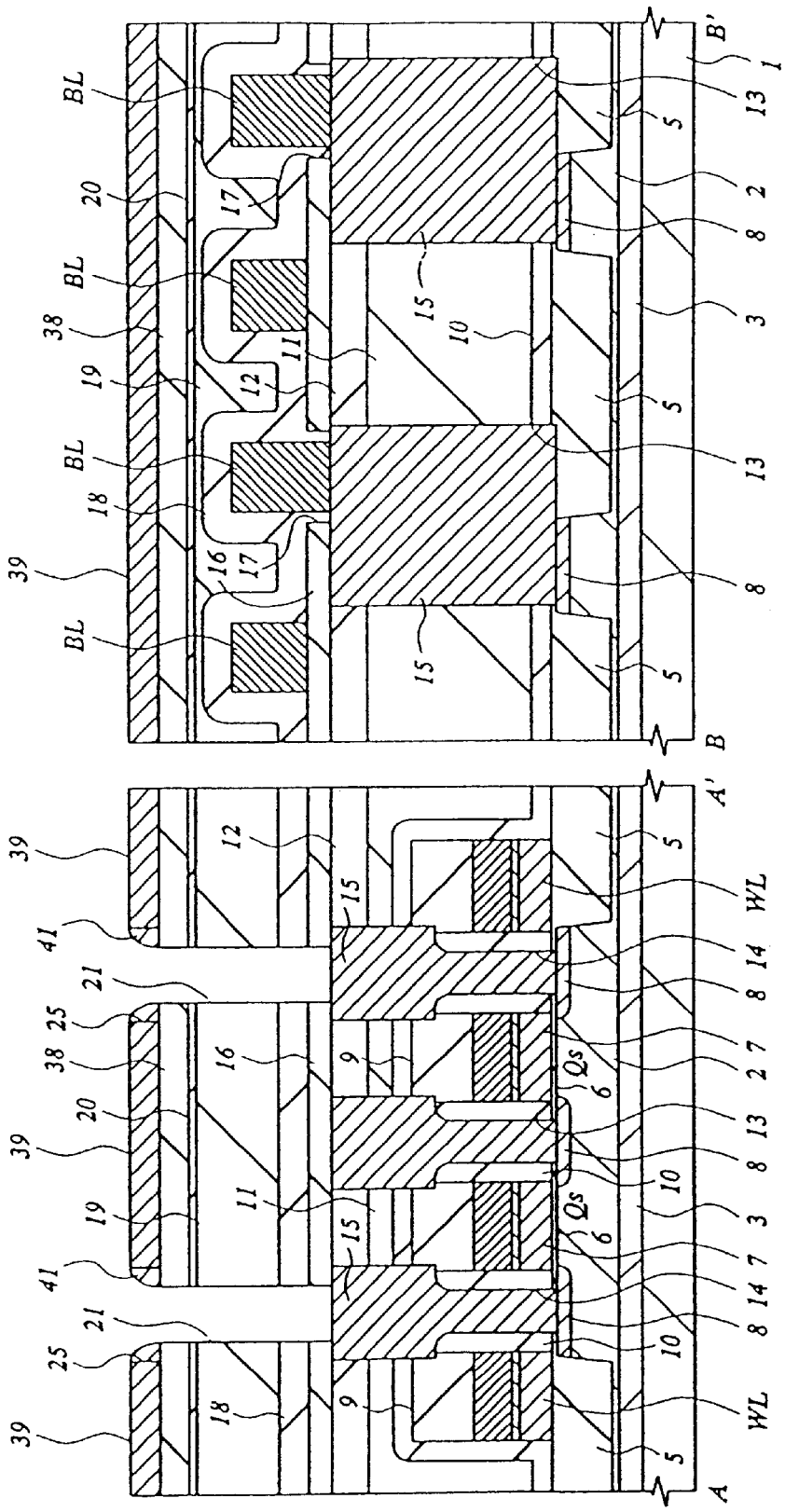
Figure 25:
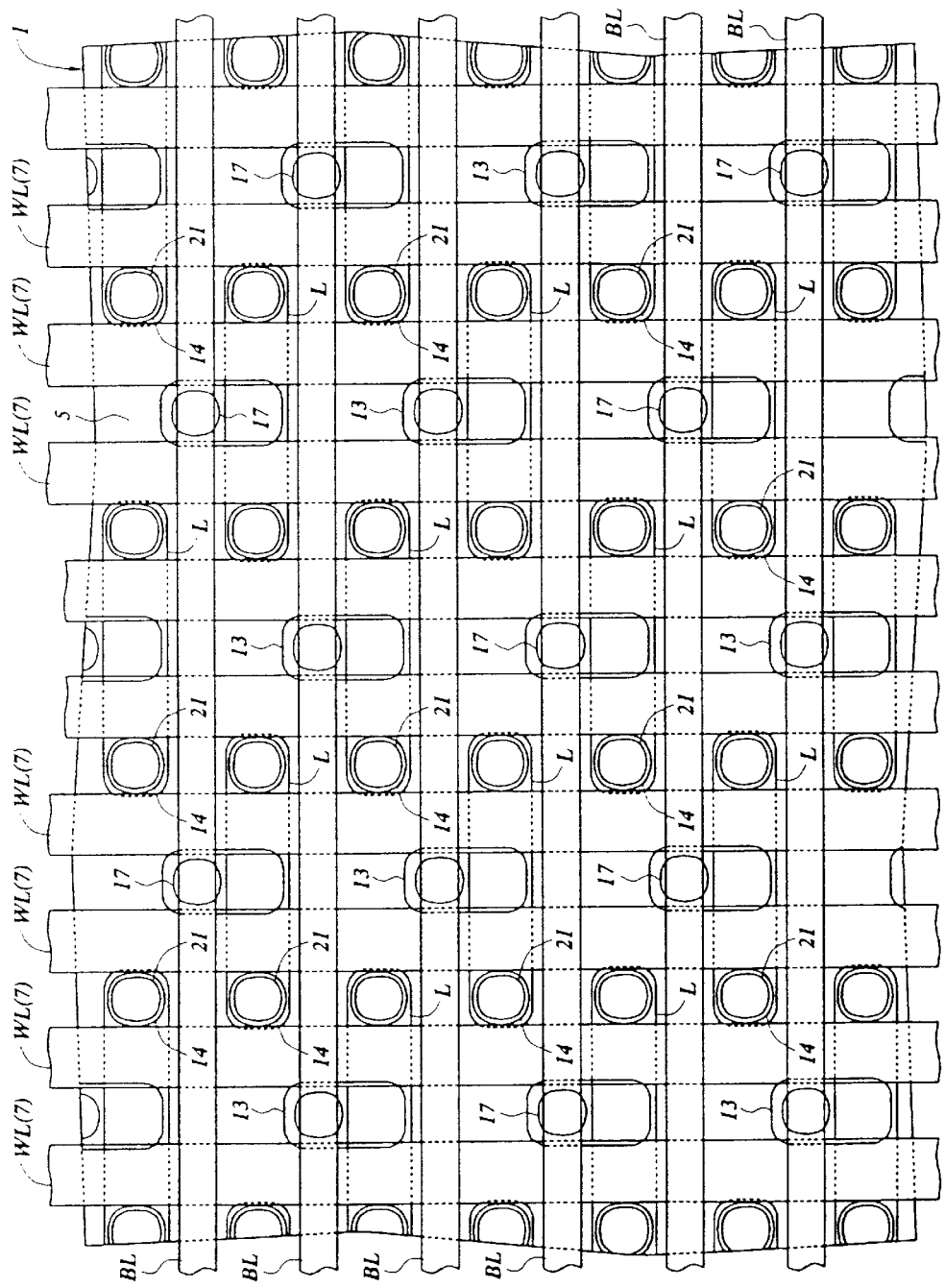
FIG. 25 is a diagram showing a plan view of the main part of the semiconductor substrate at the step during manufacture of the DRAM memory cell of Embodiment 1 of the invention.

Next, as shown in FIGS. 24–25, use the polysilicon film 39 and sidewall spacers 41 as a mask to sequentially etch selected portions of the silicon oxide film 38 and silicon nitride film 20 plus silicon oxide films 19, 18, 16 which underlie openings 25 to thereby form through-holes 21 each overlying a corresponding contact hole 14. Owing to formation of the sidewall spacers 41 on sidewalls of each opening 25, this through-hole 21 has its diameter that is made finer to the extent that it is less than the diameter of openings 25—i.e. smaller than the minimal size determinable by the limit of resolution in photolithography.

Figure 26A:
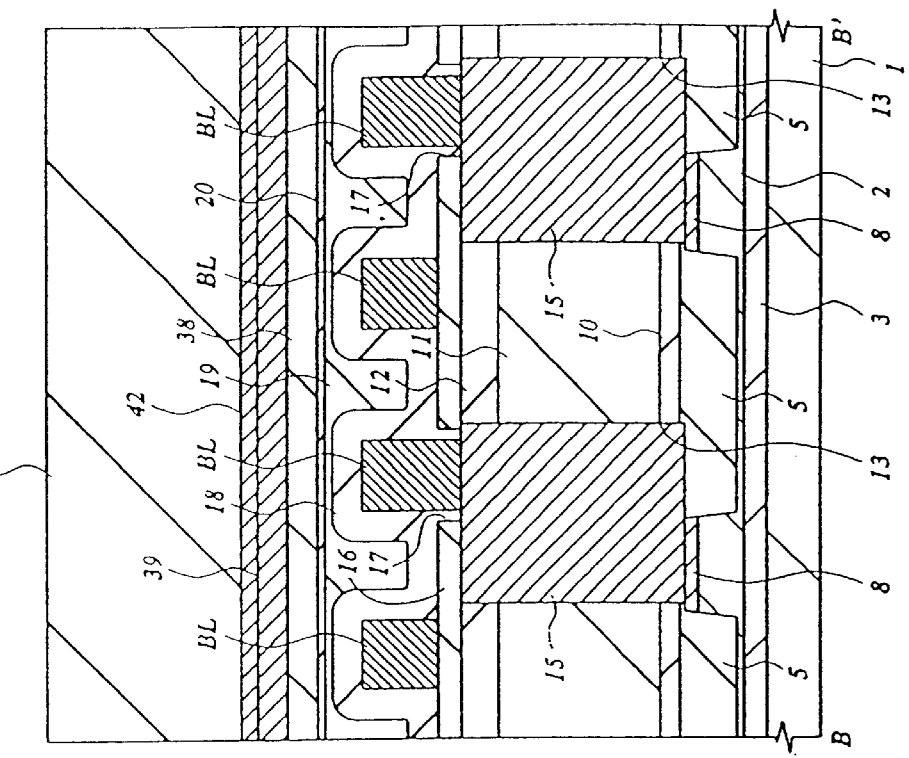
FIGS. 26 to 30 are each a diagram showing in cross-section main part of the semiconductor substrate at a step during manufacture of the DRAM memory cell of Embodiment 1 of the invention.
Figure 26B:
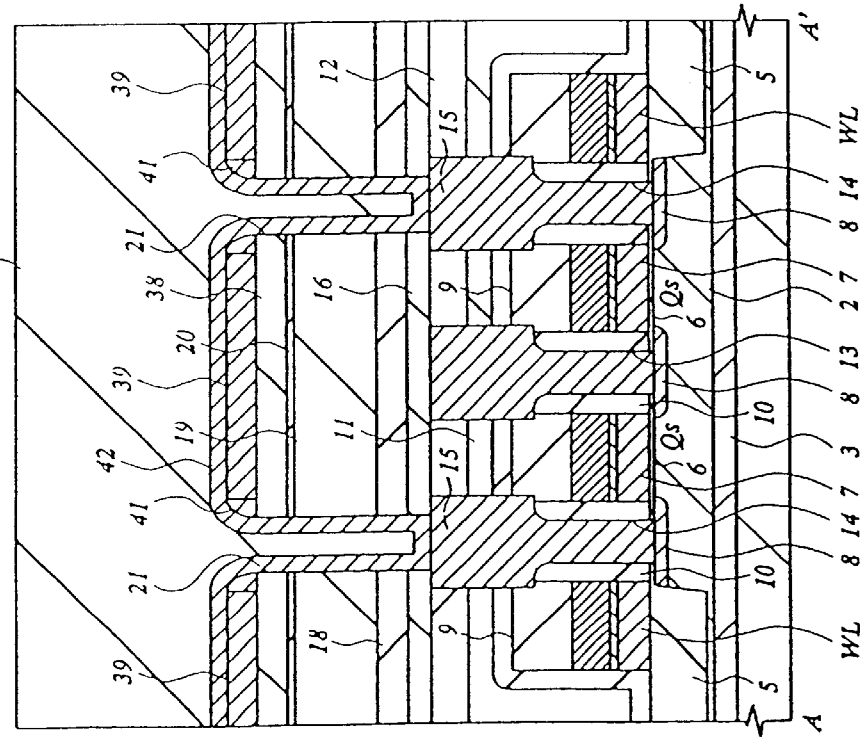

Next, as shown in FIG. 26, after having deposited an n-type impurity (e.g. phosphorus (P))-doped polysilicon film 42 by CVD method to cover the polysilicon film 39 and fill the through-holes 21, deposit by CVD methods a silicon oxide film 43 on this polysilicon film 42.

Figure 27A:
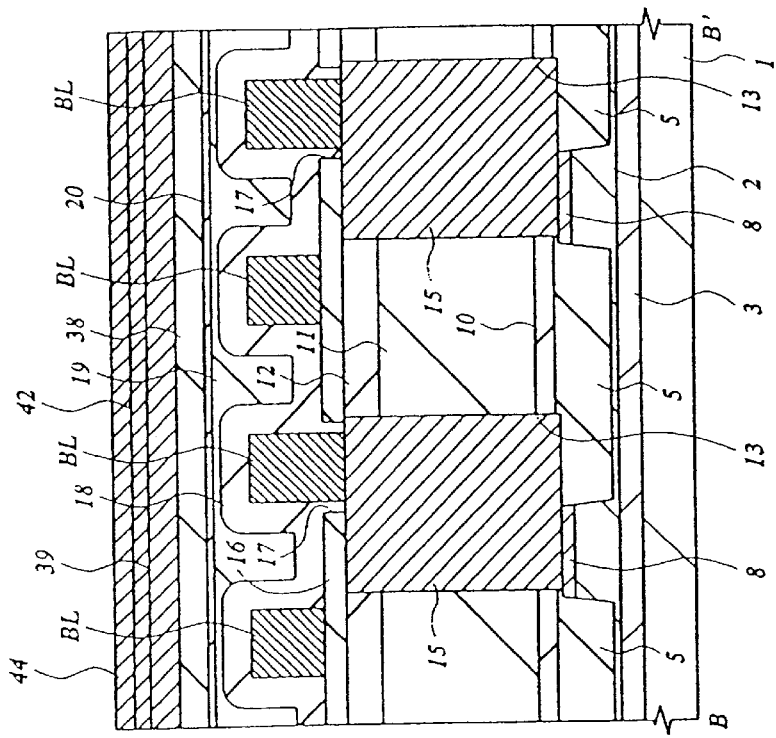
Figure 27B:
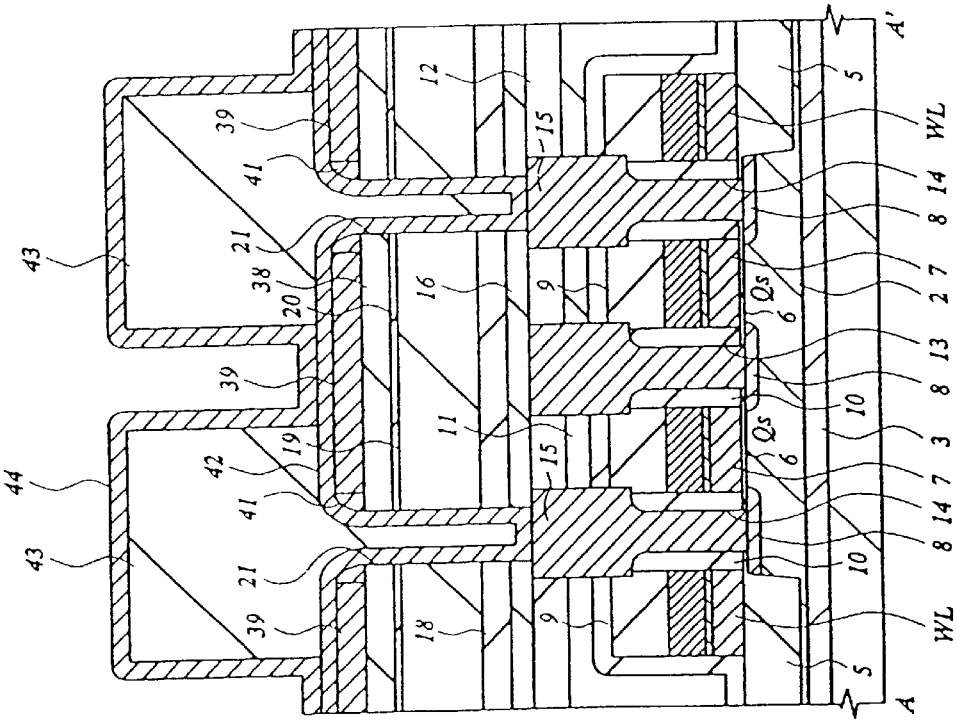

Next, as shown in FIG. 27, after having removed certain portions of the silicon oxide film 43 other than those overlying the through-holes 21 with a photoresist film used as a mask, deposit by CVD methods a phosphorus (P)-doped polysilicon film 44 so that it overlies the polysilicon film 42 including the upper part and sidewalls of the silicon oxide film 43.

Figure 28A:
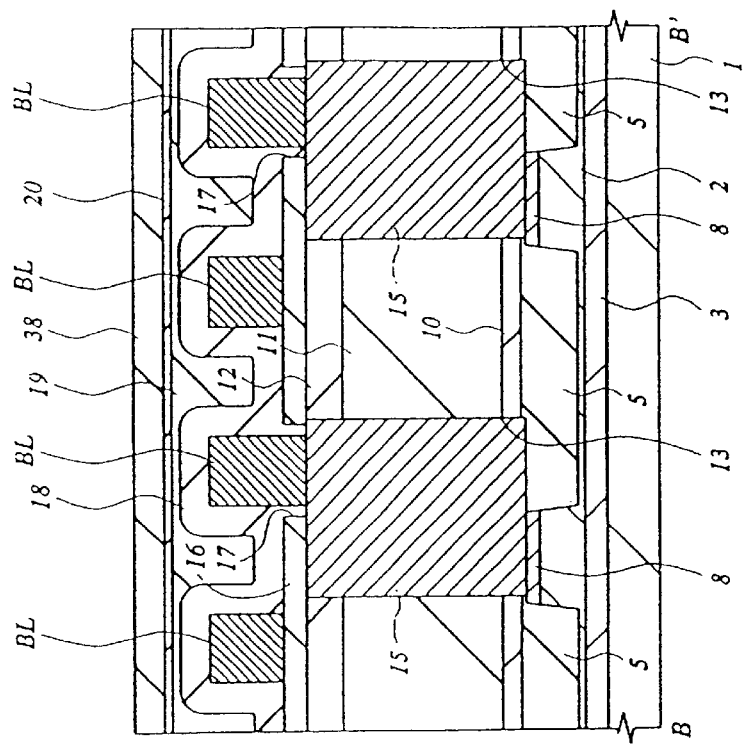
Figure 28B:
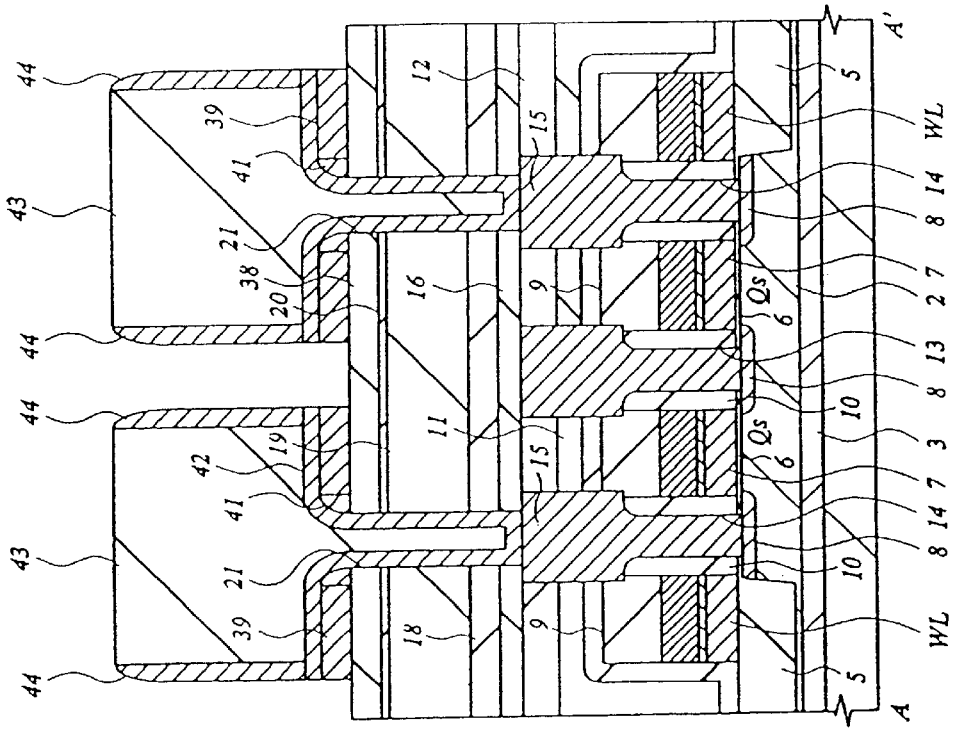

Next, as shown in FIG. 28, let the polycrystalline silicon films 44, 42, 39 be subject to anisotropic etching to allow the polysilicon film 44 to reside on sidewall of the silicon oxide film 43 while causing the polysilicon films 42, 39 to reside at locations underlying the silicon oxide film 43.

Figure 29B:
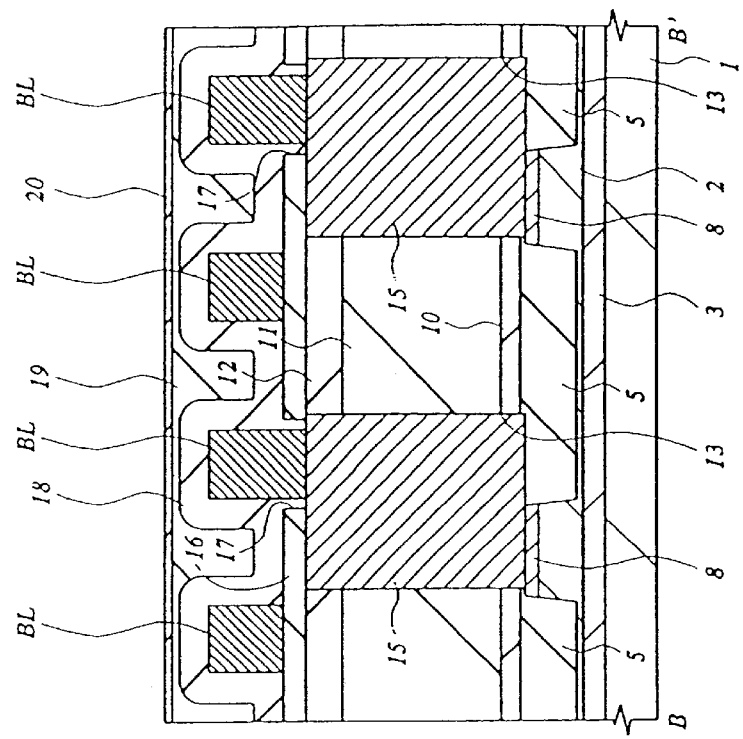
Figure 29A:
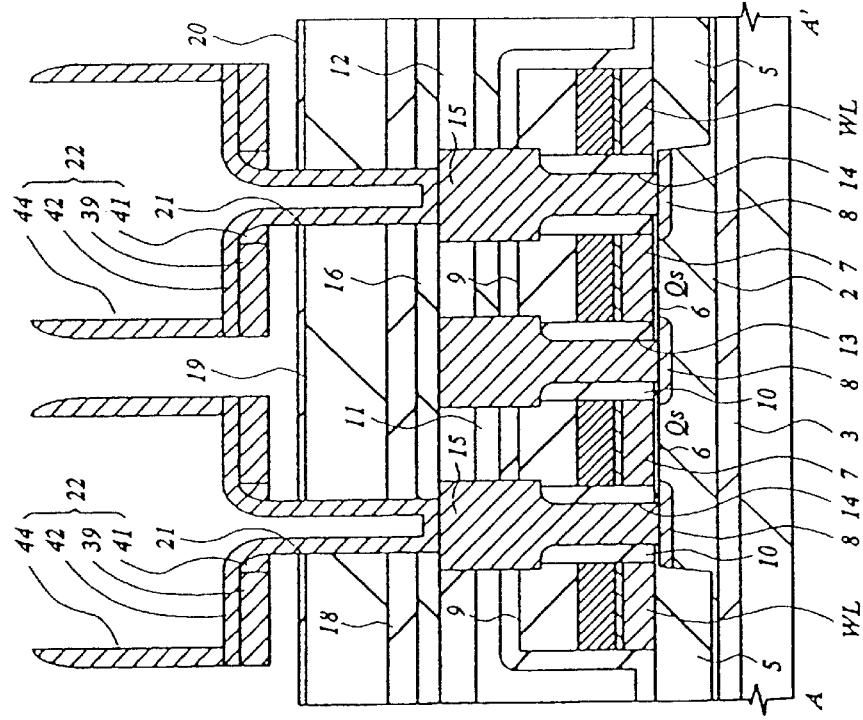

Next, as shown in FIG. 29, remove by wet etching the silicon oxide film 43 and silicon oxide film 38 to form the lower-side electrode 22 of the information accumulation capacitive element C. This etching is carried out under the condition that the etching rate of the silicon oxide films 43, 38 with respect to the silicon nitride film 20 becomes greater while at the same time preventing etching of the silicon oxide film 19 underlying the silicon nitride film 20.

Figure 30A:
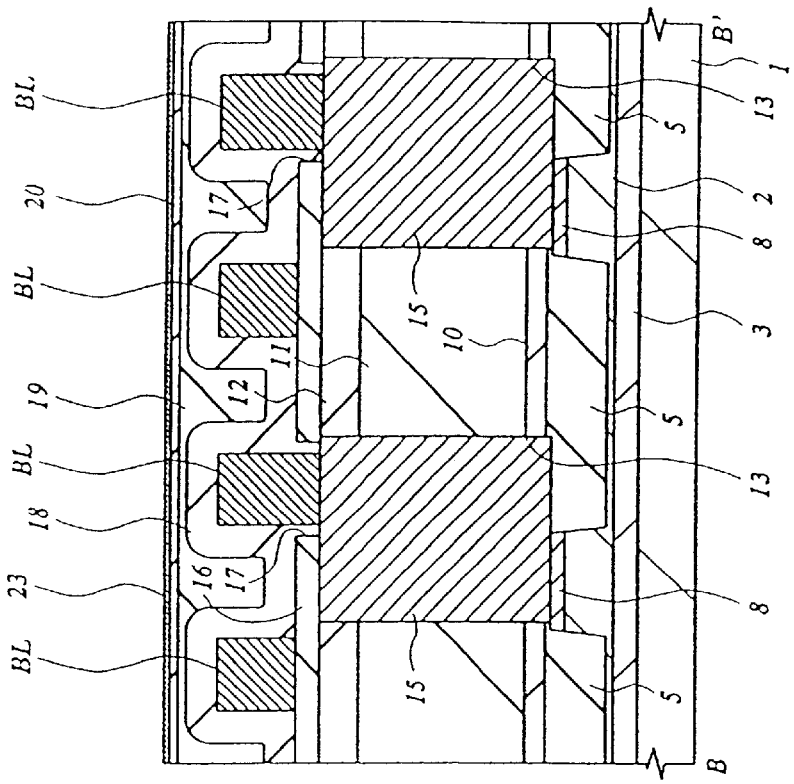
Figure 30B:
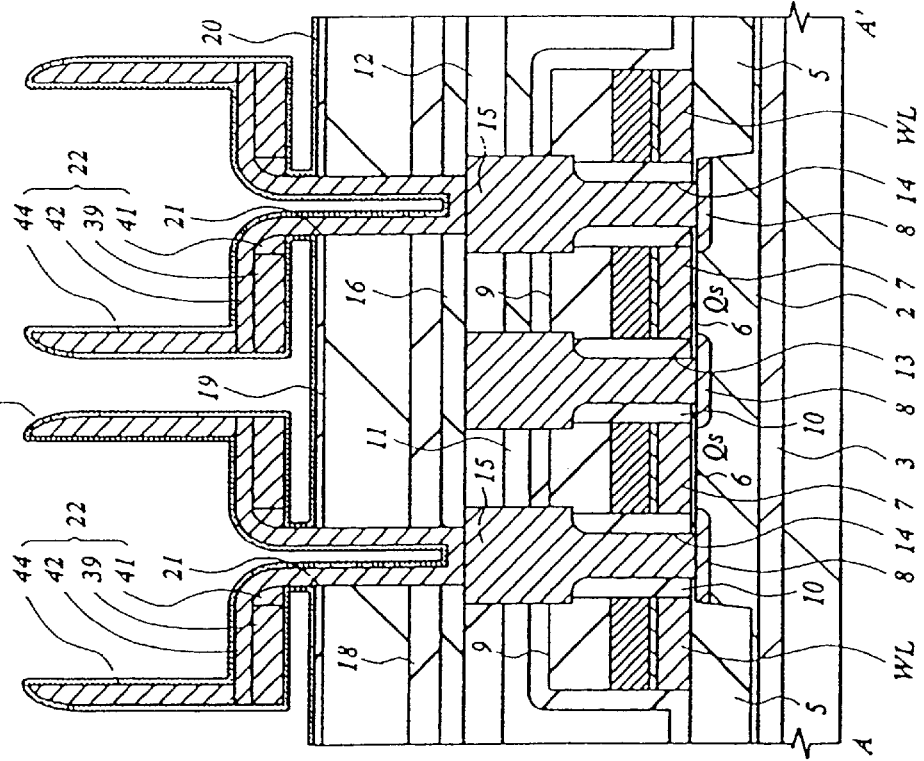

Next, as shown in FIG. 30, deposit on the surface of the lower electrode 22 a high dielectric film such as tantalum oxide ($Ta_2O_5$) by CVD methods to thereby fabricate a capacitor insulation film 23 of the information accumulation capacitive element C. Thereafter, deposit a phosphorus (P)-doped polysilicon film on the capacitor insulation film 23 to form an upper-side electrode 24 of the information accumulation capacitive element C whereby the DRAM memory cells shown in FIGS. 2–4 are thus completed.

Embodiment 2

Electrical connection between the n-type semiconductor region 8 of a memory-cell selecting MISFET Qs and its associated one of the bit lines BL may alternatively be accomplished in a way as will be described below.

Figure 31:
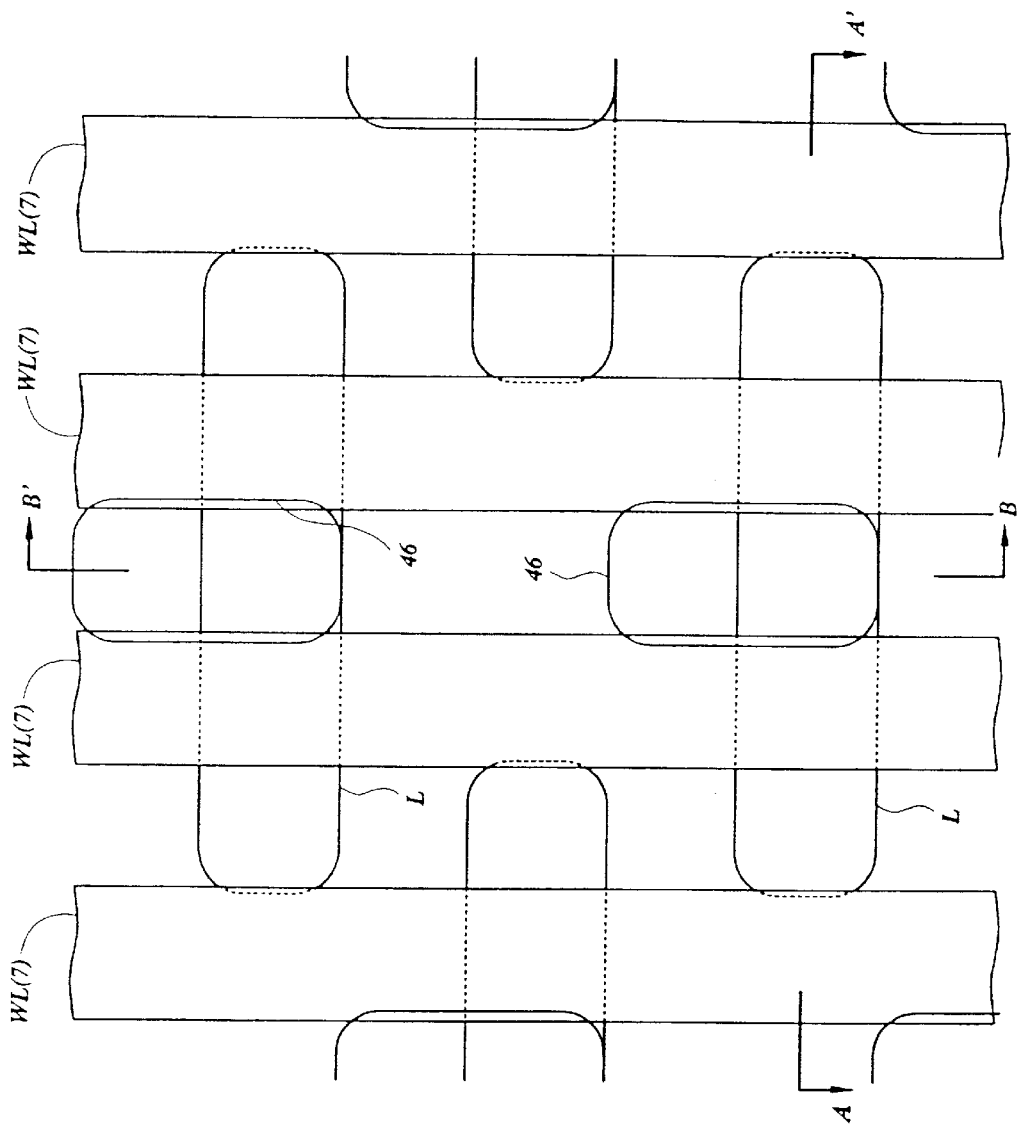
FIG. 31 is a diagram showing a plan view of the main part of a semiconductor substrate at a step in the manufacture of a memory cell of a DRAM of Embodiment 2 of the invention.
Figure 32A:
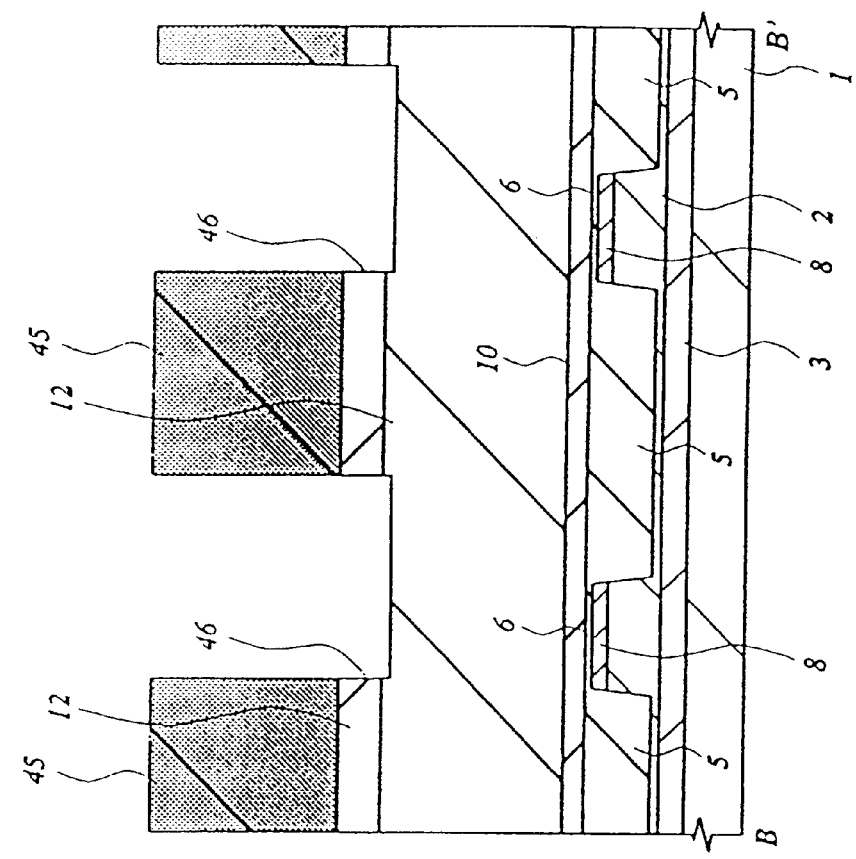
FIG. 32 is a diagram showing in cross-section main part of the semiconductor substrate at a step during manufacture of the DRAM memory cell of Embodiment 2 of the invention.
Figure 32B:
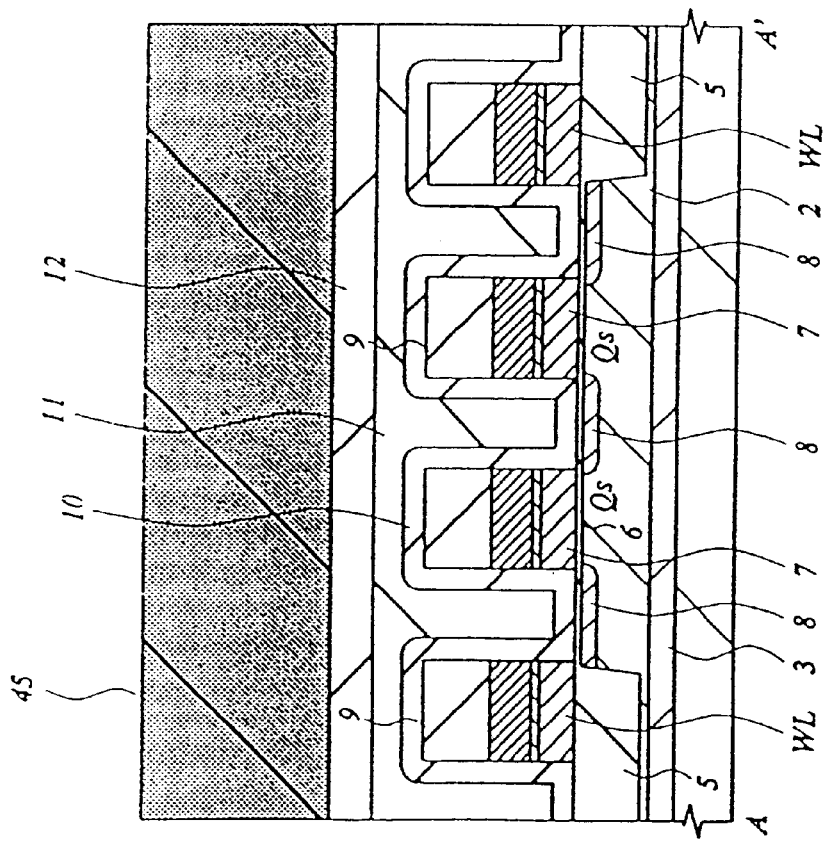

After having first deposited the silicon nitride film 10 and silicon oxide films 11, 12 at a level overlying formation of a memory-cell select MISFET Qs in accordance with the procedure at the steps shown in FIGS. 5 through 12 of the aforesaid Embodiment 1, fabricate through-holes 46 as shown FIGS. 31–32 by etching with a photoresist film 45 used as a mask, each of which overlies the n-type semiconductor region 8 (either one of the source and drain) of memory-cell select MISFET Qs. While each through-hole 46 is formed to have a substantially rectangular pattern with its diameter in the Y direction greater than a diameter in the X direction like the contact hole 13 of the same Embodiment 1, the through-hole is formed shallower so that its bottom portion is higher in level than gate electrodes 7 (word lines WL).

Figure 33:
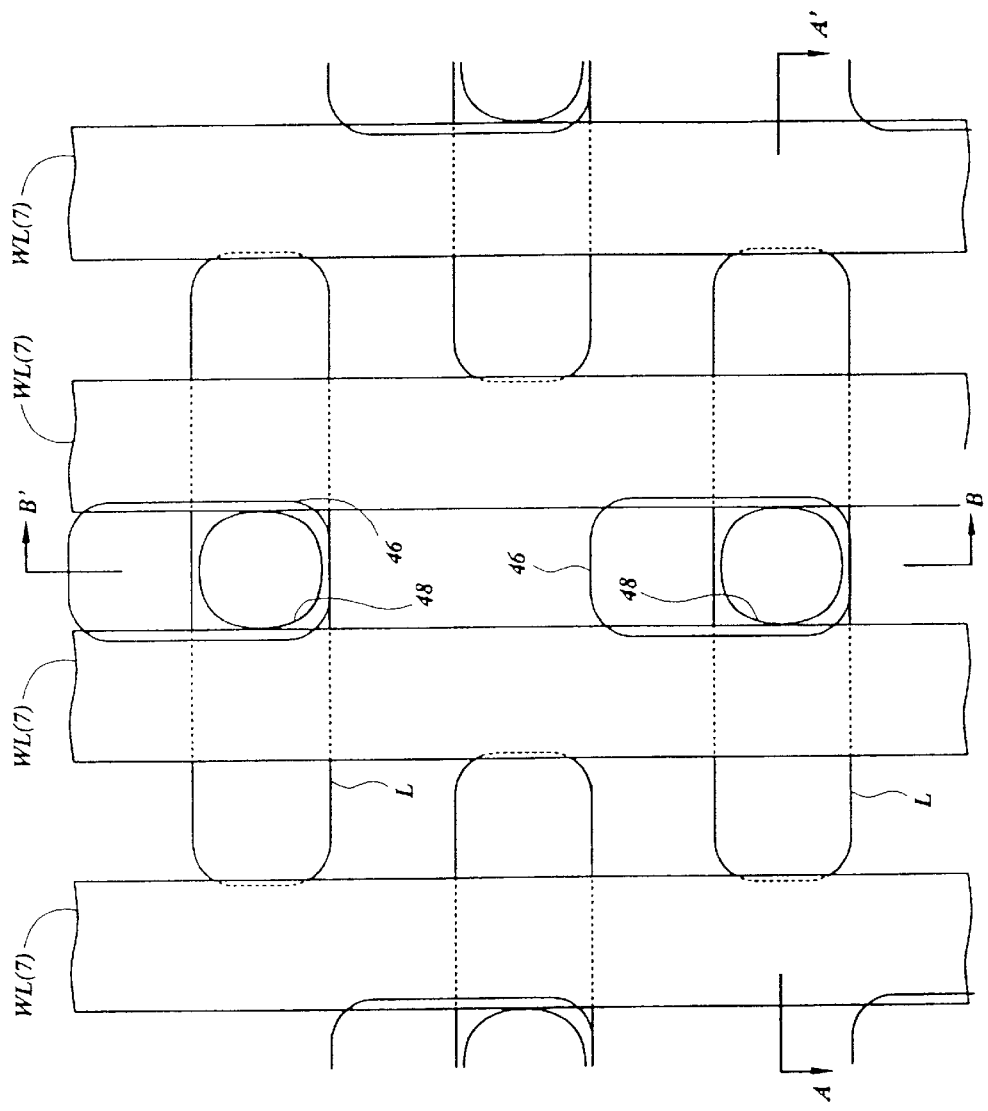
FIG. 33 is a diagram depicting an enlarged plan view of the main part of the semiconductor substrate at a step during manufacture of the DRAM memory cell of Embodiment 2 of the invention.

Next, after having removed the photoresist film 45, as shown in FIGS. 33–34, etching with a second photoresist film 47 used as a mask is done to form a contact hole 48 overlying either one of the source and drain of a memory-cell select MISFET Qs and also form a contact hole 49 overlying the other of them. These contact holes 48, 49 are each formed to have a pattern that causes a diameter in the Y direction to be virtually equal to that in the X direction. In addition, the contact holes 48, 49 are formed by two-step etching treatment using the silicon nitride film 10 as an etching stopper in a way similar to that in fabrication of the contact holes 13, 14 in said Embodiment 1 to thereby preclude deep cutaway of the n-type semiconductor regions 8 and element separation groove 5.

Figure 35A:
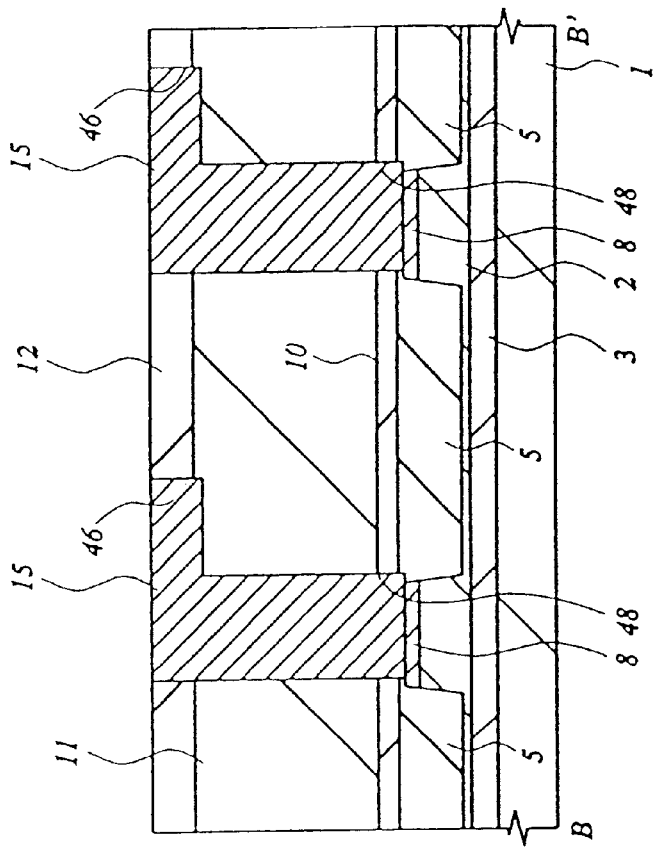
Figure 35B:
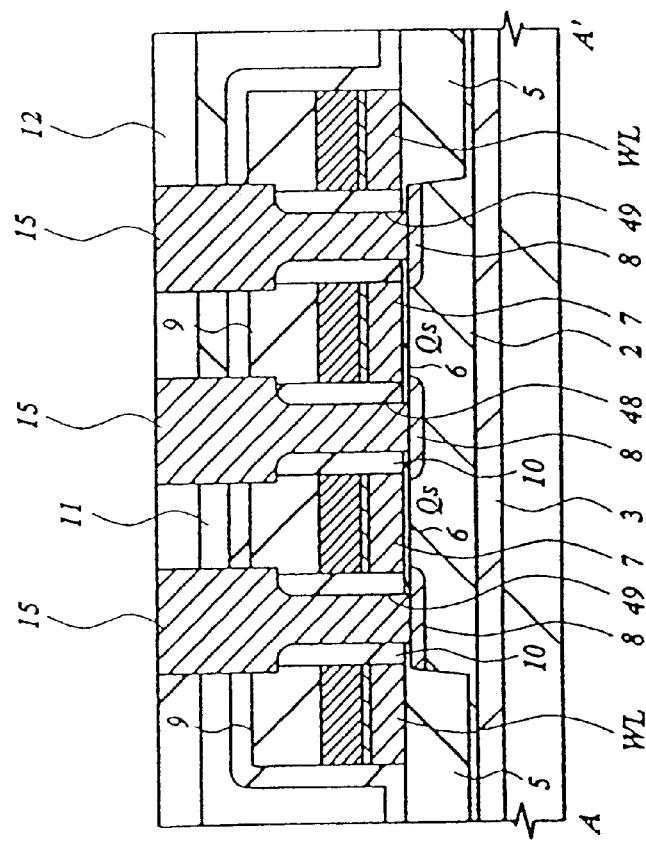

Next, after removal of the photoresist film 47, make use of the same methodology as in said Embodiment 1 to form plugs (conductive layers) 15 within the through-hole 46 and the contact holes 48, 49 as shown in FIG. 35.

Figure 36A:
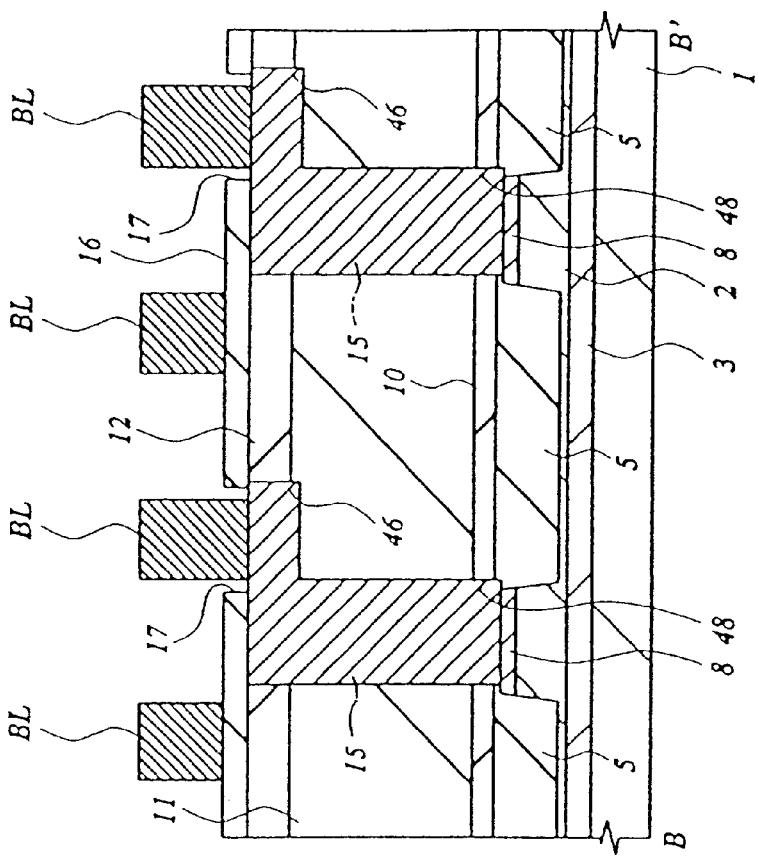
Figure 36B:
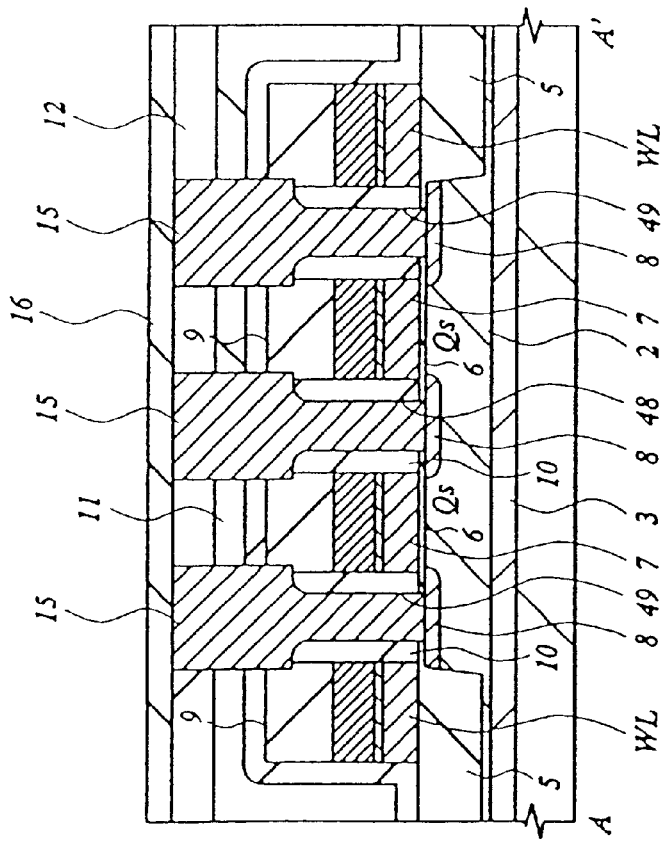

Next, as shown in FIG. 36, use the same method as in said Embodiment 1 to form a silicon oxide film 16 on the silicon oxide film 12; after fabrication of through-holes 17 by etching of specified portions of the silicon oxide film 16 overlying the through-holes 46, form bit lines BL on the silicon oxide film 16. Where appropriate, a plug comprised of a conductive film such as a polysilicon film or W film may be buried in each through-hole 17. The following process steps are the same as those in said Embodiment 1.

According to the manufacturing method in accordance with the illustrative embodiment, forming on or over the gate electrode 7 (word line WL) the through-hole 46 having its diameter in the Y direction greater than the diameter in the X direction while forming beneath this through-hole 46 the contact hole 48 with its diameter in the Y direction almost identical to the diameter in the X direction permits the area in which the plug (conductive layer) 15 buried in the contact hole 48 and the sidewall of the gate electrode 7 (word line WL) oppose each other to becomes less than that in said Embodiment 1. This makes it possible to reduce the parasitic capacitance possibly formed between the plug (conductive layer) 15 and gate electrode 7 (word line WL), which in turn enables suppression of word line delay accordingly.

Embodiment 3

The through-hole for use in connecting together the through-hole 14 as formed overlying the n-type semiconductor region 8 of a memory-cell select MISFET Qs and the lower electrode 22 of an information accumulation capacitive element C may alternatively be formed in self-alignment with a corresponding one of the bit lines BL.

Figure 37:
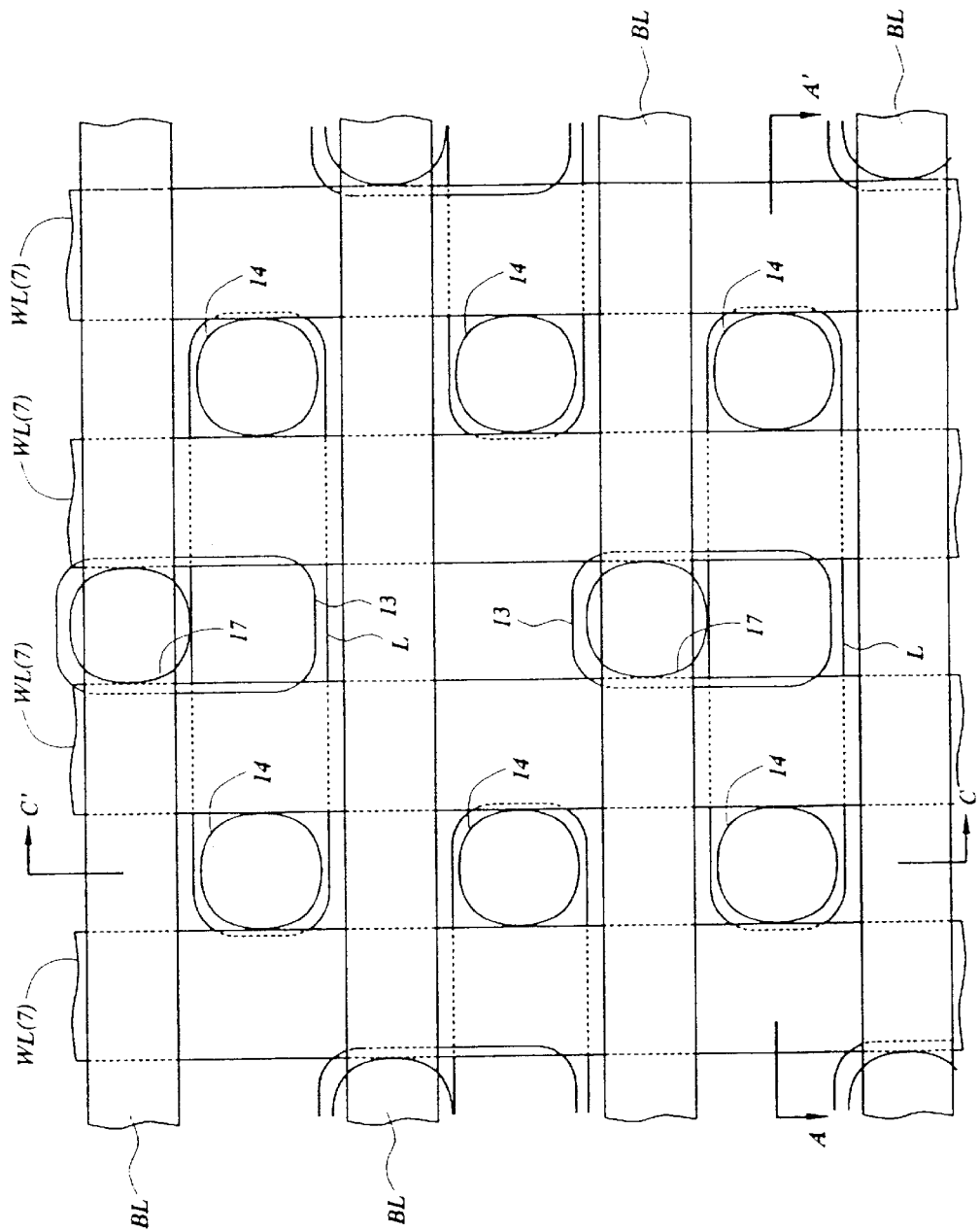
FIG. 37 is a diagram showing plan view of the main part of the semiconductor substrate at a process step during manufacture of the DRAM memory cell of Embodiment 3 of the invention.

In this case, after having first formed a contact hole 13 of substantially rectangular shape and contact hole 14 of almost square shape at locations overlying the source and drain of the memory-cell select MISFET Qs by use of the same method as in said Embodiment 1 as shown in FIG. 37 (a schematical plan view of a semiconductor substrate for indication of part of the memory array thereof) and FIG. 38 (its left-side portion is a sectional view along line A-A' of FIG. 37 whereas the right side part is a sectional view along line C-C' of the same) and then having formed plugs (conductive layers) 15 within them, etch a silicon oxide film 12 deposited on the contact holes 13, 14 to form a through-hole 17 overlying the element separation groove 5 at a location out of the active region L.

Subsequently, form bit lines BL on the silicon oxide film 12; then, make electrical connection between the bit lines BL and the plugs (conductive layers) 15 within the contact holes 13 via respective through-holes 17. The bit lines BL are manufacturable by depositing on the silicon oxide film 12 a TiN film and W film by sputtering techniques and then depositing on the W film a silicon nitride film 50 by CVD techniques and thereafter patterning these films through etching with a photoresist film used as a mask therefor. The bit lines BL thus formed are such that they straightly extend in the X direction at an equal interval with an identical width kept along the length thereof.

The bit lines BL are specifically arranged so that the distance or interval between adjacent ones thereof is greater than the width of each bit line in order to minimize any possible parasitic capacitance as formed between neighboring ones of the bit lines BL for improvement of information read/write rates. For instance, the interval of bit lines BL is set at 0.24 $\mu$m. At this time, let the pitch of two neighboring bit lines BL—namely the memory cell size in the Y direction—be set at 0.46 $\mu$m, which results in the width of a bit line BL being substantially equal to 0.22 $\mu$m (=0.46–0.24), which may be about the same as the minimum size determinable by a limit of resolution in photolithography.

Figures 39A, 39B:
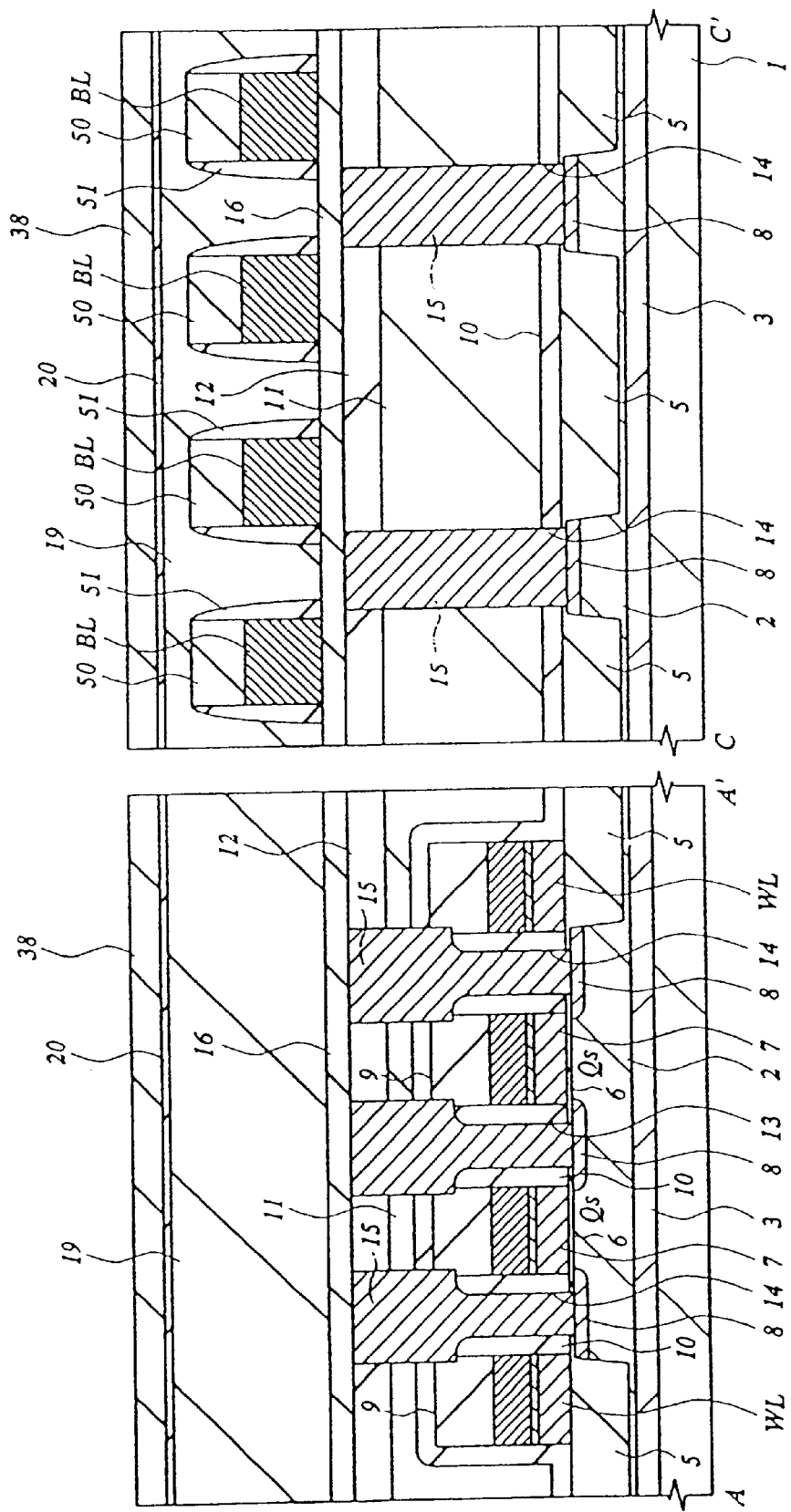

Next, as shown in FIG. 39, form on respective side walls of bit lines BL sidewall spacers 51 each made of a silicon nitride film; thereafter, use CVD techniques to sequentially deposit on or over the bit lines BL a silicon oxide film 19 and silicon nitride film 20 plus silicon oxide film 38 in this order. The sidewall spacers 51 may be fabricated by anisotropically etching the CVD-deposited silicon nitride film overlying the bit lines BL. The silicon oxide film 38 is subjected to chemical/mechanical polishing processes to ensure that its resultant surface is kept substantially identical with respect to the entire surface area of the semiconductor substrate 1.

Next, as shown in FIG. 40, etch away more than one selected portion of the silicon oxide film 38 overlying said contact hole 14 with a photoresist film 52 used as a mask. This etching process is done under the condition that the etching rate of the silicon oxide film 38 relative to the silicon nitride film 20 becomes greater while preventing removal of the silicon nitride film 20.

Figures 41A, 41B:
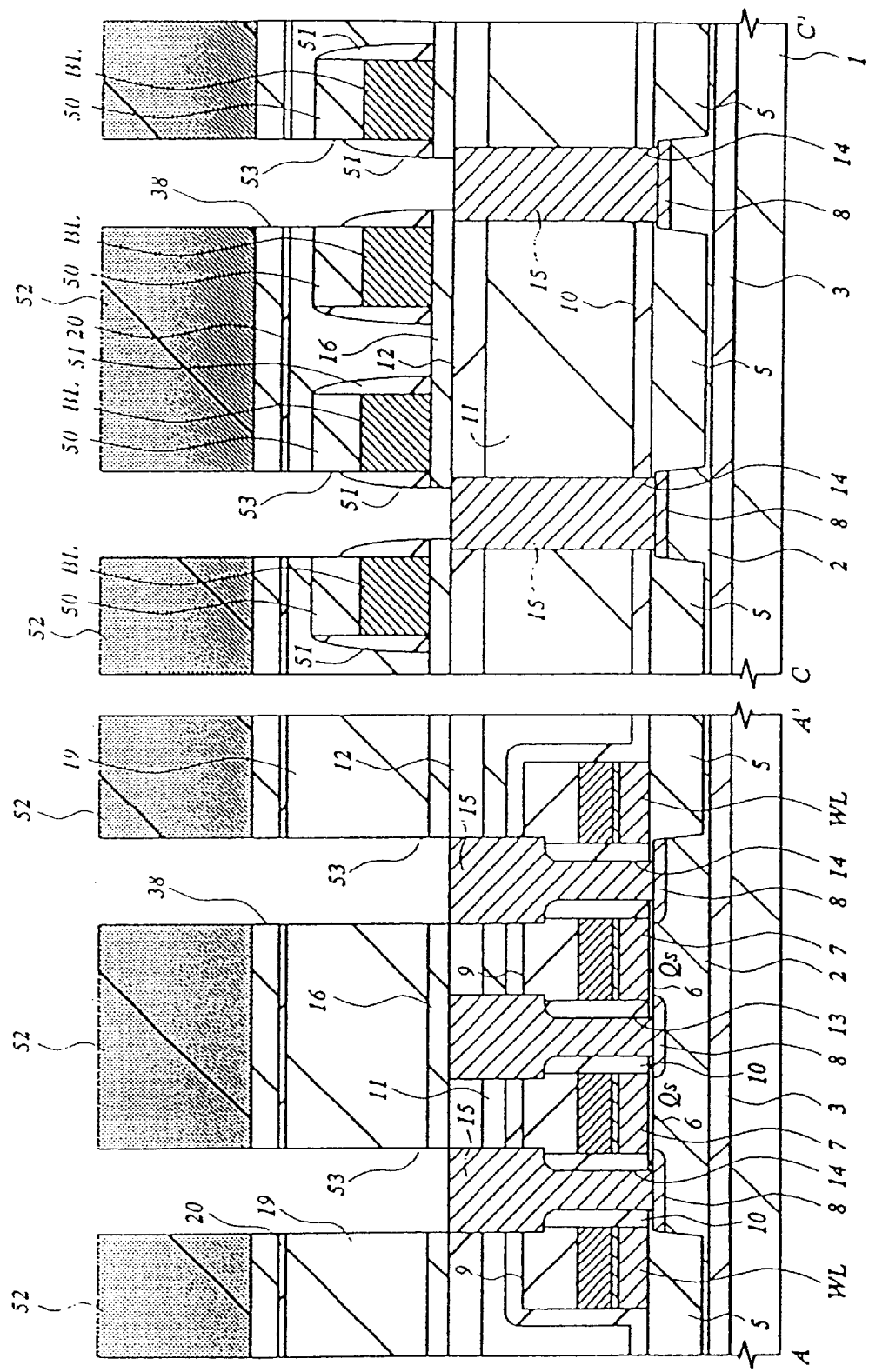

Next, as shown in FIG. 41, after having removed the silicon nitride film 20 through etching with the photoresist film 52 used as a mask, etch the silicon oxide film 19 and silicon oxide film 16 under the condition that the etching rate relative to the silicon nitride film 50 overlying the bit lines BL and the sidewall spacers 51 comprised of silicon nitride film on the sidewalls thereof becomes greater to thereby form through-holes 53 overlying the contact holes 14 in self-alignment with the bit lines BL.

Figures 42A, 42B:
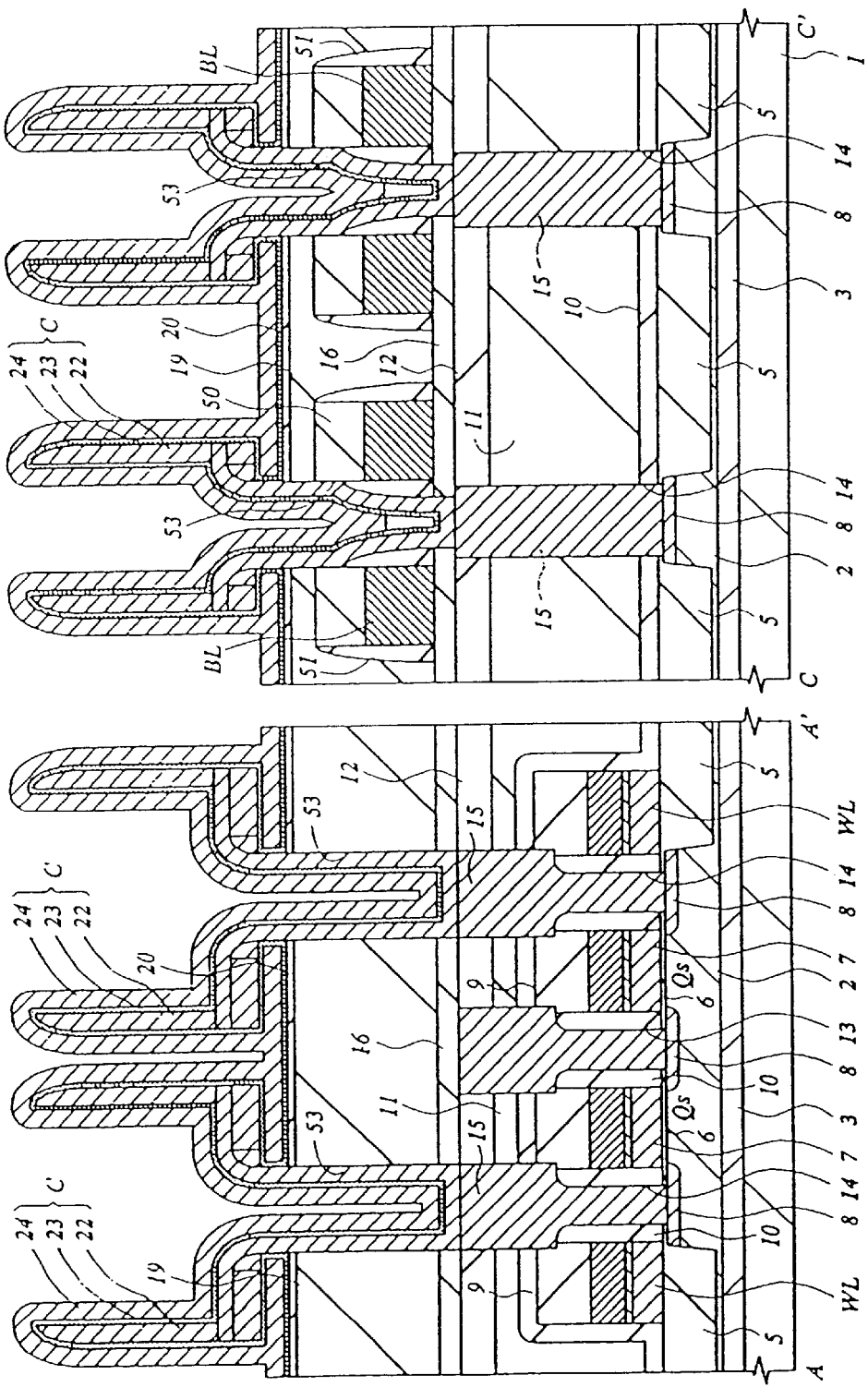

Thereafter, as shown in FIG. 42, fabricate an information accumulation capacitive element C with a stacked structure overlying the through-hole 53 by the same method as that used in said Embodiment 1, which element consists essentially of a lamination of a lower-side electrode (charge accumulation electrode) 22 and capacitor dielectric film 23 plus upper-side electrode (plate electrode) 24.

So far, the present invention made by the inventor(s) has been described in detail based on some illustrative embodiments; however, it should be noted that the invention should not be limited only to such embodiments discussed above and may alternatively be modifiable and alterable in a variety of forms without departing from the spirit and scope of the invention.

Industrial Applicability

According to the method for manufacturing a semiconductor of the present invention, it becomes possible to retain the required size/dimension accuracy along with resolution margins of photoresist films while at the same time enabling successful reduction of any limits as to on-chip layout of integrated circuit components. This makes it possible to reduce or "shrink" both the pitch of gate electrodes (word lines) and the pitch of bit lines thereby enabling miniaturization of DRAM memory cells, which leads to an ability to accomplish further enhanced on-chip integration density. Another advantage of the invention lies in the capability of reducing the area of a semiconductor chip, which in turn makes it possible to increase production yields of DRAM devices.

What is claimed is:

1. A semiconductor integrated circuit device comprising a plurality of word lines extending in a first direction on a principal surface of a semiconductive substrate, a plurality of bit lines extending in a second direction at right angles to the first direction, and an array of memory cells of a DRAM as disposed at cross points of said word lines and said bit lines, each said memory cell including a serial combination of a memory cell selecting MISFET with a gate electrode as integrally formed with a corresponding one of said word lines and a capacitive element for information accumulation, characterized in that said plurality of word lines are arranged to linearly extend in the first direction on the principal surface of said semiconductive substrate with an identical width, and that a distance between adjacent ones of said word lines is less than said width.

2. The semiconductor integrated circuit device as recited in claim 1, characterized in that the distance between the adjacent ones of said gate electrodes is set at a minimal size as determinable by a resolution limit of photolithography.

3. The semiconductor integrated circuit device as recited in claim 1, characterized in that said word lines and the gate electrode of said memory cell selecting MISFET as integrally formed with a corresponding one of said word lines are comprised of a conductive film at least partially including a metallic film therein.

4. The semiconductor integrated circuit device as recited in claim 1, characterized in that said semiconductive substrate has an active region with said memory cell selecting MISFET formed therein and being arranged to have an island-like pattern extending in the second direction on the principal surface of said semiconductive substrate while having its periphery as surrounded by an element isolation region.

5. The semiconductor integrated circuit device as recited in claim 4, characterized in that the element isolation region surrounding said active region is formed of an element separation groove having a dielectric film embedded therein as defined in the principal surface of said semiconductive substrate.

6. The semiconductor integrated circuit device as recited in claim 1, characterized in that said bit lines are formed overlying said memory cell selecting MISFET with an insulative film laid therebetween, and that a contact hole for electrical connection between one of a source and drain of said memory cell selecting MISFET and a corresponding one of said bit lines is formed in self-alignment with the gate electrode of said memory cell selecting MISFET.

7. The semiconductor integrated circuit device as recited in claim 1, characterized in that said information accumulation capacitive element is formed to overlie said memory cell selecting MISFET with an insulative film laid therebetween, and that a contact hole for electrical connection between the other of the source and drain of said memory cell selecting MISFET and one electrode of said information accumulation capacitive element is formed in self-alignment with the gate electrode of said memory cell selecting MISFET.

8. The semiconductor integrated circuit device comprising a plurality of word lines extending in a first direction on a principal surface of a semiconductive substrate, a plurality of bit lines extending in a second direction at right angles to the first direction, and an array of DRAM memory cells as disposed at intersections of said word lines and said bit lines, each said memory cell including a serial combination of a memory cell selecting MISFET with a gate electrode as integrally formed with a corresponding one of said word lines and a capacitive element for information accumulation, characterized in that said bit lines straightly extend in the second direction on the principal surface of said semiconductive substrate with an identical width, and that a distance between adjacent ones of said bit lines is greater than said width.

9. The semiconductor integrated circuit device as recited in claim 8, characterized in that the width of each said bit line is equal to or less than a minimal size determinable by a resolution limit of photolithography.

10. The semiconductor integrated circuit device as recited in claim 8, characterized in that said bit lines are comprised of a conductive film at least partially containing a metallic film.

11. A semiconductor integrated circuit device comprising a plurality of word lines extending in a first direction on a principal surface of a semiconductive substrate, a plurality of bit lines extending in a second direction at right angles to the first direction, and an array of DRAM memory cells as disposed at intersections of said word lines and said bit lines, each said memory cell including a serial combination of a memory cell selecting MISFET with a gate electrode as integrally formed with a corresponding one of said word lines and a capacitive element for information accumulation, characterized in that an active region with said memory cell selecting MISFET formed therein is arranged to have an island-like pattern extending in the second direction on the principal surface of said semiconductive substrate while having its periphery as surrounded by an element isolation region, that said plurality of word lines extend along the first direction on the principal surface of said semiconductive substrate with an identical width at an identical distance between adjacent ones thereof, that certain one of said bit lines as formed overlying said element isolation region with a first insulative film laid therebetween extends in the second direction on the principal surface of said semiconductive substrate with an identical width at a regular distance, that a first conductive material is formed for electrical connection between one of a source and drain of said memory cell selecting MISFET as formed in said active region and its associative one of said bit lines as formed overlying said element isolation region, and that said identical width of said word lines is wider than a distance between adjacent ones of said word lines, and said identical width of said bit lines is narrower than a distance between adjacent ones of said bit lines.

12. The semiconductor integrated circuit device as recited in claim 11, characterized in that said first conductive material includes a polycrystalline silicon film doped with a chosen impurity equal in conductivity type to the source and drain of said memory cell selecting MISFET.

13. The semiconductor integrated circuit device as recited in claim 11, characterized in that the corresponding one of said bit lines and said one of the source and drain of said memory cell selecting MISFET are electrically connected together via a first through-hole as formed in a second insulative film sandwiched between said bit lines and said first insulative film.

14. The semiconductor integrated circuit device as recited in claim 13, characterized in that the width of said bit lines is less than a diameter of said first through-hole.

15. The semiconductor integrated circuit device as recited in claim 11, characterized in that said information accumulation capacitive element is formed over said bit lines with a third insulative film laid therebetween and is electrically connected to a remaining one of the source and drain of said memory cell selecting MISFET via a second through-hole formed in said third insulative film and a second contact hole as formed in said first insulative film at a location underlying said second through-hole.

16. The semiconductor integrated circuit device as recited in claim 15, characterized in that said second contact hole includes a polycrystalline silicon film being embedded therein and doped with an impurity equal in conductivity type to the source and drain of said memory cell selecting MISFET.

17. The semiconductor integrated circuit device as recited in claim 15, characterized in that said second through-hole is disposed between neighboring ones of said bit lines and is formed in self-alignment therewith.

18. A semiconductor integrated circuit device comprising a semiconductive substrate having a surface and an array of memory cells each including a serial combination of a sell selecting transistor and a data storage capacitive element with first and second electrodes as insulatively laminated over each other, said transistor including a metal insulator semiconductor field effect transistor (MISFET) having spaced-apart source and drain and an insulated gate electrode, wherein said device also comprises:

word lines insulatively overlying the surface of said substrate in a first direction thereon, said word lines including first, second and third word lines each having part making up the gate electrode of the memory cell selecting MISFET; and bit lines insulatively overlying the substrate surface in a second direction transverse to the first direction, said bit lines including first and second bit lines adjacent to each other, characterized in that the first to third word lines being substantially identical in width and in distance between adjacent ones thereof, said distance being less than said width, and said first and second bit lines being substantially identical in width and in distance therebetween, the distance of said first and second bit lines being greater than said width thereof.

19. The semiconductor integrated circuit device as recited in claim 18, characterized by further comprising:

a first conductive layer between the first and second word lines for connecting the first bit line to one of the source and drain of said memory-cell selecting MISFET;

a second conductive layer between the second and third word lines for connecting a remaining one of the source and drain of said memory-cell selecting MISFET to the first electrode of said data storage capacitive element;

said one of the source and drain of said memory-cell selecting MISFET and said first conductive layer being coupled in self-alignment to the first word line and the second word line; and said remaining one of the source and drain of said memory-cell selecting MISFET and said second conductive layer being coupled in self-alignment to the second word line and the third word line.

20. A method for manufacturing a semiconductor integrated circuit device comprising a plurality of word lines extending in a first direction on a principal surface of a semiconductive substrate, a plurality of bit lines extending in a second direction at right angles to the first direction, and an array of DRAM memory cells as disposed at intersections of said word lines and said bit lines, each said memory cell including a serial combination of a memory cell selecting MISFET with a gate electrode as integrally formed with a corresponding one of said word lines and a capacitive element for information accumulation, said method comprising the steps of:

(a) forming on the principal surface of said semiconductive substrate of a first conductivity type an element isolation region and an active region of island-like pattern having its periphery surrounded by said element isolation region and extending along the second direction on the principal surface of said semiconductive substrate;

(b) patterning a first conductive film formed over the principal surface of said semiconductive substrate to form word lines extending in the first direction on the principal surface of said semiconductive substrate to have a distance between adjacent ones thereof being less than a width of each said word line; and (c) forming a source and a drain of said memory cell selecting MISFET by introducing an impurity of a second conductivity type into the principal surface of said semiconductive substrate.

21. The method of forming a semiconductor integrated circuit device as recited in claim 20, characterized in that gate electrodes are formed so that a distance between adjacent ones thereof is at a minimal value determinable by a limit of resolution in photolithography.

22. The semiconductor integrated circuit device manufacturing method as recited in claim 20, characterized by including, after said step (c), further the steps of:

(d) forming a first insulative film overlying said memory cell selecting MISFET and then forming a second insulative film overlying said first insulative film and being different in etching rate from said first insulative film;

(e) etching those portions of said second insulative film overlying the source and drain of said memory cell selecting MISFET under a condition that the etching rate of said second insulative film with respect to said first insulative film becomes greater and then etching said first insulative film overlying the source and drain of said memory cell selecting MISFET to thereby form a first contact hole overlying one of said source and drain in self-alignment with said gate electrode to have a diameter in the first direction greater than a diameter in the second direction with part of said first contact hole extending toward said element isolation region while forming a second contact hole overlying a remaining one of the source and drain in self-alignment with said gate electrode and having a diameter in the first direction substantially the same as its diameter in the second direction;

(f) after having embedded a conductive film in said first contact hole and said second contact hole, forming a third insulative film overlying said second insulative film and then forming a first through-hole in said third insulative film at a portion overlying a specified region extending to said element isolation region of said first contact hole; and (g) patterning a second conductive film as formed overlying said third insulative film to thereby form bit lines extending along the second direction on the principal surface of said semiconductive substrate with an identical width at a distance between adjacent ones of said bit lines being greater than said width, and then electrically connecting together said first contact hole and a corresponding one of said bit lines via said first through-hole as formed in said third insulative film.

23. The semiconductor integrated circuit device manufacturing method as recited in claim 22, characterized in that the width of said bit lines is formed to be equal in dimension to or less than a minimal size determinable by a photolithography resolution limit while letting the distance between adjacent ones of said bit lines be at a minimal size falling within an allowable range of a parasitic capacitance inherently occurred therebetween.

24. The semiconductor integrated circuit device manufacturing method as recited in claim 22, characterized by including, after said step (g), the steps of:

(h) forming a fourth insulative film overlying said bit lines and then forming a fifth insulative film overlying said fourth insulative film at an etching rate different from that of said fourth insulative film;

(i) after having etched said fifth insulative film at a portion overlying said second contact hole under a condition that the etching rate of said fifth insulative film relative to said fourth insulative film is greater, etching said fourth insulative film at a portion overlying said second contact hole to thereby form a second through-hole overlying said second contact hole in self-alignment with a corresponding one of said bit lines; and (j) patterning a third conductive film as formed overlying said fifth insulative film to form a lower-side electrode of an information accumulation capacitive element as electrically connected to said second contact hole via said second through-hole.

25. A semiconductor integrated circuit device comprising:

a plurality of word lines extending in a first direction on a principal surface of a semiconductive substrate;

a plurality of bit lines extending in a second direction on the principal surface of the semiconductor substrate perpendicular to the first direction; and memory cells disposed at cross points of said word lines and said bit lines, each of said memory cells including a metal insulator semiconductor field effect transistor (MISFET) with a gate electrode as integrally formed with a corresponding one of said word lines and a capacitive element for information accumulation, wherein said word lines are arranged to linearly extend in the first direction on the principal surface of said semiconductive substrate with an identical width, and a distance between adjacent ones of said word lines is less than the width of said word lines.

26. The semiconductor integrated circuit device as recited in claim 25, wherein said distance between the adjacent ones of gate electrodes of metal insulator semiconductor field effect transistors (MISFETs) is set at a minimal size as determinable by a resolution limit of photolithography.

27. The semiconductor integrated circuit device as recited in claim 25, wherein said word lines and said gate electrodes of metal insulator field effect transistors (MISFETs) as integrally formed with a corresponding one of said word lines are comprised of a conductive film at least partially including a metallic film.

28. The semiconductor integrated circuit device as recited in claim 25, wherein said semiconductive substrate has an active region with said metal insulator semiconductor field effect transistor (MISFET) formed therein and being arranged to have an island-like pattern extending in the second direction on the principal surface of said semiconductive substrate while having its periphery as surrounded by an element isolation region.

29. The semiconductor integrated circuit device as recited in claim 28, wherein the element isolation region surrounding said active region is formed of an element separation groove having a dielectric film embedded therein as defined in the principal surface of said semiconductive substrate.

30. The semiconductor integrated circuit device as recited in claim 25, wherein said bit lines are formed overlying said metal insulator semiconductor field effect transistor (MISFET) with an insulative film laid therebetween, and that a contact hole for electrical connection between one of a source and drain of said metal insulator semiconductor field effect transistor (MISFET) and a corresponding one of said bit lines is formed in self-alignment with the gate electrode of said metal insulator semiconductor field effect transistor (MISFET).

31. The semiconductor integrated circuit device as recited in claim 25, wherein said capacitive element is formed to overlie said metal insulator semiconductor field effect transistor (MISFET) with an insulative film laid therebetween, and that a contact hole for electrical connection between the other of the source and drain of said metal insulator semiconductor field effect transistor (MISFET) and one electrode of said capacitive element is formed in self-alignment with the gate electrode of said metal insulator semiconductor field effect transistor (MISFET).

* * * * *